(12) United States Patent
Murray et al.

(10) Patent No.: US 12,261,222 B2
(45) Date of Patent: Mar. 25, 2025

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Neil Quinn Murray, Hsinchu (TW); Katherine H. Chiang, New Taipei (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/500,392

(22) Filed: Nov. 2, 2023

(65) Prior Publication Data
US 2024/0063307 A1   Feb. 22, 2024

Related U.S. Application Data

(63) Continuation of application No. 17/377,664, filed on Jul. 16, 2021, now Pat. No. 11,843,056.
(Continued)

(51) Int. Cl.
*H01L 29/66* (2006.01)
*H01L 27/12* (2006.01)
*H01L 29/786* (2006.01)

(52) U.S. Cl.
CPC .... *H01L 29/78642* (2013.01); *H01L 27/1225* (2013.01); *H01L 27/124* (2013.01); *H01L 27/127* (2013.01); *H01L 29/66969* (2013.01); *H01L 29/7869* (2013.01); *H01L 27/1255* (2013.01)

(58) Field of Classification Search
CPC ....... H01L 21/02365; H01L 21/823437; H01L 21/8234; H01L 21/823412; H01L 21/823418; H01L 23/52; H01L 23/5283; H01L 23/535; H01L 23/5226; H01L 27/1255; H01L 27/1225; H01L 27/12; H01L 27/124; H01L 27/127; H01L 27/088; H01L 29/66; H01L 29/7869;
(Continued)

(56) References Cited

U.S. PATENT DOCUMENTS 10,403,631 B1   9/2019   Lu et al.
11,335,788 B2   5/2022   Ramaswamy et al.
(Continued)

OTHER PUBLICATIONS

Non-Final Office Action dated Mar. 17, 2023 for U.S. Appl. No. 17/377,664.
(Continued)

*Primary Examiner* — Nikolay K Yushin
(74) *Attorney, Agent, or Firm* — Eschweiler & Potashnik, LLC

(57) ABSTRACT

The present disclosure relates to a method of manufacturing a semiconductor structure. The method may be performed by forming a first source/drain region. A first dielectric layer is formed above the first source/drain region. A portion of the first dielectric layer is removed. A channel region is formed along a sidewall of the first dielectric layer. A gate region is formed along a sidewall of the channel region. A second dielectric layer is formed above the first dielectric layer and the gate region. A portion of the second dielectric layer is removed to form an opening that exposes the channel region. A second source/drain region is formed within the opening.

20 Claims, 67 Drawing Sheets

Related U.S. Application Data

(60) Provisional application No. 63/167,796, filed on Mar. 30, 2021.

(58) Field of Classification Search
CPC ............ H01L 29/78642; H01L 29/786; H01L 29/66969; H01L 29/66666; H01L 29/78696
See application file for complete search history.

(56) References Cited

U.S. PATENT DOCUMENTS

| | | |
|---|---|---|
| 2014/0239247 A1 | 8/2014 | Park |
| 2015/0380548 A1 | 12/2015 | Wang et al. |
| 2019/0067437 A1 | 2/2019 | Ramaswamy et al. |
| 2019/0206449 A1 | 7/2019 | Beigel et al. |
| 2019/0245096 A1 | 8/2019 | Ramaswamy |
| 2019/0393356 A1 | 12/2019 | Le et al. |
| 2020/0051607 A1 | 2/2020 | Pan et al. |
| 2020/0111907 A1 | 4/2020 | Karda et al. |
| 2020/0220023 A1 | 7/2020 | Pillarisetty et al. |

OTHER PUBLICATIONS

Notice of Allowance dated Aug. 9, 2023 for U.S. Appl. No. 17/377,664.

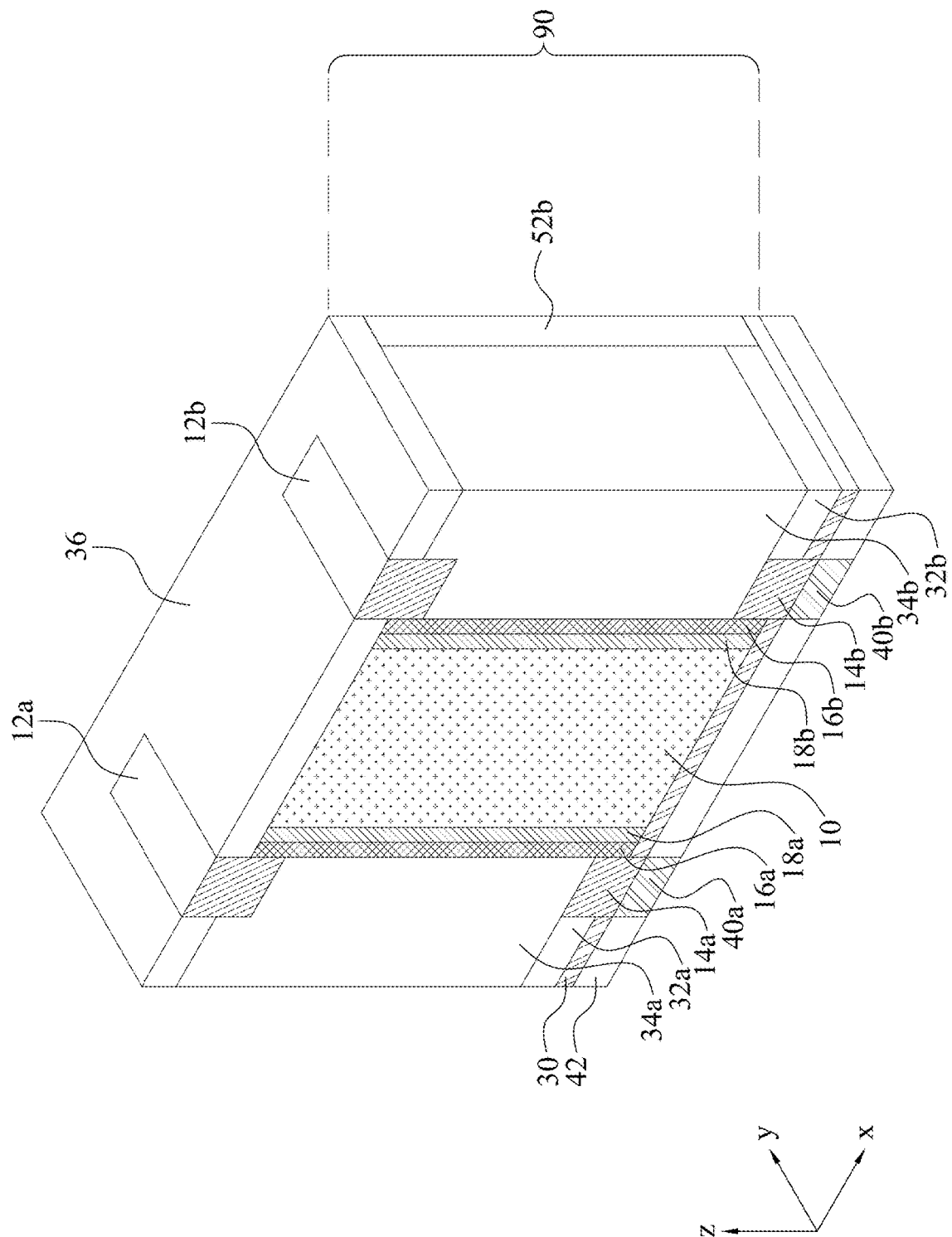

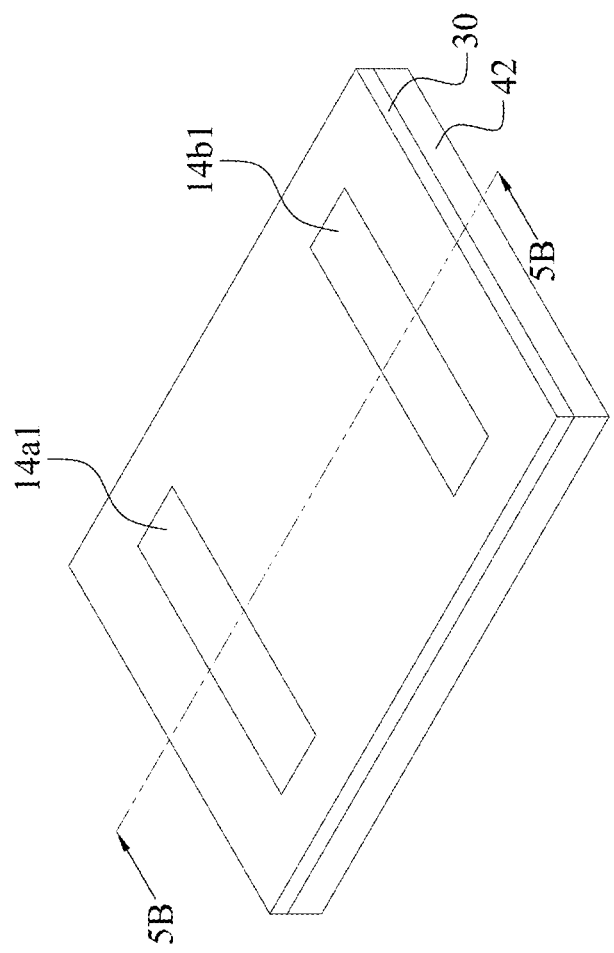
Fig. 5A
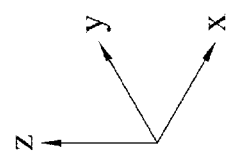

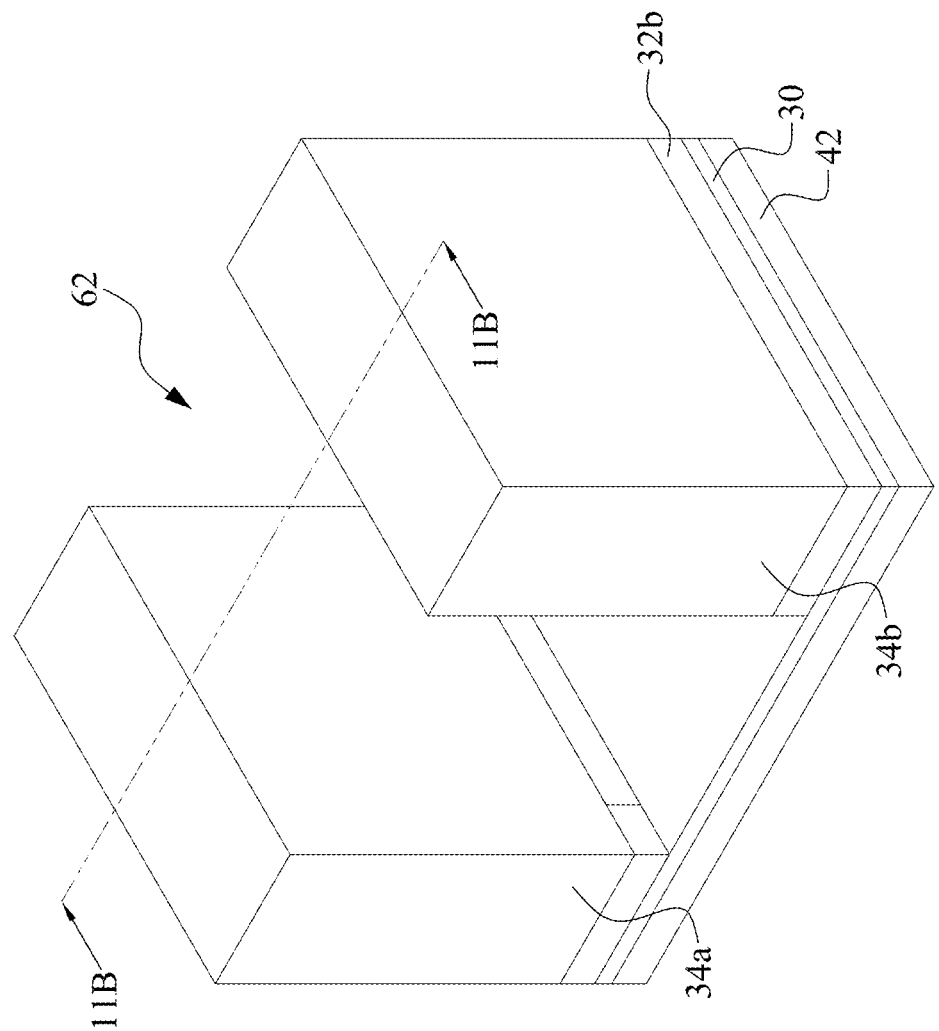
Fig. 11A
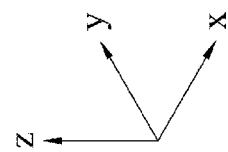

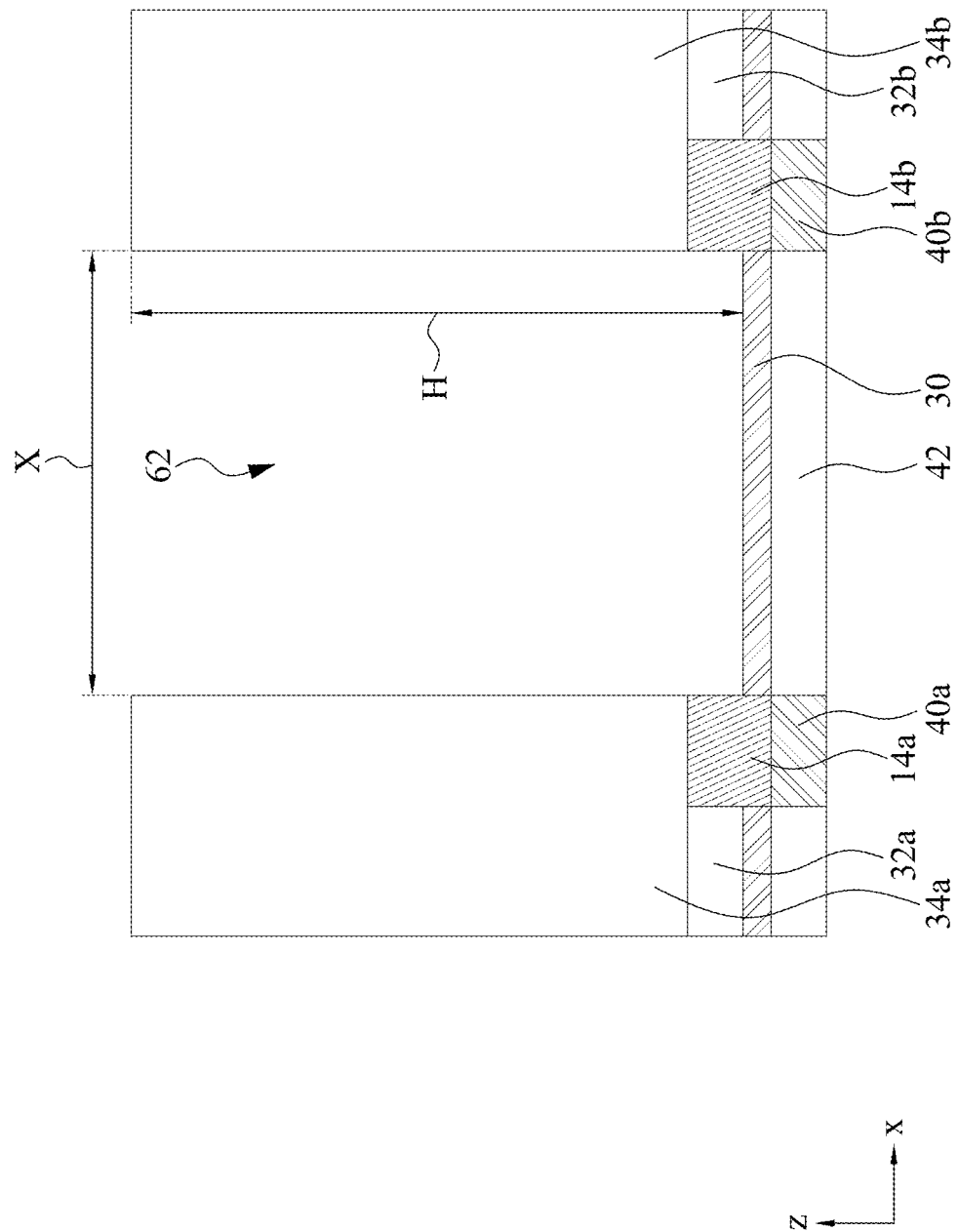

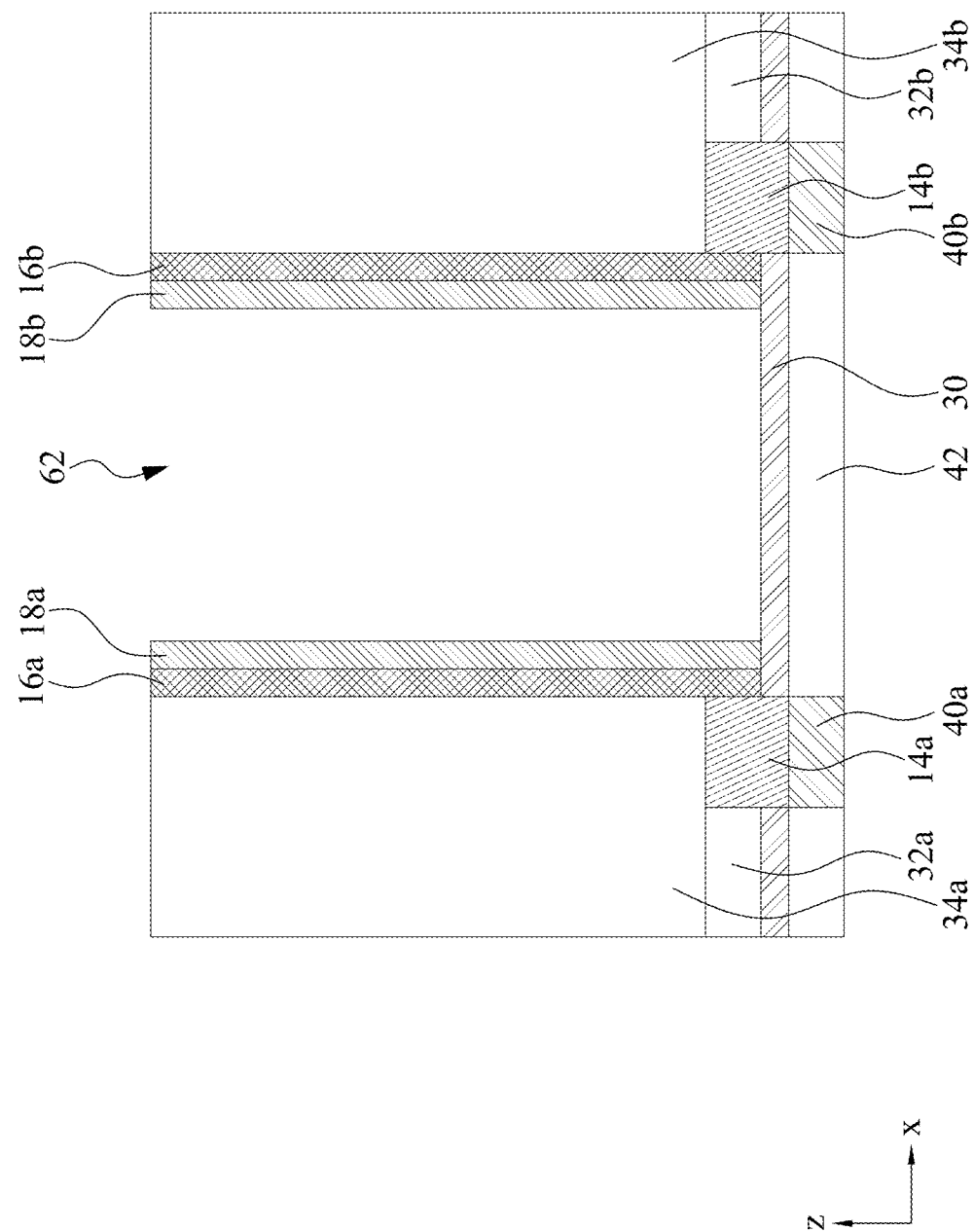

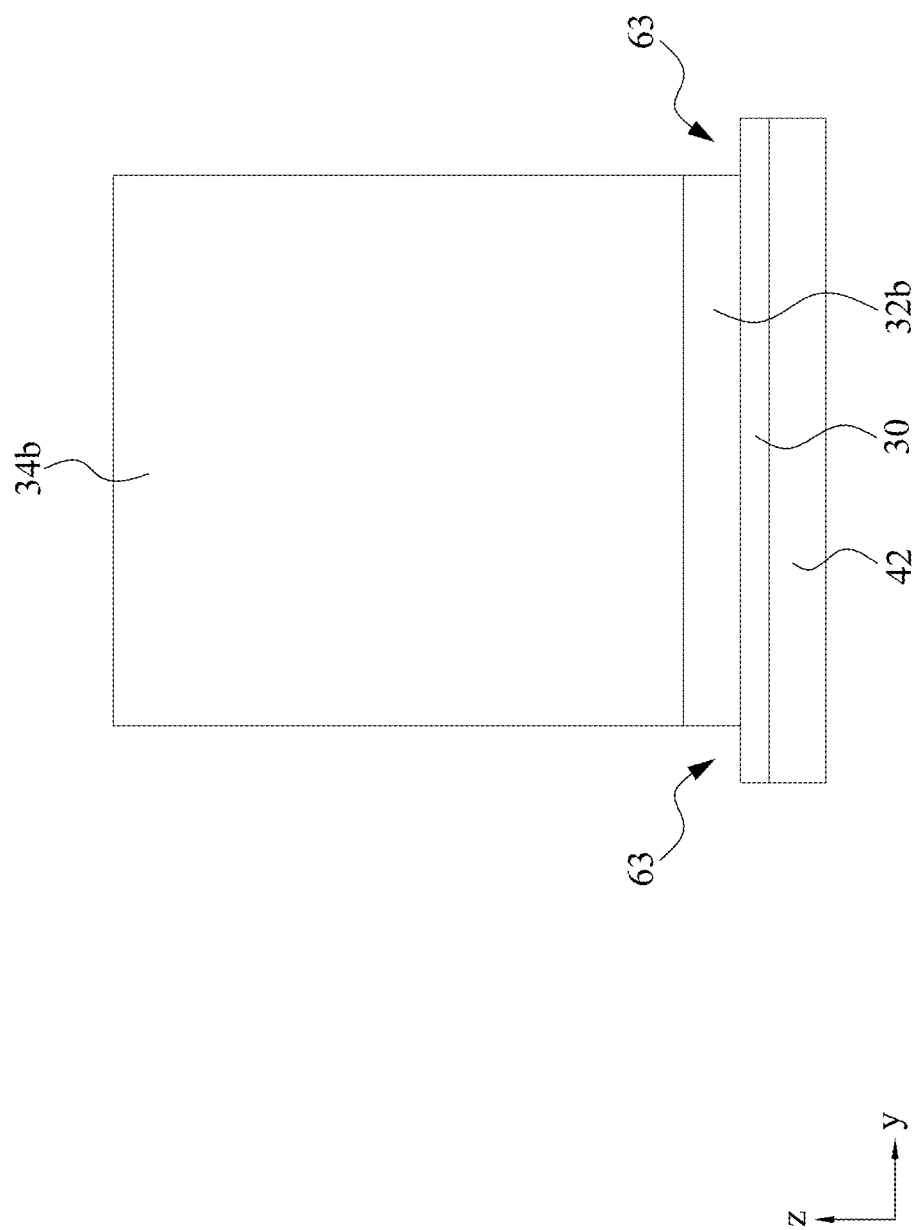

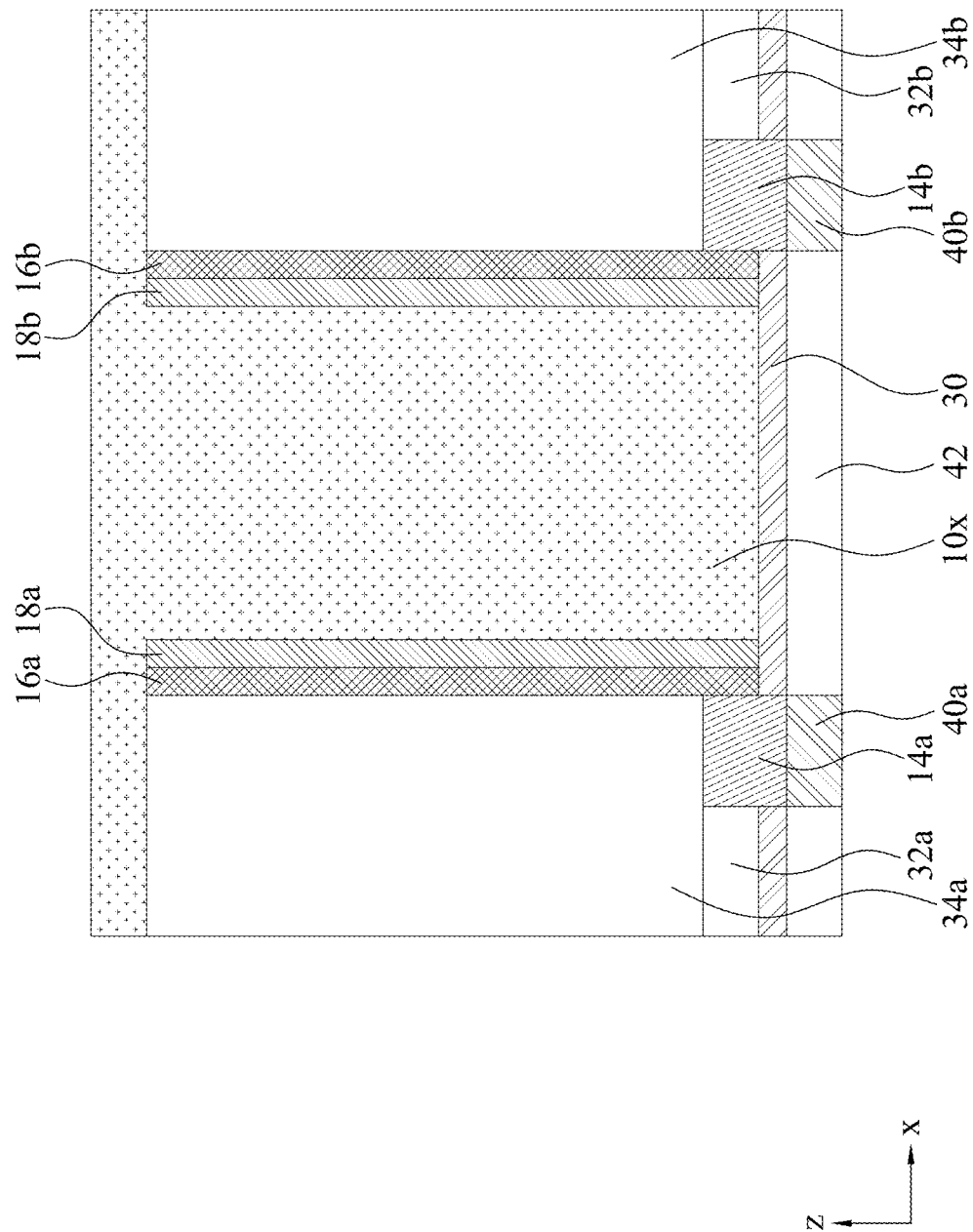

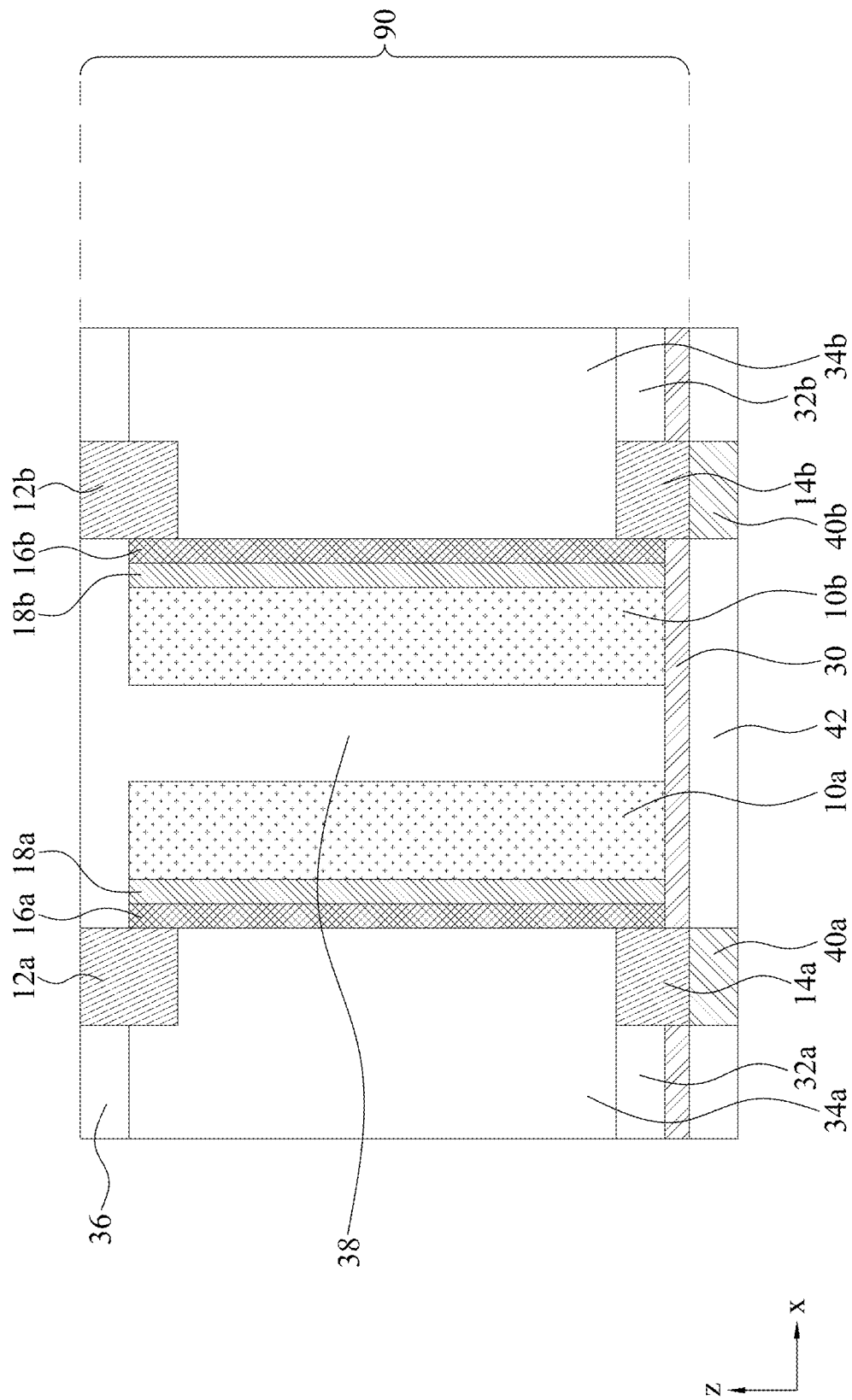

SEMICONDUCTOR STRUCTURE AND MANUFACTURING METHOD THEREOF

REFERENCE TO RELATED APPLICATIONS

This Application is a Continuation of U.S. application Ser. No. 17/377,664, filed on Jul. 16, 2021, which claims the benefit of U.S. Provisional Application No. 63/167,796, filed on Mar. 30, 2021. The contents of the above-referenced Patent Applications are hereby incorporated by reference in their entirety.

BACKGROUND

As technology progresses, the minimum size of the circuit element that can be manufactured in an integrated chip (IC) continues to decrease. Hence, there is an ever-increasing demand for increasing the number of circuit elements in an IC of the same or smaller size. One way to increase the circuit element density in an IC is to make circuit elements in multiple layers of the IC.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1A-1D illustrate several schematic views of an exemplary transistor structure in accordance with some embodiments of the present disclosure.

FIGS. 2A-2B, 3A-3B, 4A-4B, 5A-5B, 6A-6B, 7A-7B, 8A-8B, 9A-9B, 10A-10B, 11A-11B, 12A-12B, 13A-13B, 14A-14B, 15A-15B, 16A-16C, 17A-17C, 18A-18C, 19A-19B, 20A-20B, 21A-21B, 22A-22B, 23A-23B, 24A-24B and 25A-25B illustrate semiconductor structures for explaining exemplary steps for making transistor structures according to some embodiments of the present disclosure.

FIGS. 28A and 28B illustrate exemplary transistor structures in accordance with some embodiments of the present disclosure.

DETAILED DESCRIPTION

Figure 1A:
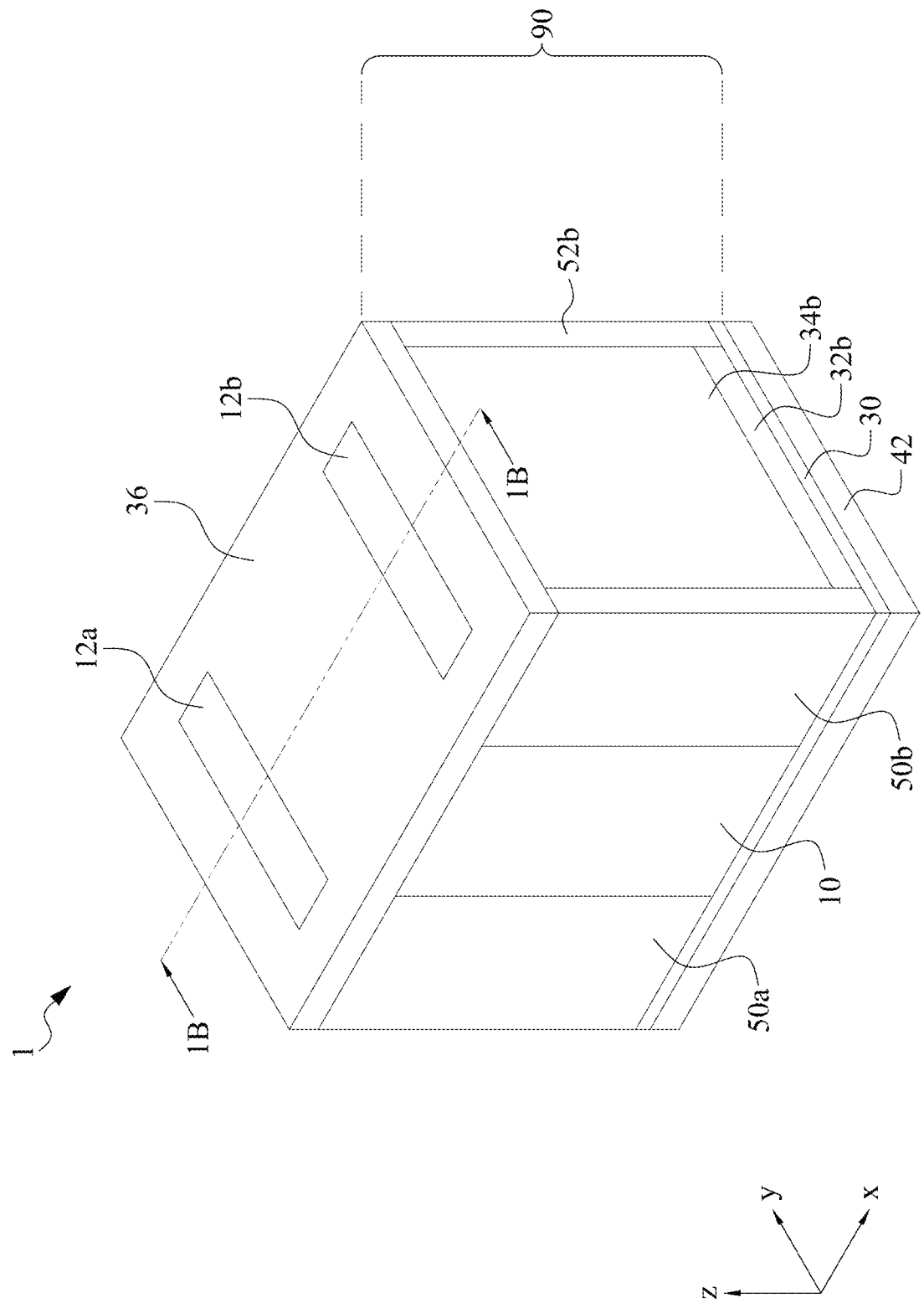

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90° or at other orientations) and the spatially relative descriptors used herein may likewise be interpreted accordingly.

In some embodiments, the term "substantially along," "substantially in parallel" or "substantially orthogonal" for a first direction and a second direction refers to the first direction within a deviation angle such as 5°, 10°, and 15°, etc., from a reference direction. For "substantially along" or "substantially in parallel," the reference direction is the second direction, and for "substantially orthogonal," the reference direction is 90° from the second direction. Other ways to determine the first direction being "substantially along,", "substantially in parallel" or "substantially orthogonal" to the second direction are within the contemplated scope of the present disclosure. For example, a ratio of a deviation angle of the first direction from a first reference direction and a deviation angle of the second direction from a second reference direction is greater than a percentage such as 85%, 90% and 95%, etc. For "substantially along" or "substantially in parallel", the first reference direction is the same as the second reference direction, and for "substantially orthogonal", the first reference direction is 90° from the second reference direction. For another example, a difference between a deviation angle of the first direction from the first reference direction and a deviation angle of the second direction from the second reference direction is less than a percentage such as 5%, 10% and 15%, etc., of the deviation angle of the second direction from the second reference direction.

It should be understood that in the present disclosure, one pattern/layer/structure/surface/direction being substantially perpendicular to another pattern/layer/structure/surface/direction means that the two patterns/layers/structures/surfaces/directions are perpendicular to each other, or the two patterns/layers/structures/surfaces/directions are intended to be configured to be perpendicular to each other but may not be perfectly perpendicular to each other due to design, manufacturing, measurement errors/margins caused by nonideal manufacturing and measurement conditions. Such a description should be recognizable to one of ordinary skill in the art.

In the present disclosure, two layers/patterns/structures being formed on different level means that with consideration of variations/errors caused by, for example, surface roughness, the two layers/patterns/structures have different distances from a reference plane, for example, a surface of a substrate, based on which a semiconductor device is formed.

In the present disclosure, a layer, a pattern, or a structure extending in one direction means that a dimension of the layer, the pattern, or the structure in the extended direction is greater than that of the layer, the pattern, or the structure in another direction substantially perpendicular to the extended direction.

In the present disclosure, the phrase "one of A, B and C" means "A, B and/or C" (A, B, C, A and B, A and C, B and C, or A, B and C), and does not mean one element from A, one element from B and one element from C, unless otherwise described.

In the present disclosure, layers/patterns/structures being formed of substantially the same material means that the layers/patterns/structures are formed of the same material or the layers/patterns/structures are originally formed of the same material but can have impurities having the same or different types with the same or different concentrations doped later in order to implement a semiconductor device. Such a description should be recognizable to one of ordinary skill in the art.

In the present disclosure, expressions such as "about" and "approximately," which precede a value, indicate that the value is exactly as described or within a certain range of the value as described, while taking into account the design error/margin, manufacturing error/margin, measurement error, etc. Such a description should be recognizable to one of ordinary skill in the art.

Further, it will be understood that when an element is referred to as being "connected to" or "coupled to" another element, it may be directly connected to or coupled to the other element, or intervening elements may be present.

In the present disclosure, not every layer of a cell or a layout is depicted in the drawings. One of ordinary skill in the art should understand that the cell or the layout can include more layers to implement functionality of the cell and these layers are omitted merely for convenience of description.

Figure 31:
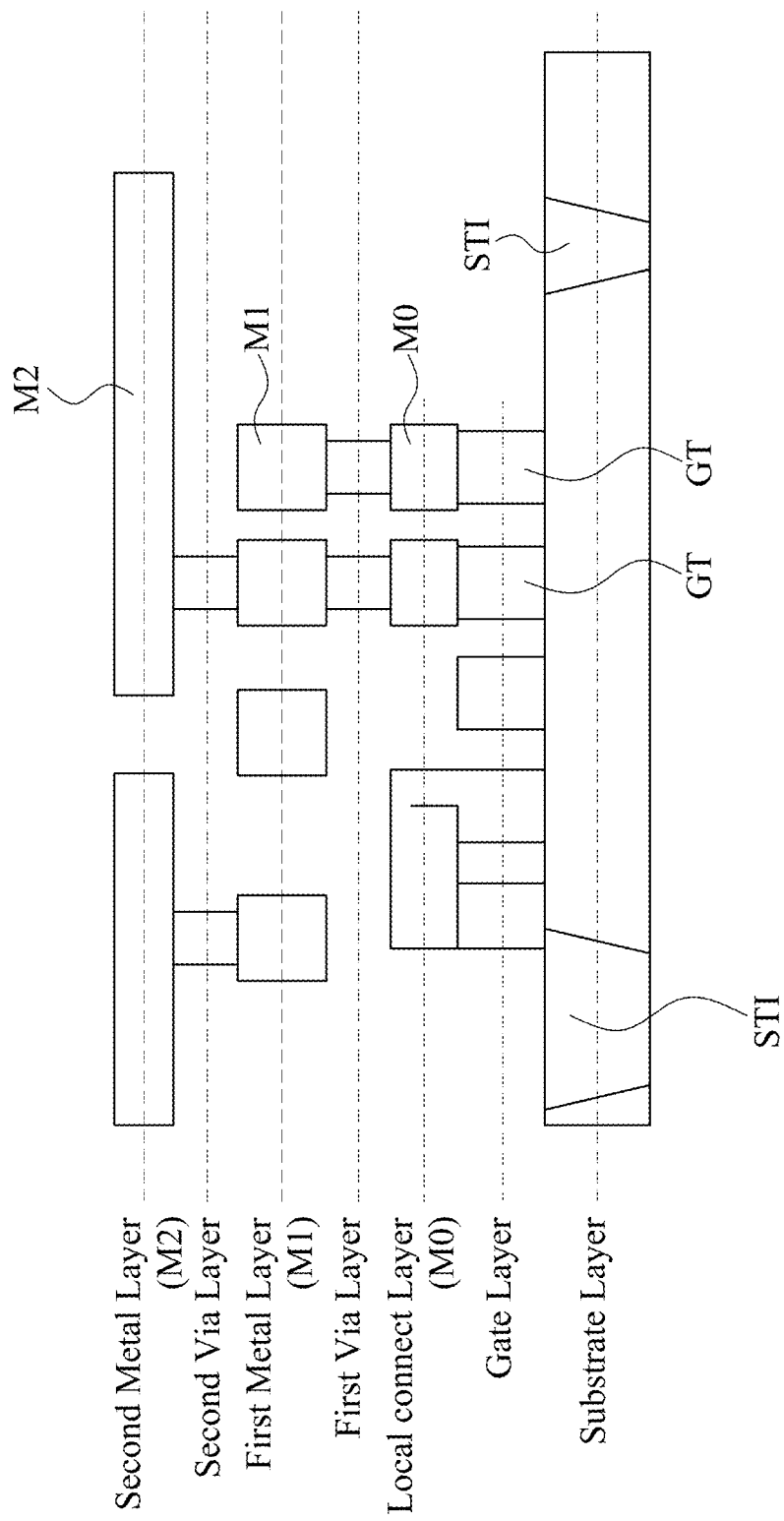
FIG. 31 shows a schematic view illustrating a vertical layer arrangement of a semiconductor device relating to the embodiments of the present disclosure.

FIG. 31 shows a cross sectional view illustrating a vertical layer arrangement of a semiconductor device relating to the embodiments of the present disclosure. FIG. 31 does not necessarily show a specific cross section of the semiconductor devices or structures described elsewhere in the present disclosure.

In the substrate layer, channel structures (such as fin structures) and source/drain structures can be disposed. In the gate layer, gate structures (such as gate electrodes and gate dielectric layers) can be disposed. The local interconnect wiring layer M0 is located above the gate layer and/or the source/drain structures. The first via layer is located above the gate layer, and first vias can be disposed in the first via layer. In the first metal layer M1, metal interconnection can be disposed. In the second via layer, vias can be disposed to electrically connect elements in the M0 and M1 layers. In the second metal layer M2, metal interconnection can be disposed. The number of metal layers (x for Mx) can be more than 2, and in some embodiments, up to 15-20.

Application-specific integrated circuits (ASIC) can be fabricated on semiconductor wafers (such as silicon wafers) by semiconductor manufacturing processes. These processes can be divided into Front-end-of-line (FEOL) processing and Back-end-of-line (BEOL) processing.

In the context of the present disclosure, FEOL processing refers to the steps and processes that relate to the formation of transistors in or directly on a semiconductor substrate. In the context of the present disclosure, BEOL processing may include the steps and processes that relate to the formation of interconnection (e.g., elements for interconnecting the transistors formed in FEOL processing) and passivation. In the context of the present disclosure, BEOL processing may refer to the formation of the M1 layer and the layers above M1.

Certain FEOL processes may require a relatively high temperature. For example, the annealing performed after certain types of doping processes may reach 1000° C. or even higher temperatures. The high temperatures may prevent the use of some materials in the FEOL processing.

In contrast, a lower processing temperature may be sufficient for common manufacturing steps employed in the BEOL processing (such as deposition), so the BEOL processing may have a lower temperature budget than the FEOL processing. The lower temperature budget may enable the use of materials that are not available to the FEOL processing because of the temperature constraint.

Different types of integrated circuits may be fabricated with specialized semiconductor manufacturing processes. For example, an ASIC contains numerous logic gates whereas a memory chip contains mostly memory cells, so specialized processes may be developed for making them. That said, an ASIC may still contain a certain amount of memory cells to store the data on which the logic gates operate. Hence, it is not uncommon to employ logic processes to make memory cells embedded in the ASIC.

Two types of memory are common: static random access memory (SRAM) and dynamic random access memory (DRAM). A unit DRAM cell may use as few elements as one transistor and one capacitor (the "1T1C" configuration), whereas a unit SRAM cell may use more than one transistors, such as six, eight, or ten. Since the technology trend is to squeeze as many transistors as possible into the same amount of substrate area of an ASIC, DRAM may be more advantageous than SRAM in terms of cell size.

The transistor in the 1T1C DRAM cell (often called the "access transistor") embedded in an ASIC may still be fabricated with logic processes, which are fast evolving to continuously reduce the smallest available transistor size and increase the number of transistors that can fit in the same die size.

However, since DRAM access transistors are formed with FEOL processing, these transistors may be competing with the transistors of logic circuitry for the same semiconductor substrate area. Hence, it would be advantageous to provide a transistor structure suitable for functioning as DRAM access transistors that are placed above the semiconductor substrate. That is, it would be advantageous to provide a transistor structure that can be made with steps and processes available in BEOL processing.

It would also be advantageous to keep the gate-induced drain leakage (GIDL) and other types of drain leakage in such transistor structure at a relatively low level in order to reduce power consumption.

It would also be advantageous to provide a transistor structure with a reduced footprint.

It would also be advantageous to provide a transistor structure whose performance can stay stable over a wide range of operating temperatures.

The subject matter of the present disclosure will be explained below in more details, with reference to the accompanying figures.

Figure 1B:
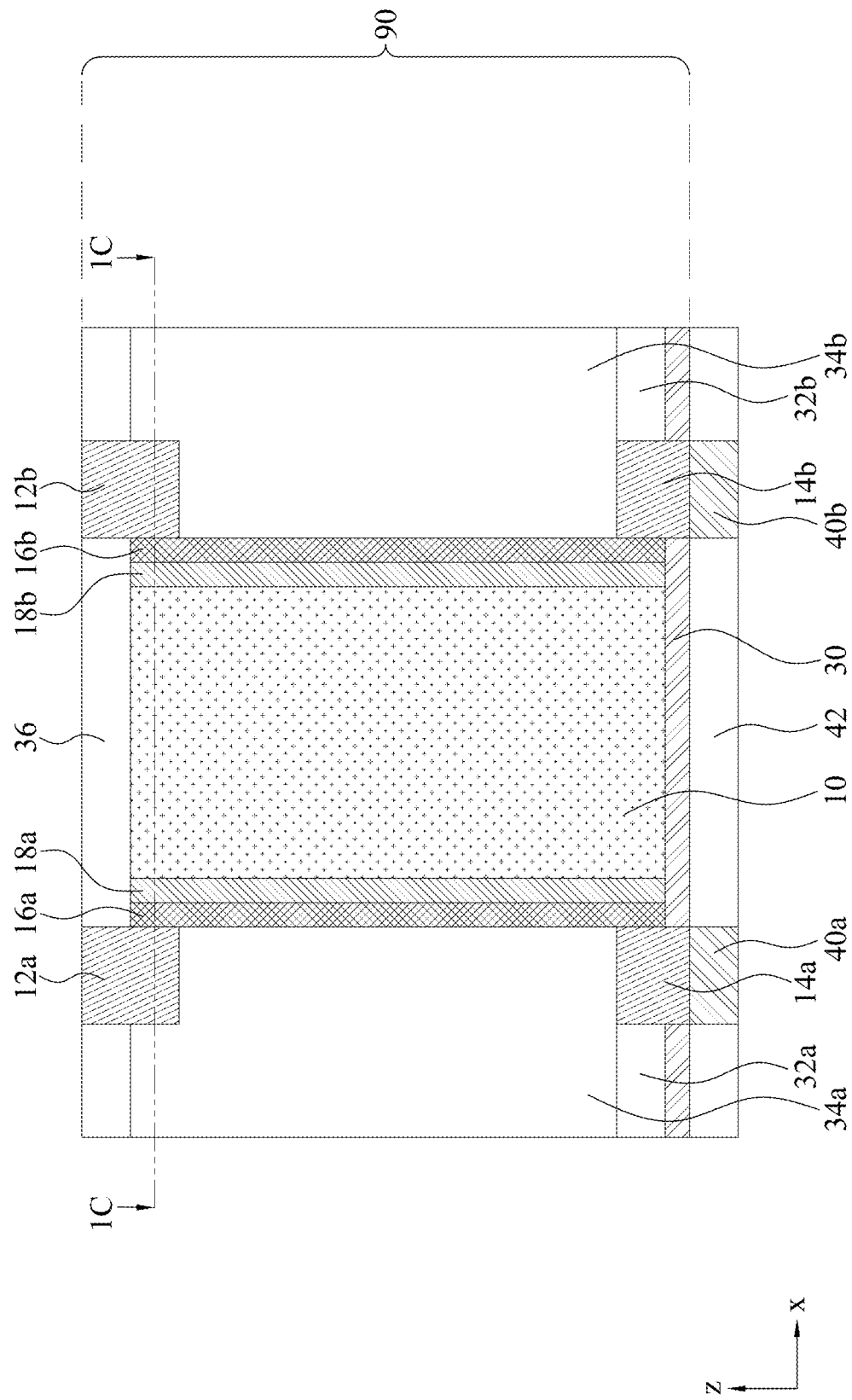
Figure 1C:
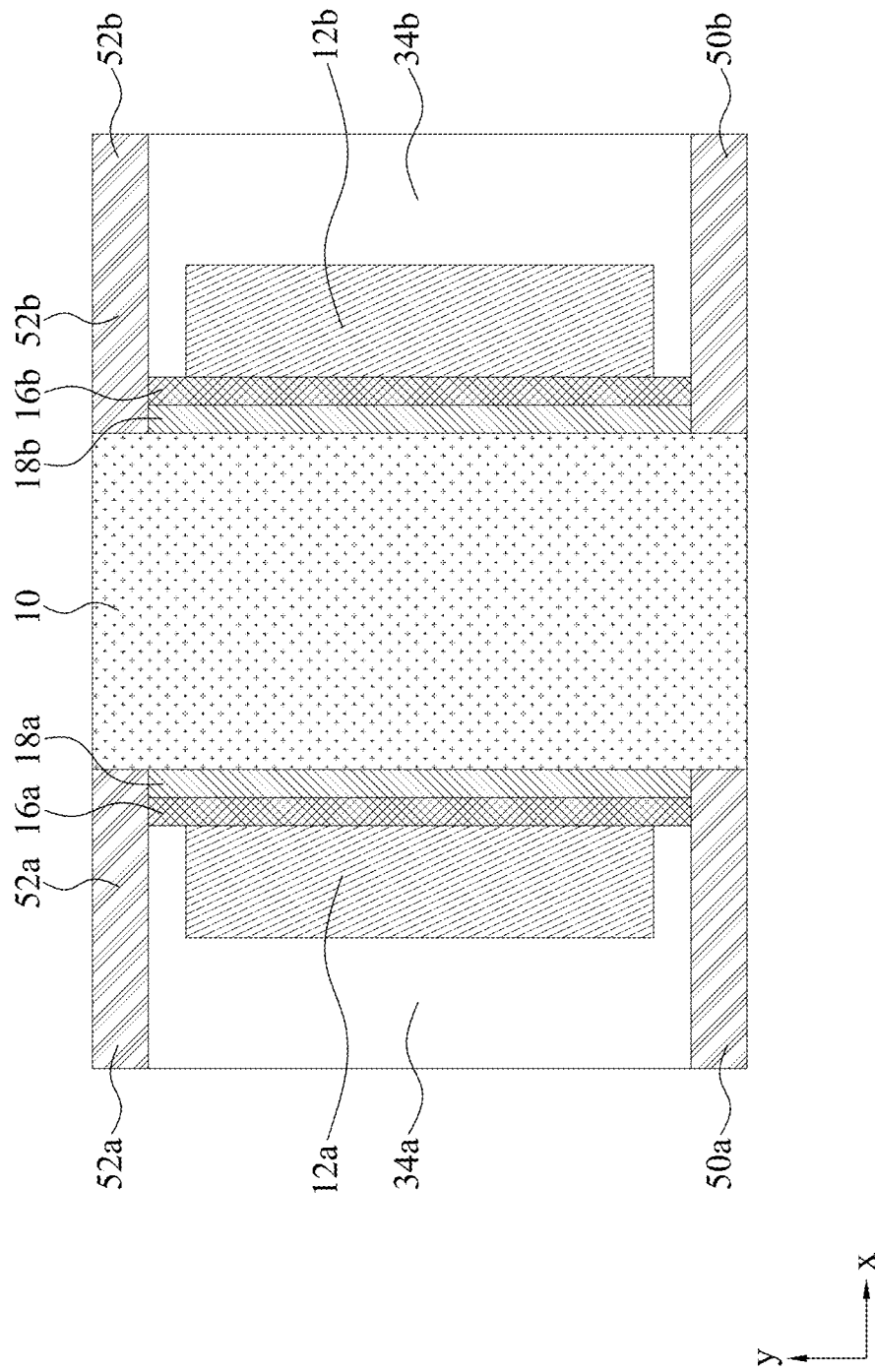

FIGS. 1A-1D illustrate several schematic views of an exemplary transistor structure 1 in accordance with some embodiments of the present disclosure. FIG. 1A illustrates a perspective view. FIG. 1B illustrates a cross-sectional view along the cut line 1B-1B. FIG. 1C illustrates a top view along the cut line 1C-1C. FIG. 1D illustrates a perspective view along the cut line 1B-1B.

Hatching is employed in the cross-sectional view of FIG. 1B and the top view of FIG. 1C to better illustrate some, though not necessarily all, of the components in the transistor structure 1. Hatching is not used in the perspective view of FIG. 1A to avoid visual cluttering. In FIG. 1D, hatching is used on the sides of the cross-sectional view of some constituent components but not on the other sides, to achieve optimal clarity. The fact that some of the components are not indicated with hatching patterns does not necessarily mean that they share any relationship. Also, the lack of hatching patterns in one component does not necessarily mean that it is empty.

The transistor structure 1 includes a gate region 10, source/drain regions 12a and 12b, source/drain regions 14a and 14b, channel regions 16a and 16b, and gate dielectric regions 18a and 18b.

The gate region 10 extends substantially in the Z-direction, as shown in FIG. 1B. The gate region 10 may also extend substantially in another direction, such as the Y-direction, as shown in FIG. 1C. The gate dielectric region 18a is between the gate region 10 and the channel region 16a. The gate dielectric region 18b is between the gate region 10 and the channel region 16b. The gate dielectric regions 18a and 18b can prevent electrically conductive communication between the gate region 10 and the channel regions 16a and 16b, respectively.

The source/drain regions 12a and 14a are in contact with the channel region 16a. Depending on applied voltages in operation, one of the source/drain regions 12a and 14a can become a source region, and the other can become a drain region. If a sufficient voltage is applied to the gate region 10, a current channel can establish in the channel region 16a between the source/drain regions 12a and 14a. A current can flow in the current channel of the channel region 16a in substantially the Z-direction.

Similarly, if a sufficient voltage is applied to the gate region 10, a current channel can establish in the channel region 16b between the source/drain regions 12b and 14b.

Advantageously, forming transistor channels in substantially the Z-direction, instead of the X- or Y-directions, may reduce the footprint of the transistor structure 1 in the X-Y plane. This may help to place more transistor structures in the same unit area in the X-Y plane. This may help to save substrate real-estate.

Advantageously, the gate region 10 can be shared by the two channel regions 16a and 16b (e.g., by two transistors). This can help reduce the X-Y footprint per transistor.

As shown in FIG. 1B, the gate region 10 covers substantially an entirety of the channel regions 16a and 16b. That is, the gate region 10 can cover the entire length of the current channel(s). The gate region 10 may therefore provide an improved control over the current channel(s) formed in the channel regions 16a and 16b. In other words, the spatial relationship between the gate region 10 and the channel regions 16a and 16b may help reduce or eliminate ill-controlled or un-controlled area in the channel regions 16a and 16b. The improved control may contribute to reducing undesirable current leakage. The improved control may contribute to an improved on-off ratio of the transistors.

The dimensions and shapes of the gate region 10, the source/drain regions 12a, 12b, 14a and 14b, the channel regions 16a and 16b, and the gate dielectric regions 18a and 18b are not limited to those illustrated in FIGS. 1A-1D. These dimensions and shapes may be adapted. For example, although the source/drain regions 12a, 12b, 14a and 14b are shown to have a rectangular shape on the X-Y plane, other shapes are also possible, such as a circular or elliptical shape.

As shown in FIG. 1B, the source/drain regions 12a and 12b may extend from directly next to the channel regions 16a and 16b to vertically past an outer surface of the channel regions 16a and 16b in the +Z-direction. In other words, the top surface of the source/drain regions 12a and 12b may be not coplanar with the channel regions 16a and 16b.

As shown in FIG. 1B, the source/drain regions 14a and 14b may extend from directly next to the channel regions 16a and 16b to vertically past an outer surface of the channel regions 16a and 16b in the −Z-direction. In other words, the bottom surface of the source/drain regions 14a and 14b may be not coplanar with the channel regions 16a and 16b.

Although the illustrated channel region 16a has substantially the same length in the Z-direction as the gate dielectric region 18a, other relative lengths are also possible. Similarly, the substantially identical Z-length between the channel region 16b and the gate dielectric region 18b is also exemplary.

The transistor structure 1 may also include an etch stop layer 30, dielectric regions 32a and 32b, dielectric regions 34a and 34b, a dielectric layer 36, dielectric regions 50a and 50b, and dielectric regions 52a and 52b.

The dielectric regions 32a and 32b may be part of a dielectric layer. The dielectric regions 32a and 32b may provide electrical isolation between circuit elements on different sides of the dielectric regions 32a and 32b. For example, the dielectric regions 32a and 32b may isolate the source/drain regions 14a and 14b from other circuit elements that may exist next to or around the transistor structure 1.

The dielectric regions 34a and 34b may be part of a dielectric layer. The dielectric regions 34a and 34b may provide electrical isolation between circuit elements on different sides of the dielectric regions 34a and 34b. For example, the dielectric regions 34a and 34b may isolate channel regions 16a and 16b from other circuit elements that may exist next to or around the transistor structure 1.

The dielectric layer 36 may provide electrical isolation to other circuit elements. For example, the dielectric layer 36 may provide isolate the source/drain regions 12a and 12b from each other.

The etch stop layer 30 may also provide electrical isolation between, for example, the stack 90 (shown in FIG. 1D) and the elements below the etch stop layer 30. Furthermore, during formation of the transistor structure 1, the etch stop layer 30 may prevent over-etching that could damage underlying layers (e.g., conductive regions 40a and 40b and/or dielectric layer 42).

Similarly, the dielectric regions 50a, 50b, 52a and 52b may be part of one or more dielectric layers and provide electrical isolation. For example, the dielectric regions 50a, 50b, 52a and 52b may isolate the source/drain regions 12a, 12b, 14a and 14b from other circuit elements that may exist next to or around the transistor structure 1, such as those next to or around the transistor structure 1 in the Y-direction.

In some embodiments, a semiconductor structure may include a plurality of transistor structures 1 arranged in the form of an array. The dielectric regions 32a, 32b, 34a, 34b, 50a, 50b, 52a and 52b may effectively isolate the channel regions 16a and 16b of one transistor structure from other transistor structures. Moreover, within the transistor structure 1, the channel regions 16a and 16b are also isolated from each other. The isolation of the channel regions 16a and 16b can help reduce or eliminate ill-controlled or un-controlled area in the channel regions. The improved control may contribute to reducing undesirable current leakage. The improved control may contribute to an improved on-off ratio of the transistors.

The transistor structure 1 may also include conductive regions 40a and 40b, and a dielectric layer 42. The conductive regions 40a and 40b may be conductive contacts, such as via or conductive interconnect. The conductive regions 40a and 40b may connect the circuit elements in the stack 90, such as the source/drain regions 14a and 14b, to circuit elements in other layers of an integrated circuit.

Although not explicitly shown in FIGS. 1A-1D, a semiconductor substrate may exist below the transistor structure 1.

The transistor structure 1 is formed in a BEOL portion of an integrated circuit. The transistor structure 1 may be formed in a layer that is M1 or above. In the exemplary illustration, the constituent parts in the stack 90 of the transistor structure 1 are within one metal layer, such as M1 and M2; although this is not a limitation to the present disclosure.

In an embodiment where the transistor structure 1 is employed as the access transistor of DRAM cells, the gate region 10 may be part of a word line. In an embodiment, the conductive regions 40a and 40b may each be part of a bit line of a DRAM cell. In an embodiment, charge storage devices (such as capacitors in a different layer) may be connected to the source/drain regions 12a and 12b of the transistor structure 1.

Advantageously, in an application where the transistor structure 1 is employed as the access transistor of DRAM cells, the ability to place the transistor structure 1 in a BEOL portion may preserve more area on the semiconductor substrate for logic circuitry. This ability may also enable CMOS-under-Array (CuA) integration, in which more logic circuitry fabricated in the FEOL portion may be placed under memory arrays fabricated in the BEOL portion.

Advantageously, DRAM enabled with the transistor structure 1 may reach unit cell area that is competitive with other types of memory, such as SRAM, in more advanced technology nodes.

Advantageously, because the channel regions 16a and 16b of the transistor structure 1 have an improved isolation from other circuit elements, DRAM with access transistors enabled with the transistor structure 1 may be less prone to or even immune from row-hammer attack.

The elements of the transistor structure 1 may include or be made with a variety of materials.

The gate region 10 may include titanium nitride (TiN), tungsten (W), molybdenum (Mo), other suitable materials, their compounds and/or alloys, and any appropriate combinations of them. These materials can reduce the temperature for making the gate region 10. These materials can make the process for making the gate region 10 (e.g., deposition) compatible with BEOL processing.

The source/drain regions 12a, 12b, 14a, and 14b may include W, copper (Cu), TiN, Mo, ruthenium (Ru), other suitable materials, their compounds and/or alloys, and any appropriate combinations of them. These materials can reduce the temperature for making the source/drain regions 12a, 12b, 14a, and 14b (e.g., deposition), in comparison to the temperature of other methods to make source/drain regions such as ion implantation. These materials can make the process for making the source/drain regions 12a, 12b, 14a, and 14b compatible with BEOL processing.

The channel regions 16a and 16b may include one or more oxide semiconductor materials. The channel regions 16a and 16b may include indium tin oxide (ITO); indium tungsten oxide (IWO); indium gallium zinc oxide (IGZO); titanium oxide (TiO); $I_xG_yZ_zMO$, where M includes at least one of Ti, aluminum (Al), cerium (Ce) or tin (Sn), in which x, y and z are each greater than 0 and less than 1; their compounds; and any appropriate combinations of them. The oxide semiconductor materials can be formed in single- or multi-layered structure.

The abovementioned materials that may be suitable for the channel regions 16a and 16b can make the process for making the channel regions 16a and 16b (e.g., deposition) compatible with BEOL processing. The temperature for fabricating channel regions made of these oxide semiconductor materials may be sufficiently low to make it compatible with BEOL processing.

The choices of materials of the gate region 10, the source/drain regions 12a, 12b, 14a, and 14b, and the channel regions 16a and 16b may enable formation of transistors without resorting to doping or implantation, thereby enabling a reduced process temperature.

The gate dielectric regions 18a and 18b may include oxides and/or high-k materials. The gate dielectric regions 18a and 18b may include $AlO_x$, $HfO_x$, HfLaO, HfSiO, LaO, other suitable materials and their compounds, and any appropriate combinations of them.

In some embodiments, the surface of the channel regions 16a and 16b facing the gate dielectric regions 18a and 18b may be treated with a surface treatment configured to improve material stability. The treatment may improve the on-off ratio of the transistor. A leakage current less than $10^{-15}$ A can be achieved across a range of temperatures, and the range may be up to about 200° C. Surface treatments can include oxygen or $N_2O$ annealing, doping with fluorine (Cl), or oxygen plasma treatment. The temperatures for these treatments may range from room temperature (plasma) to the BEOL thermal budget limiting temperature of about 400° C.

During the fabrication of the transistor structure 1, annealing may be performed. An exemplary upper limit of temperature is approximately 400° C., approximately 500° C., or other similar values.

Since the gate region 10, the source/drain regions 12a, 12b, 14a, and 14b, the channel regions 16a and 16b, and the gate dielectric regions 18a and 18b of the transistor structure 1 may be formed by deposition, the transistors so made may be referred to as thin-film transistor (TFTs). The expression "thin," however, should not be construed to limit the size or thickness of any of the constituent components of such transistors.

FIGS. 2A-25B illustrate semiconductor structures for explaining exemplary steps for making transistor structures according to some embodiments of the present disclosure. Unless otherwise indicated, among FIGS. 2A-25B, figures whose numbers end with an "A" indicate a perspective view, and figures whose numbers end with a "B" indicate a cross-sectional view along a cut line shown in the corresponding figures that end with "A." Figures whose numbers end with a "C," if existing, indicate another view.

Figure 2A:
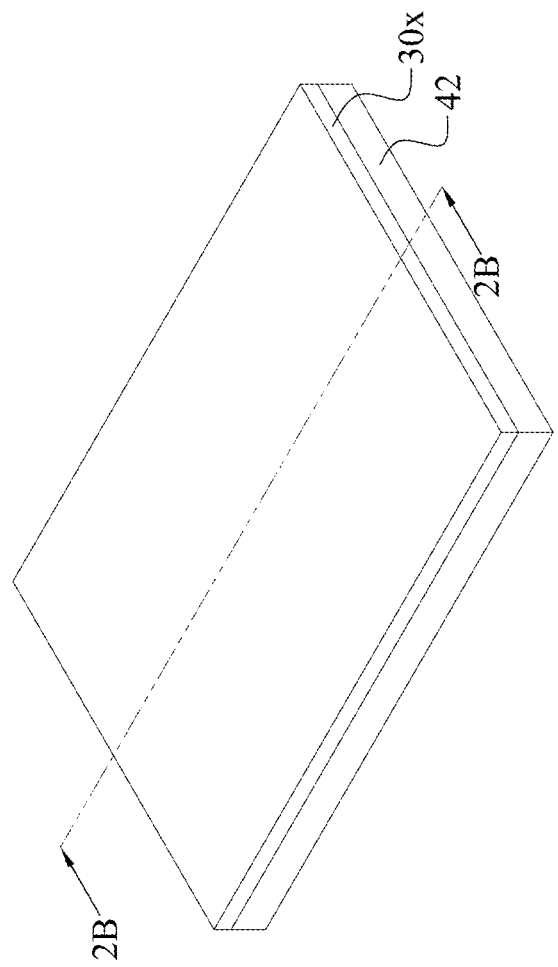
Figure 2B:
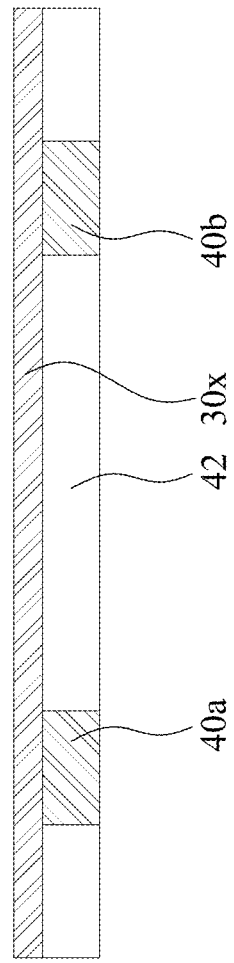

Refer to FIGS. 2A and 2B. An etch stop layer 30x can be made (e.g., deposited) on a dielectric layer 42. Conductive regions 40a and 40b may exist or be embedded in the dielectric layer 42. The dielectric layer 42 may be in a metal layer such as M1. The etch stop layer 30x may be in a different metal layer such as M2.

Figure 3A:
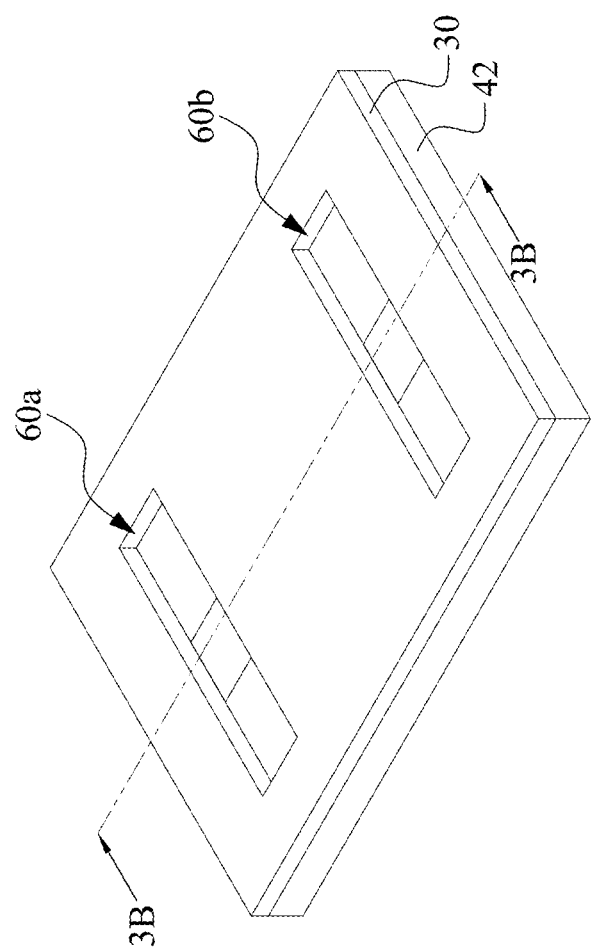
Figure 3B:
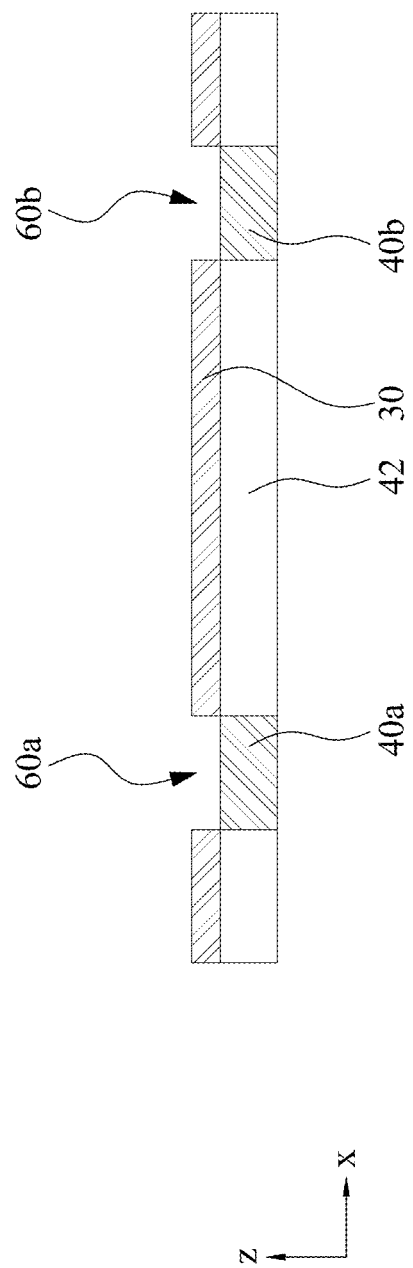

Refer to FIGS. 3A and 3B. One or more portions of the etch stop layer 30x may be removed (by, e.g., etching) to become the etch stop layer 30. The etch stop layer 30 may include recesses 60a and 60b. The recesses 60a and 60b may expose the conductive regions 40a and 40b in the dielectric layer 42.

Figure 4A:
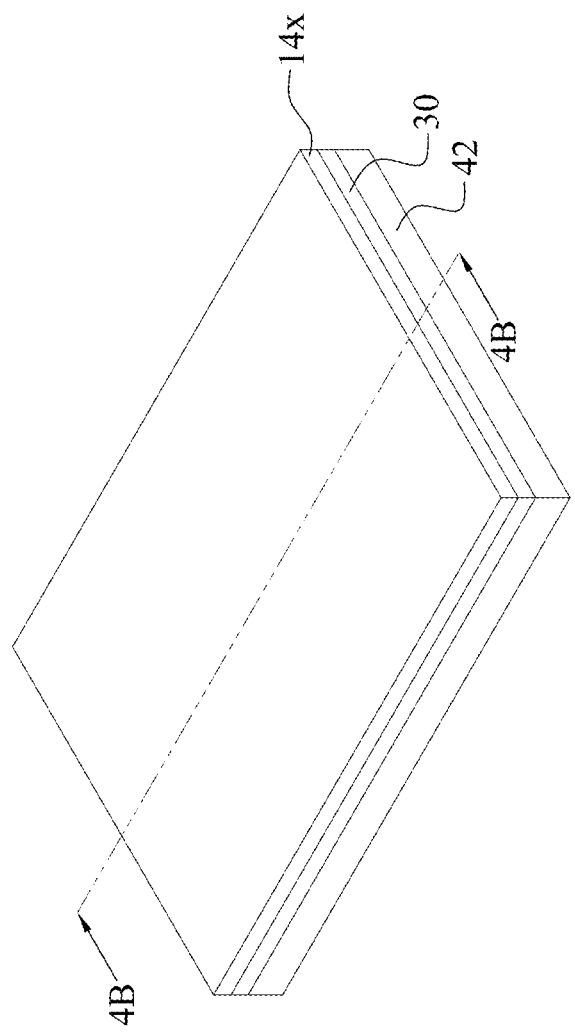
Figure 4B:
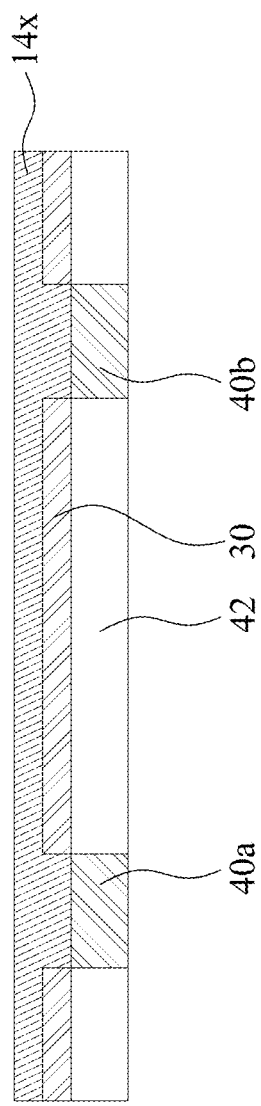

Refer to FIGS. 4A and 4B. A layer of source/drain material 14x may be formed (e.g., deposited) on or above the etch stop layer 30. The source/drain material 14x may fill the recesses 60a and 60b shown in FIGS. 3A and 3B. The source/drain material 14x may include W, Cu, TiN, Mo, Ru, other suitable materials, their compounds and/or alloys, and any appropriate combinations of them.

Figure 5B:
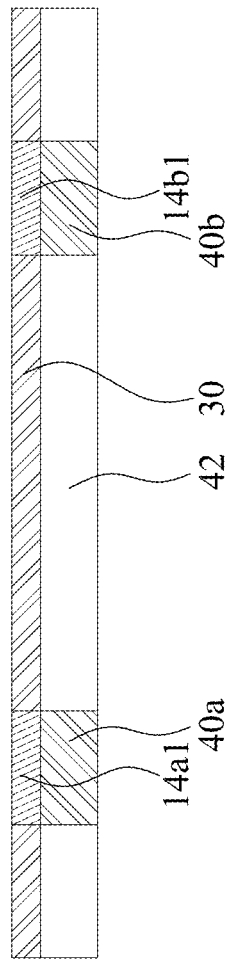

Refer to FIGS. 5A and 5B. A portion of the source/drain material 14x may be removed (e.g., by planarization techniques such as chemical-mechanical polishing (CMP)) to expose the etch stop layer 30. The removal may also create separate source/drain regions 14a1 and 14b1. A portion of the etch stop layer 30 may or may not be removed.

Figure 6A:
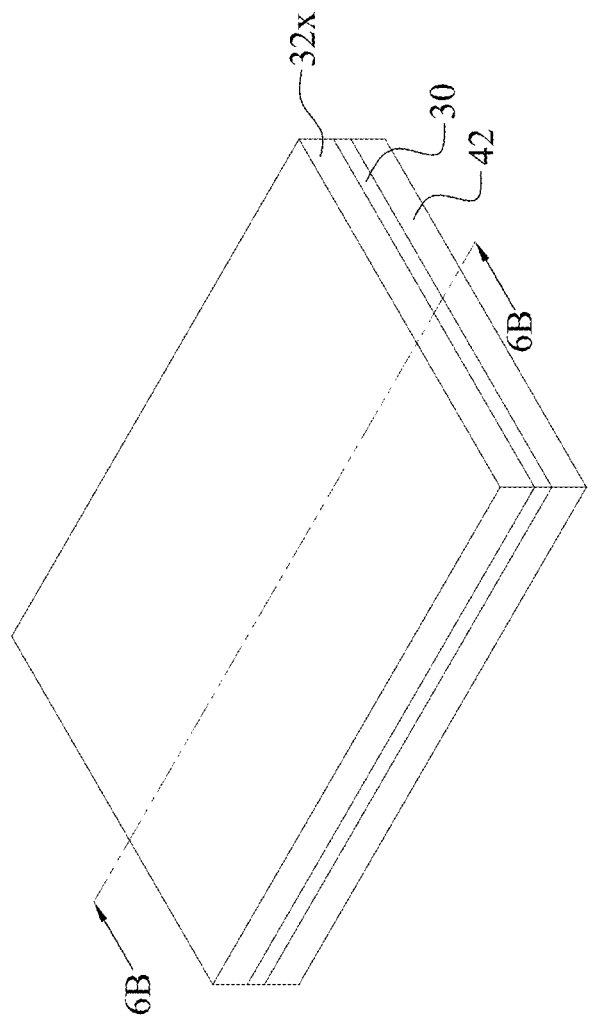
Figure 6B:
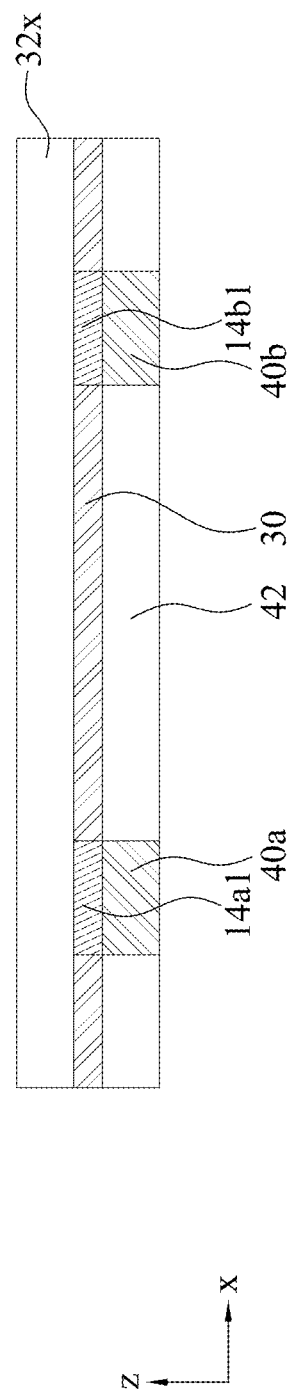

Refer to FIGS. 6A and 6B. A layer of dielectric material 32x may be formed (e.g., deposited) on or above the etch stop layer 30 and the source/drain regions 14a1 and 14b1. The dielectric material 32x may provide electrical isolation and, e.g., moisture isolation.

Figure 7A:
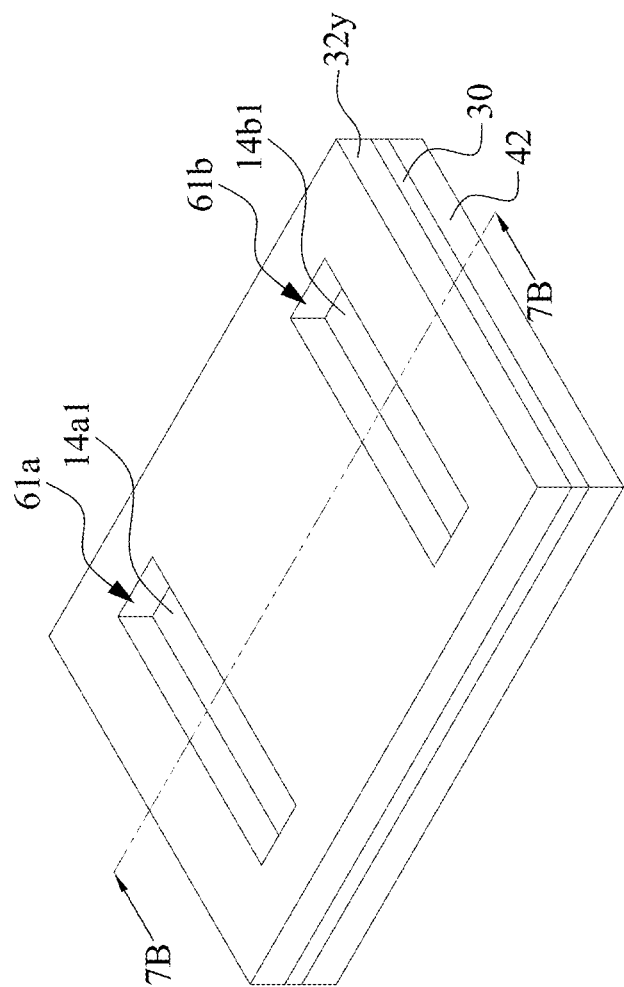
Figure 7B:
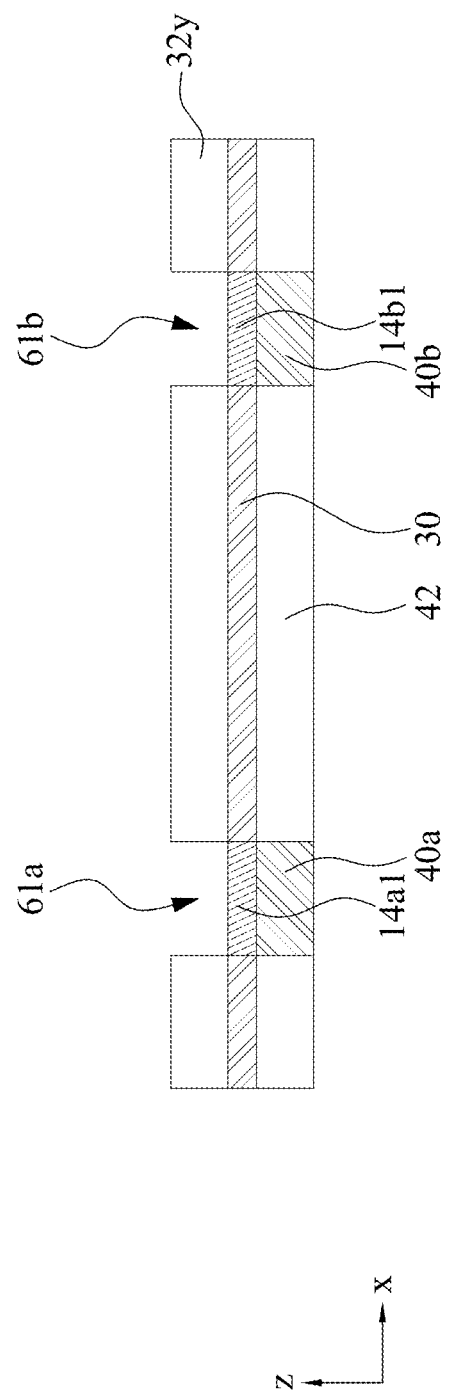

Refer to FIGS. 7A and 7B. One or more portions of the dielectric material 32x may be removed (by, e.g., etching) to become the dielectric layer 32y. The dielectric layer 32y may include recesses 61a and 61b. The recesses 61a and 61b may expose the source/drain regions 14a1 and 14b1. The recesses 61a and 61b may or may not expose the etch stop layer 30.

Figure 8A:
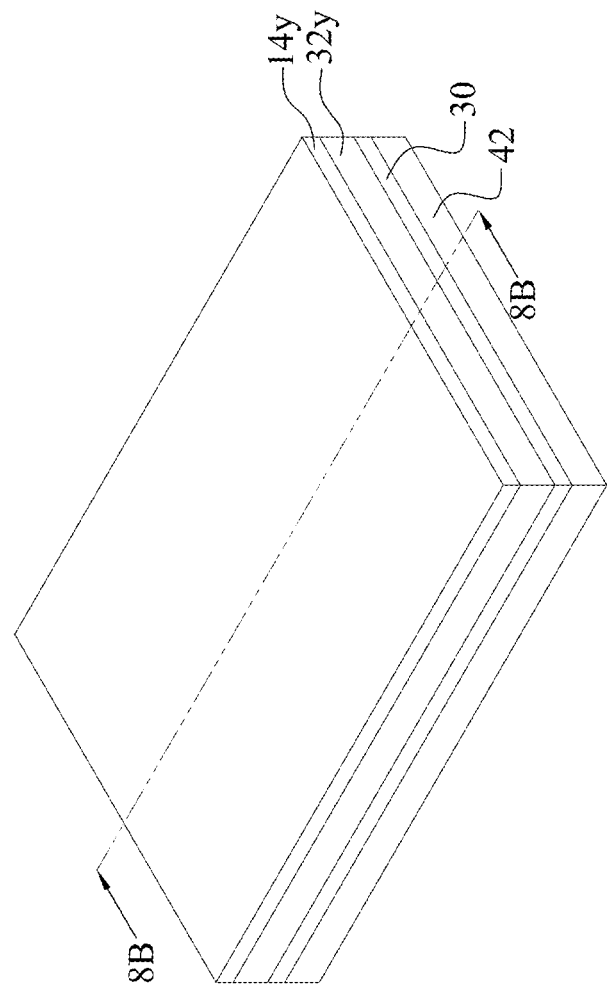
Figure 8B:
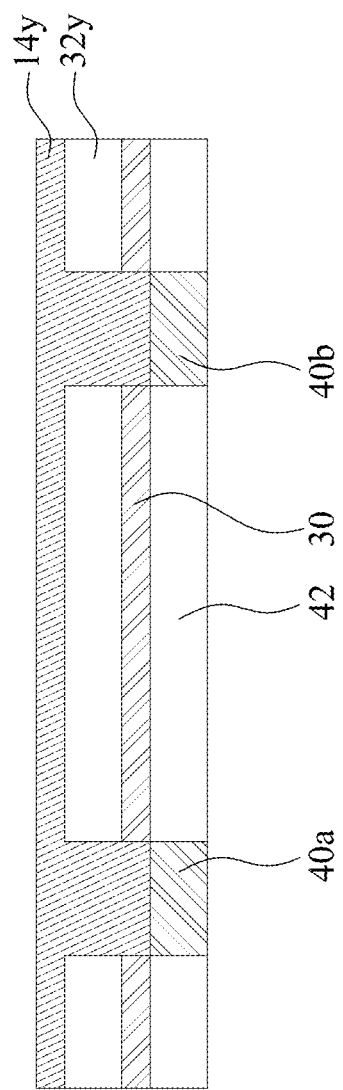

Refer to FIGS. 8A and 8B. A layer of source/drain material 14y may be formed (e.g., deposited) on or above the dielectric layer 32y. The source/drain material 14y may fill the recesses 61a and 61b shown in FIGS. 7A and 7B. The source/drain material 14y may include W, Cu, TiN, Mo, Ru, other suitable materials, their compounds and/or alloys, and any appropriate combinations of them. The source/drain materials 14x and 14y may be different or substantially identical.

Figure 9A:
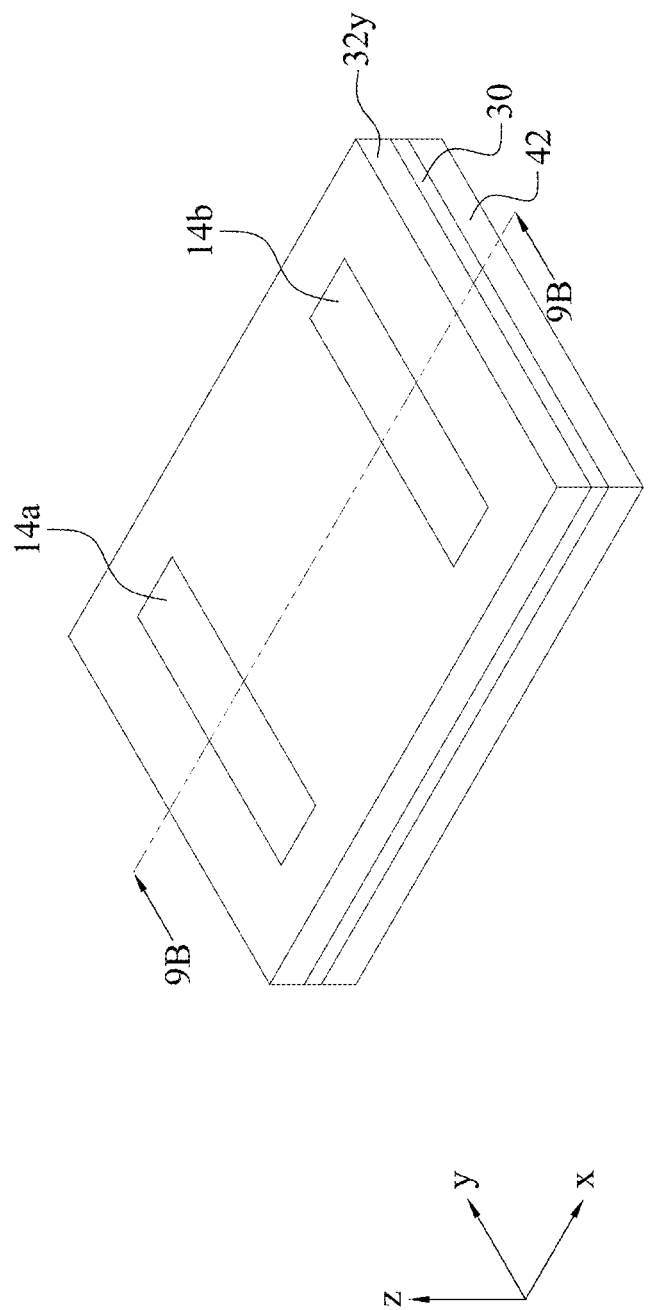
Figure 9B:
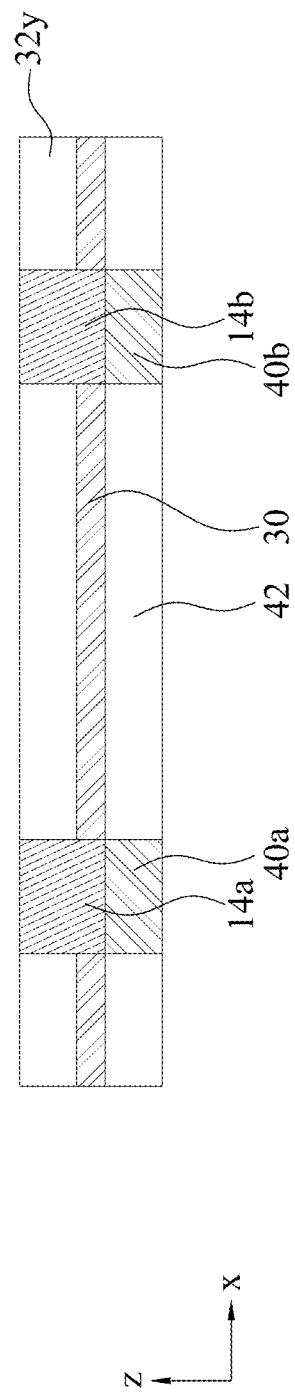

Refer to FIGS. 9A and 9B. A portion of the source/drain material 14y may be removed (e.g., by CMP) to expose the dielectric layer 32y. The deposition and subsequent partial removal of the source/drain material 14y may create separate source/drain regions 14a and 14b. The source/drain materials 14x and 14y may differ from each other; in which case each of the source/drain regions 14a and 14b may include two portions with one portion being the source/drain regions 14a1 and 14b1 shown in FIGS. 7A and 7B.

Depending on the hardness of different materials being polished, the polished surface is not necessarily entirely flat. For example, there may be a slight recess or protrusion in the source/drain regions, depending on whether the source/drain material is softer or harder than the surrounding dielectric materials.

Figure 10A:
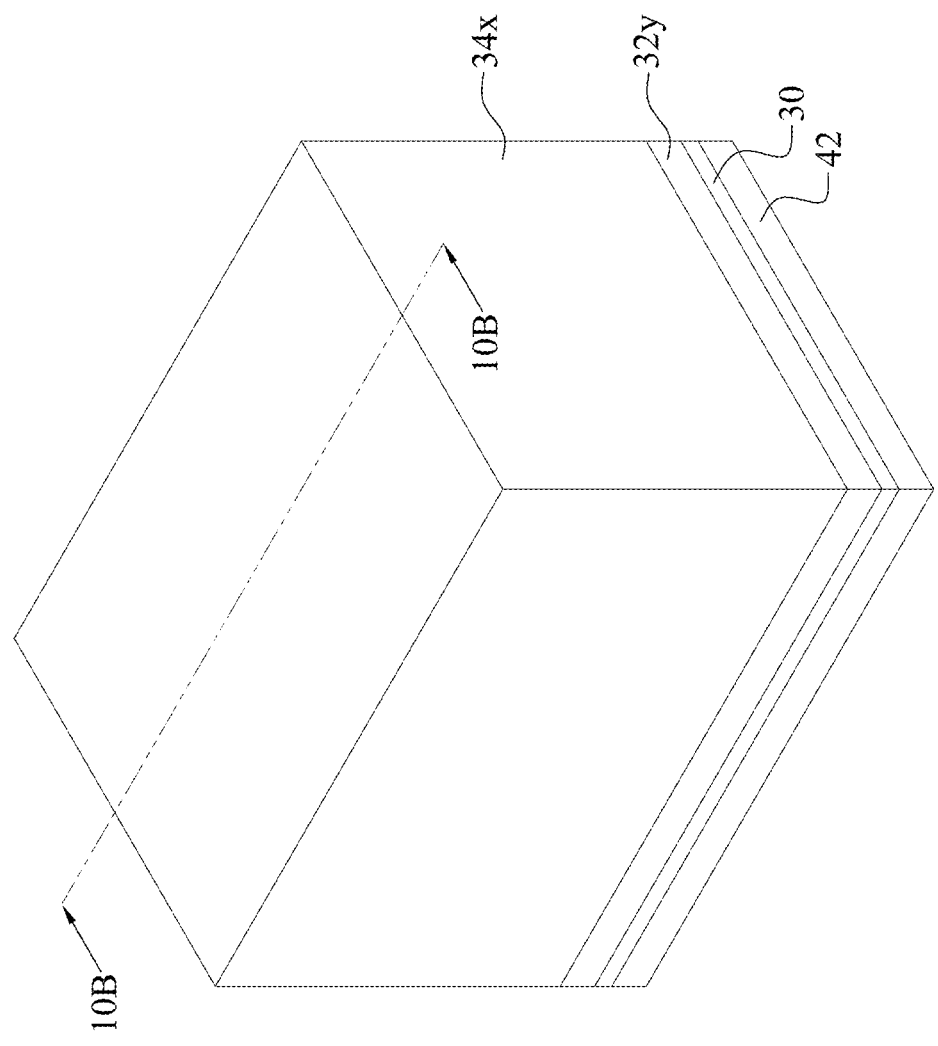
Figure 10B:
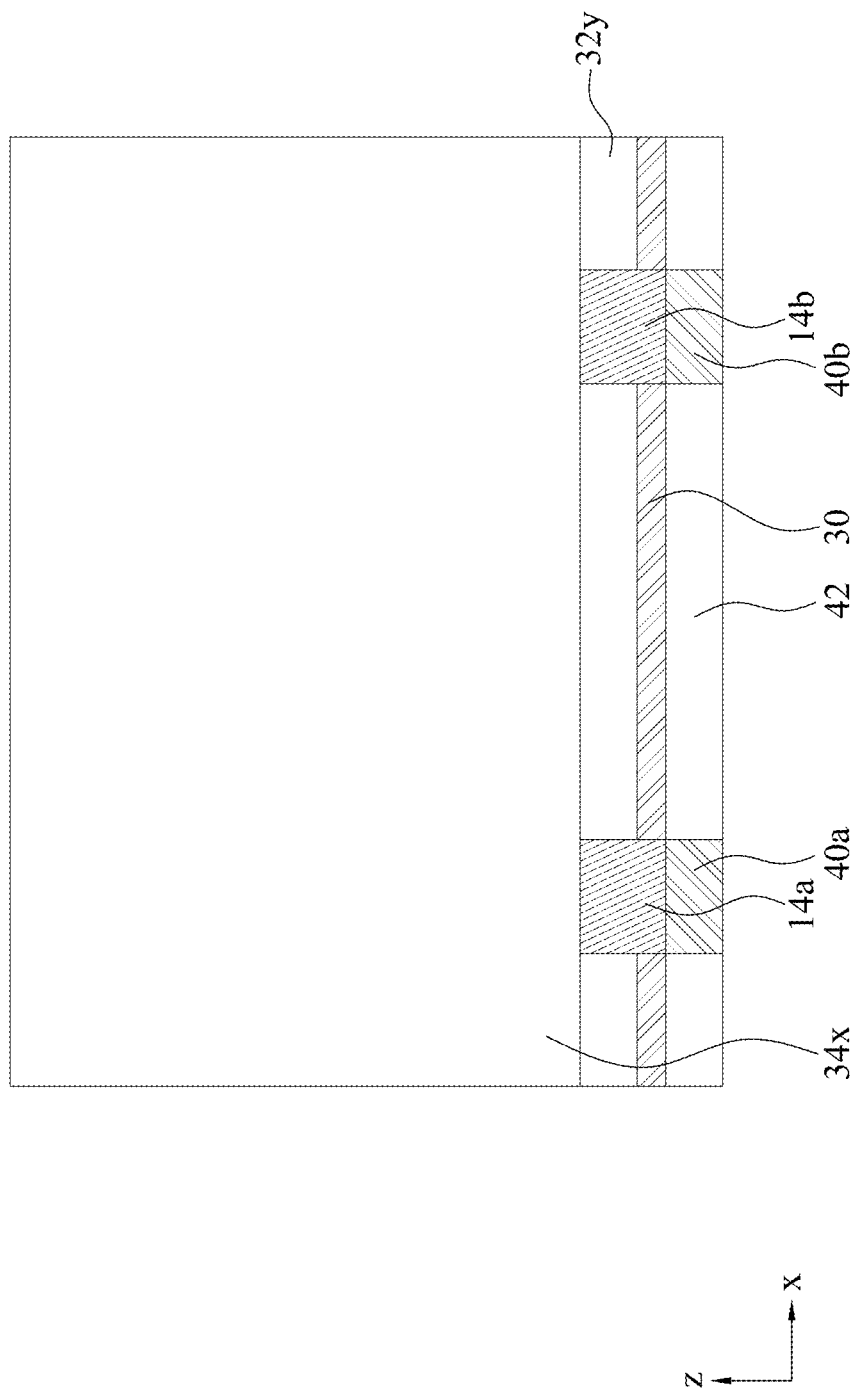

Refer to FIGS. 10A and 10B. A layer of dielectric material 34x may be formed (e.g., deposited) on or above the dielectric layer 32y and the source/drain regions 14a and 14b. The dielectric material 34x may provide electrical isolation and, e.g., moisture isolation. The thickness of the dielectric material 34x may be selected to any appropriate value. As mentioned earlier in the present disclosure, the features are not necessarily drawn to scale. Some of the illustrated features may be scaled for clarity of discussion.

Refer to FIGS. 11A and 11B. One or more portions of the dielectric material 34x may be removed (by, e.g., etching) to become the dielectric regions 34a and 34b. A trench 62 is shown to exist between dielectric regions 34a and 34b. The trench 62 may expose the etch stop layer 30 and the source/drain regions 14a and 14b.

As shown in FIG. 11B, the trench 62 has a width X and a height H. The width X may be between about 20 nanometers (nm) and about 90 nm, between about 30 nm and about 80 nm, between about 40 nm and about 70 nm, between about 30 nm and about 60 nm, or any other appropriate values. The height H may be less than about 100 nm, between about 10 nm and about 90 nm, between about 20 nm and about 80 nm, between about 30 nm and about 70 nm, between about 40 nm and about 60 nm, or any other appropriate values. The aspect ratio of the trench 62 may be any appropriate values. In an embodiment, the aspect ratio of the trench 62 may about unity.

Figure 12A:
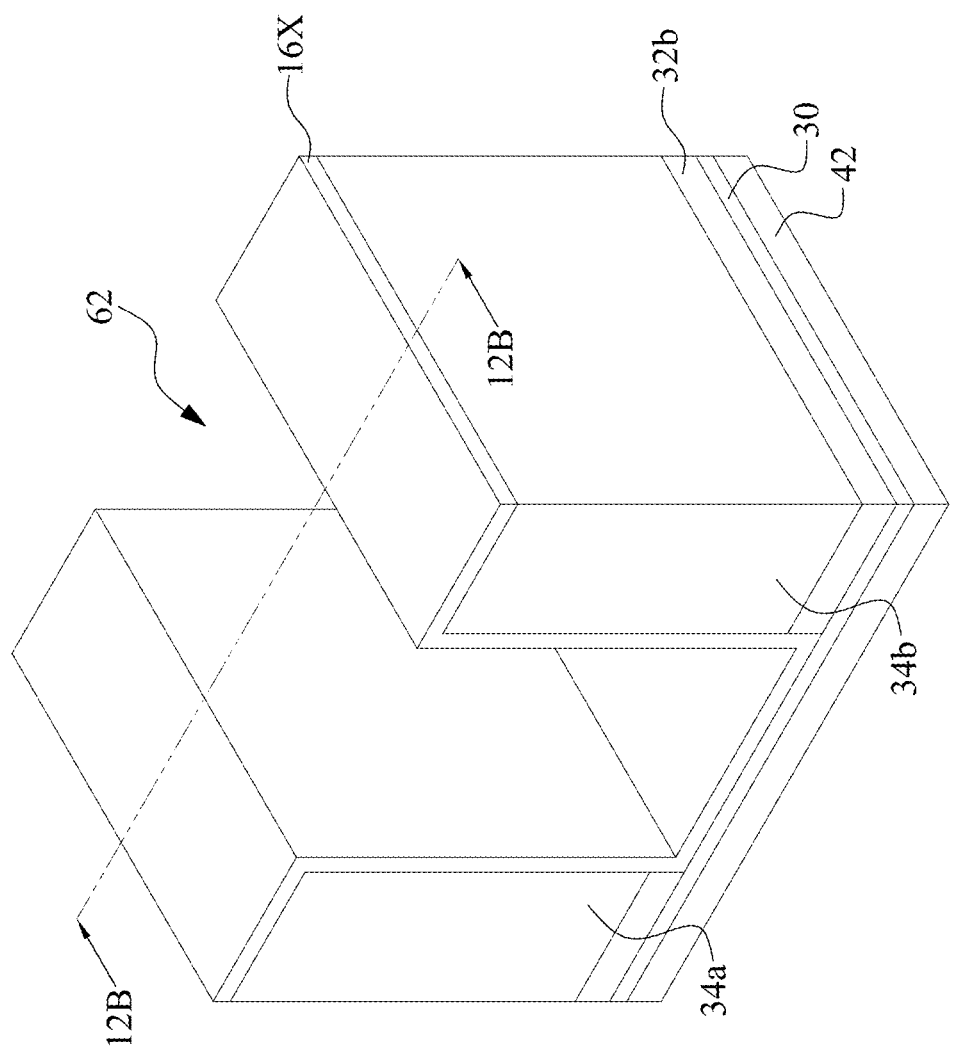
Figure 12B:
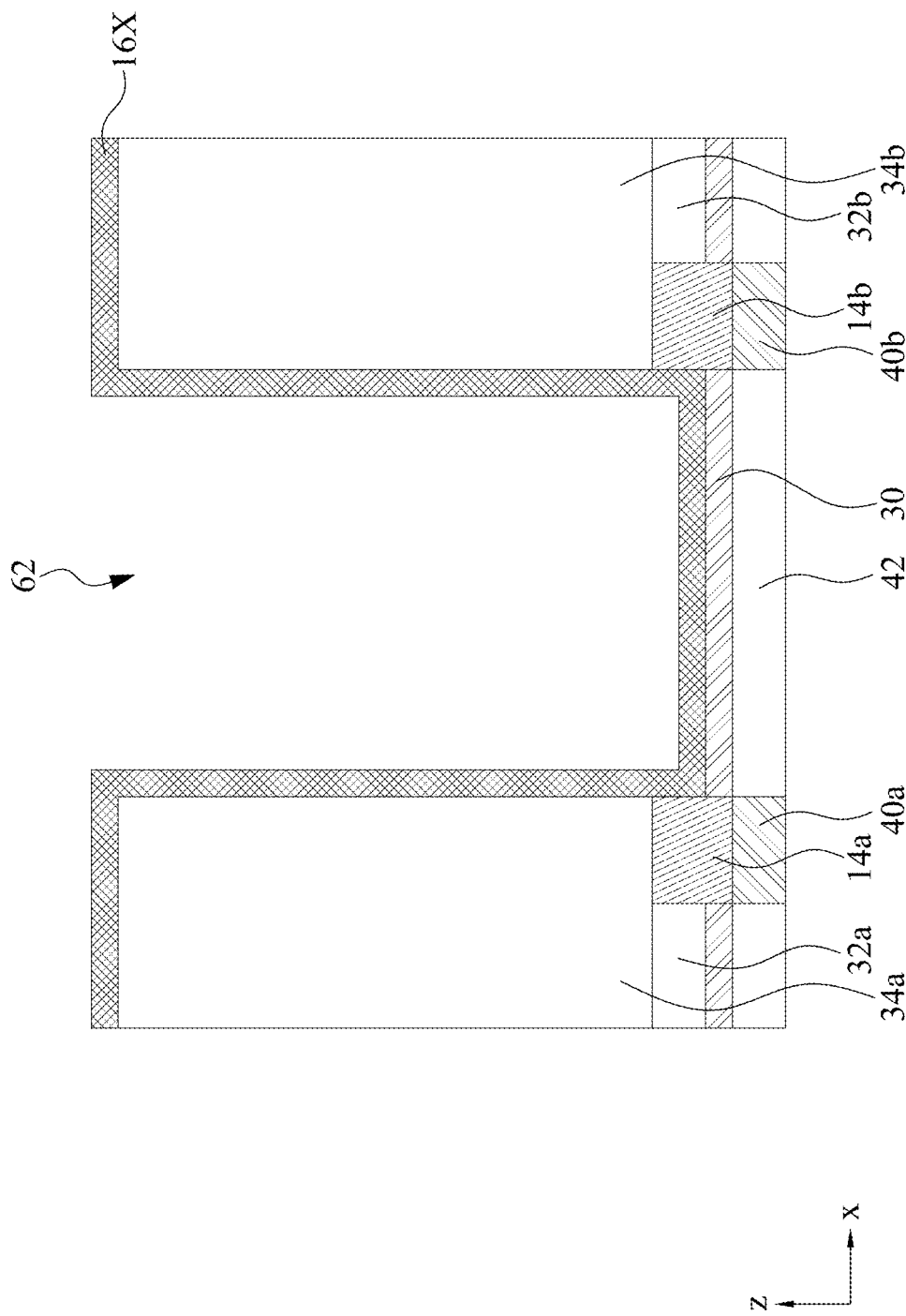

Refer to FIGS. 12A and 12B. A layer of channel material 16X may be formed (e.g., deposited) in the trench 62 and on or above the etch stop layer 30. The channel material 16X may be formed to come into contact with the source/drain regions 14a and 14b. The channel material 16X may include one or more oxide semiconductor materials. The oxide semiconductor materials may include ITO; IWO; IGZO; TiO; IxGyZzMO, where M includes at least one of Ti, Al, Ce or Sn, in which x, y and z are each greater than 0 and less than 1; their compounds; and any appropriate combinations of them. The channel material 16X may be formed by atomic layer deposition (ALD). ALD may help achieve high levels of conformality over 3D structures while also preserving the quality of the material, i.e., its composition. The thickness of the channel material 16X may be between about 3 nm and about 20 nm, between about 5 nm and about 15 nm, between about 7 nm and about 12 nm, or may be in other appropriate ranges. Reducing the thickness of the channel material 16X may help scale down the transistor structure that includes the channel material 16X and thus contribute to a higher density of transistors.

Figure 13A:
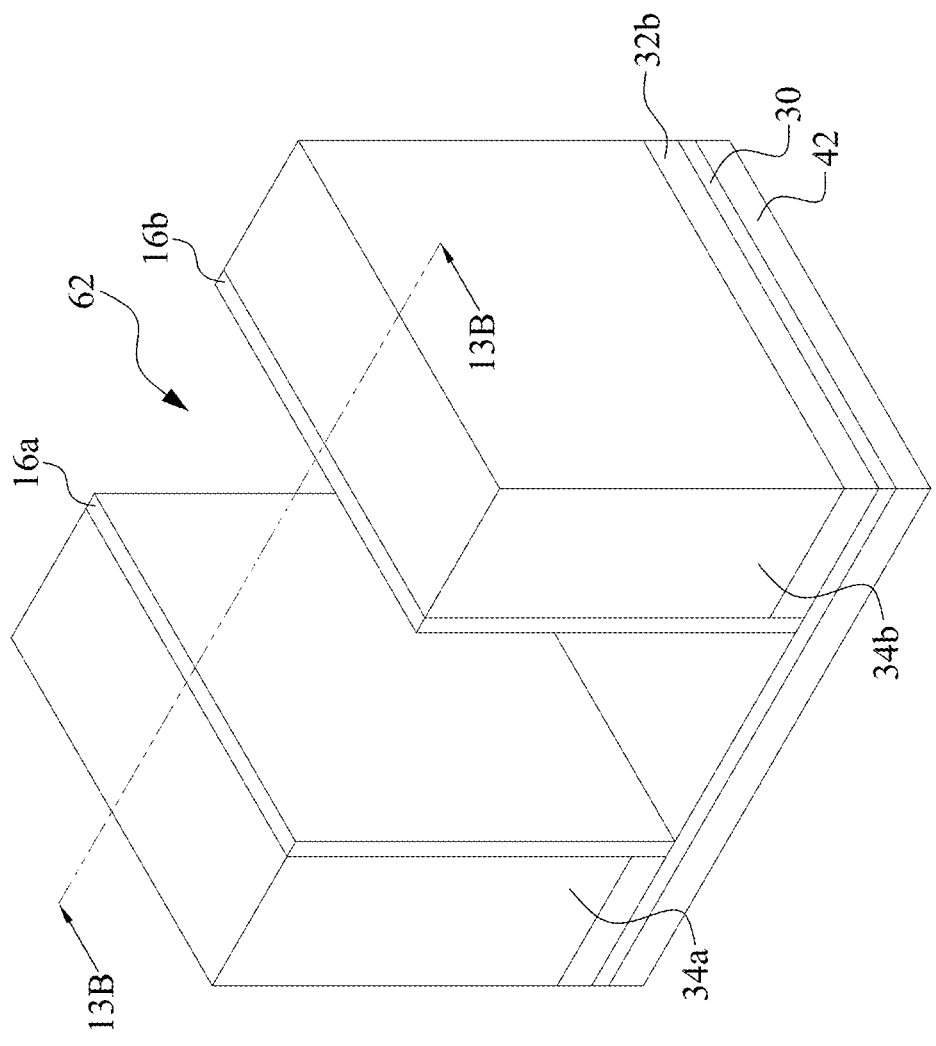
Figure 13B:
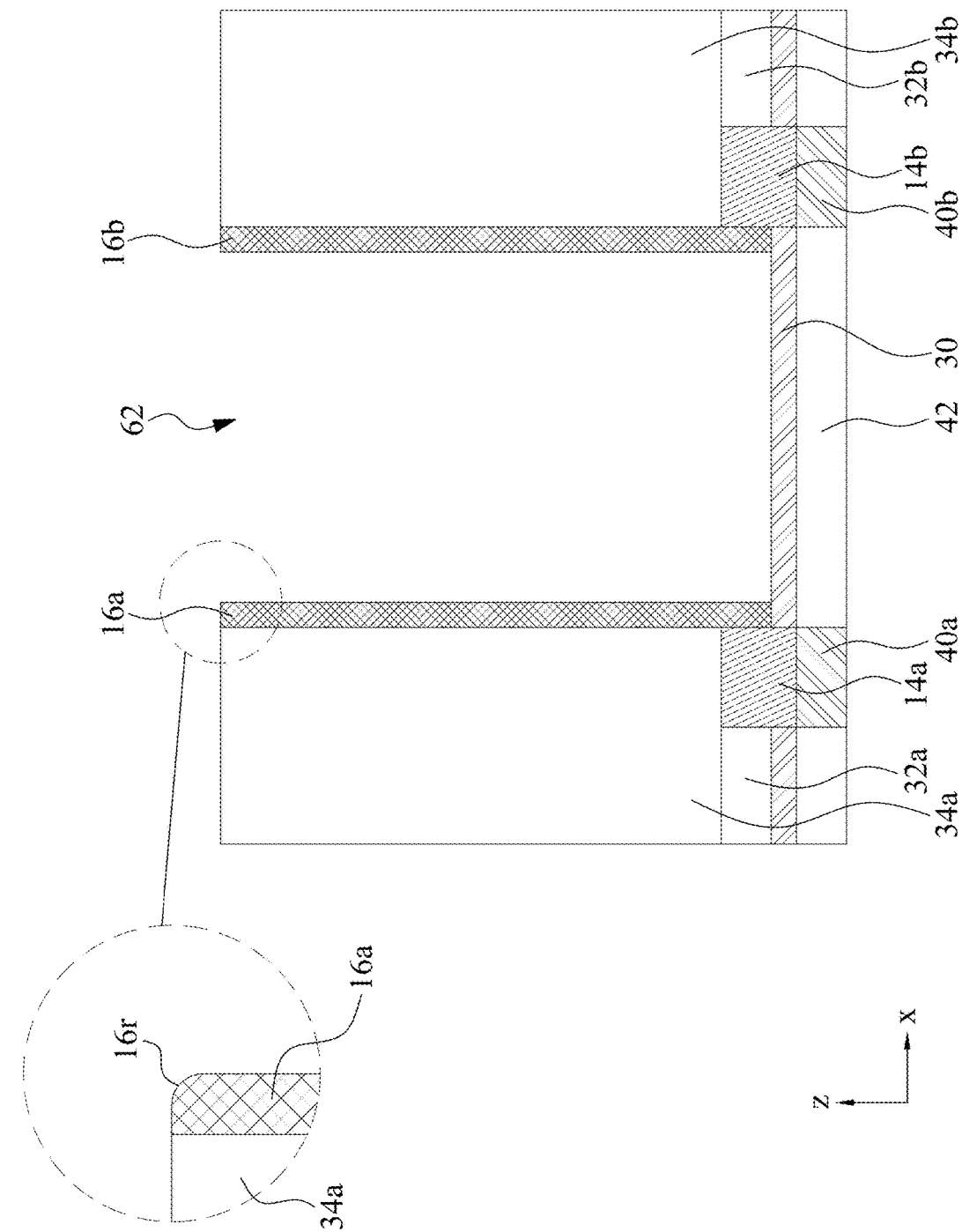

Refer to FIGS. 13A and 13B. One or more portions of the channel material 16X may be removed (by, e.g., etching) to become the channel regions 16a and 16b and to expose the dielectric regions 34a and 34b. The removal may be performed by anisotropic etching. In an embodiment, the portion(s) of the channel material 16X not within the trench 62 may be removed.

The etch stop layer 30 may be resistant to the etchant for etching the channel material 16X, thereby protecting the regions below the etch stop layer 30 (such as the dielectric layer 42), which may not necessarily be resistant to the etchant for etching the channel material 16X. The etch stop layer 30 may increase the flexibility in selecting the etchant(s) to etch the channel material 16X.

In an embodiment, the anisotropic etching of the channel material 16X may cause a corner 16r of the channel region 16a to become curvilinear. The curvilinear corner may also exhibit in the channel region 16b.

In an embodiment, the portion of the channel material 16X at the bottom of the trench 62 is removed, and the portion covering an X-Y surface of the dielectric regions 34a and 34b is not. The unremoved portion may be removed subsequently by other measures such as planarization.

Figure 14A:
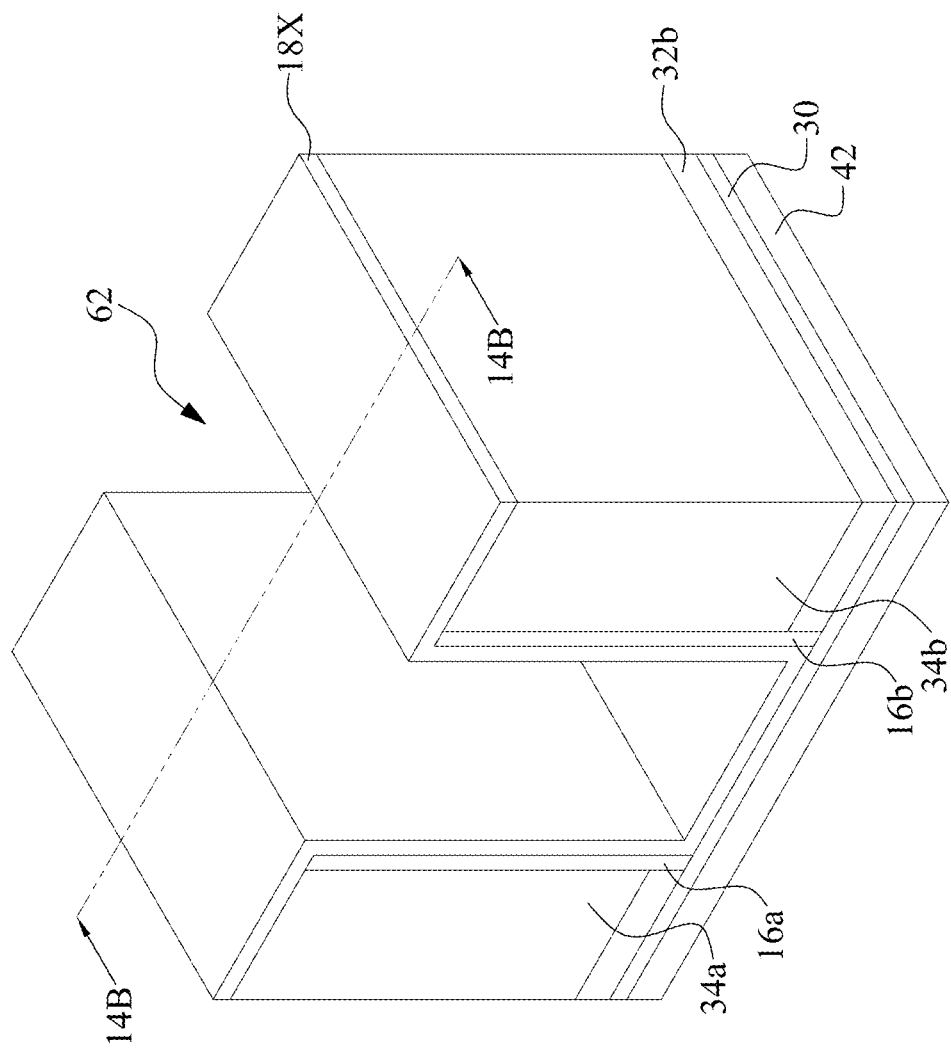
Figure 14B:
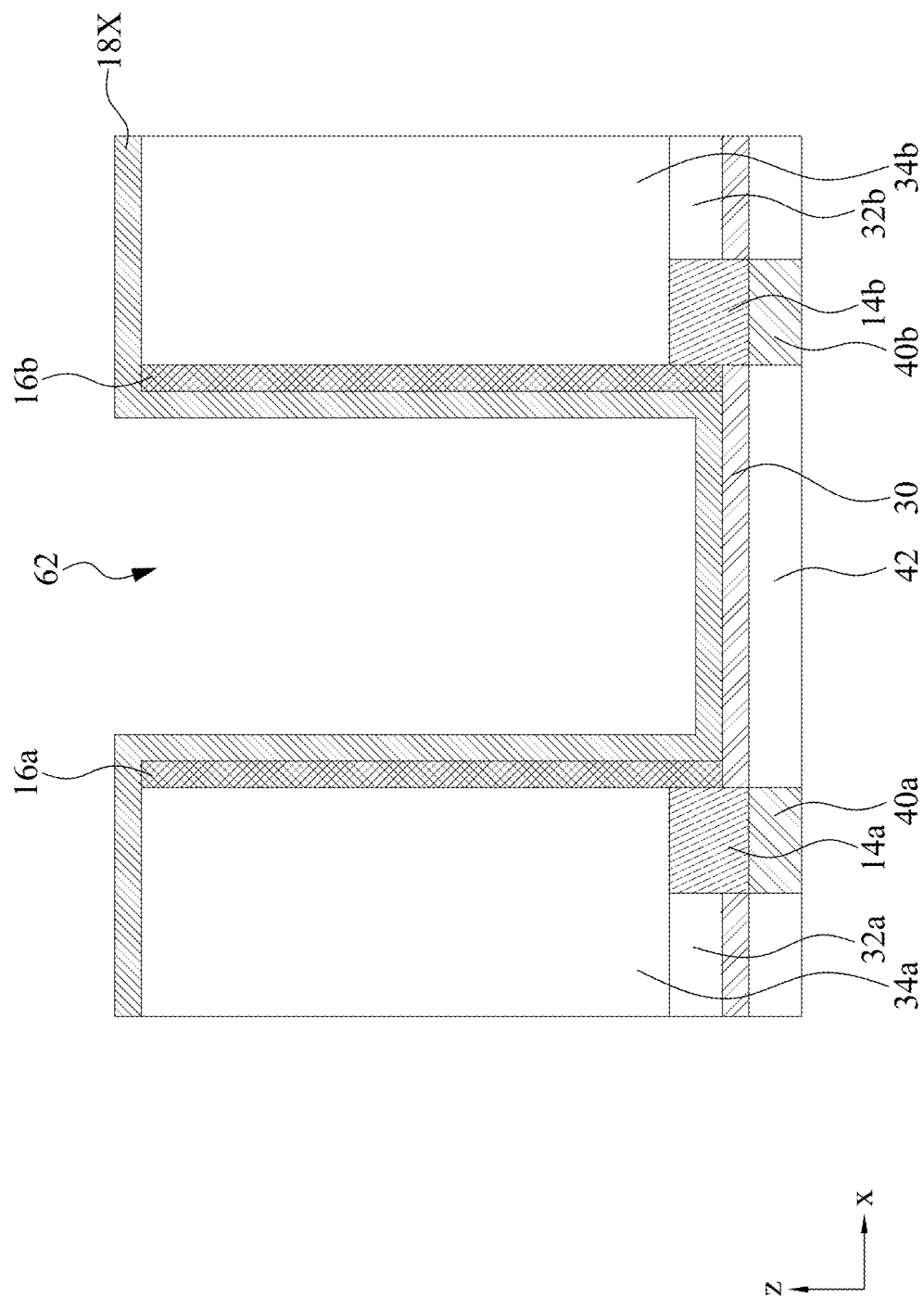

Refer to FIGS. 14A and 14B. A layer of gate dielectric material 18X may be formed (e.g., deposited) in the trench 62, on or above the etch stop layer 30, and/or to cover the channel regions 16a and 16b. The gate dielectric material 18X may be formed to come into contact with the channel regions 16a and 16b. The gate dielectric material 18X may include oxides and/or high-k materials. The gate dielectric material 18X may include $AlO_x$, $HfO_x$, HfLaO, HfSiO, LaO, other suitable materials and their compounds, and any appropriate combinations of them.

In an embodiment, the gate dielectric material 18X is formed immediately after the channel regions 16a and 16b are formed. In an embodiment, the surface of the channel regions 16a and 16b facing the gate dielectric material 18X may be treated. Surface treatments can include oxygen or $N_2O$ annealing, doping with fluorine (Cl), or oxygen plasma treatment. The temperatures for these treatments may range from room temperature (plasma) to the BEOL thermal budget limiting temperature of about 400° C.

Figure 15A:
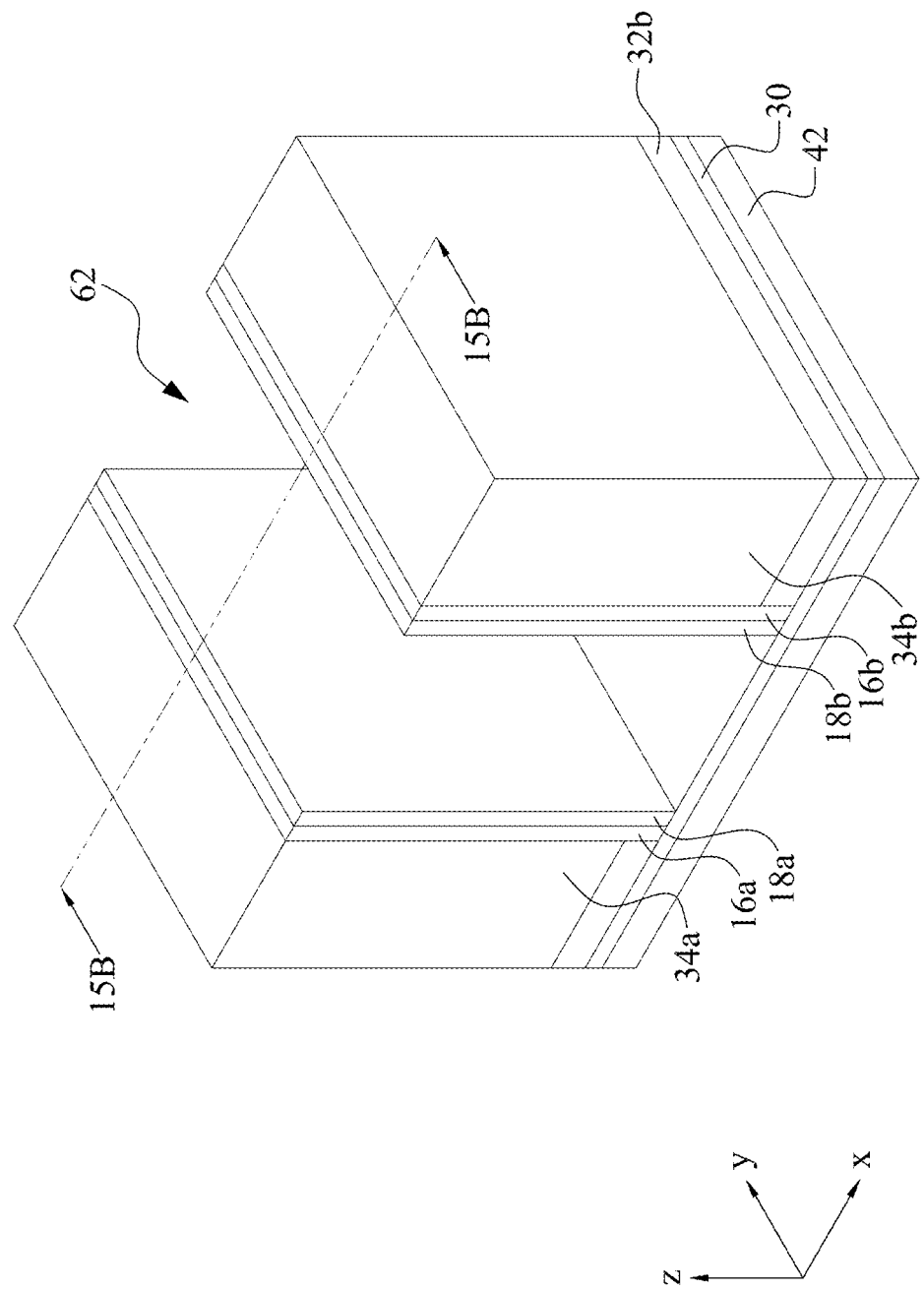
Figure 15B:
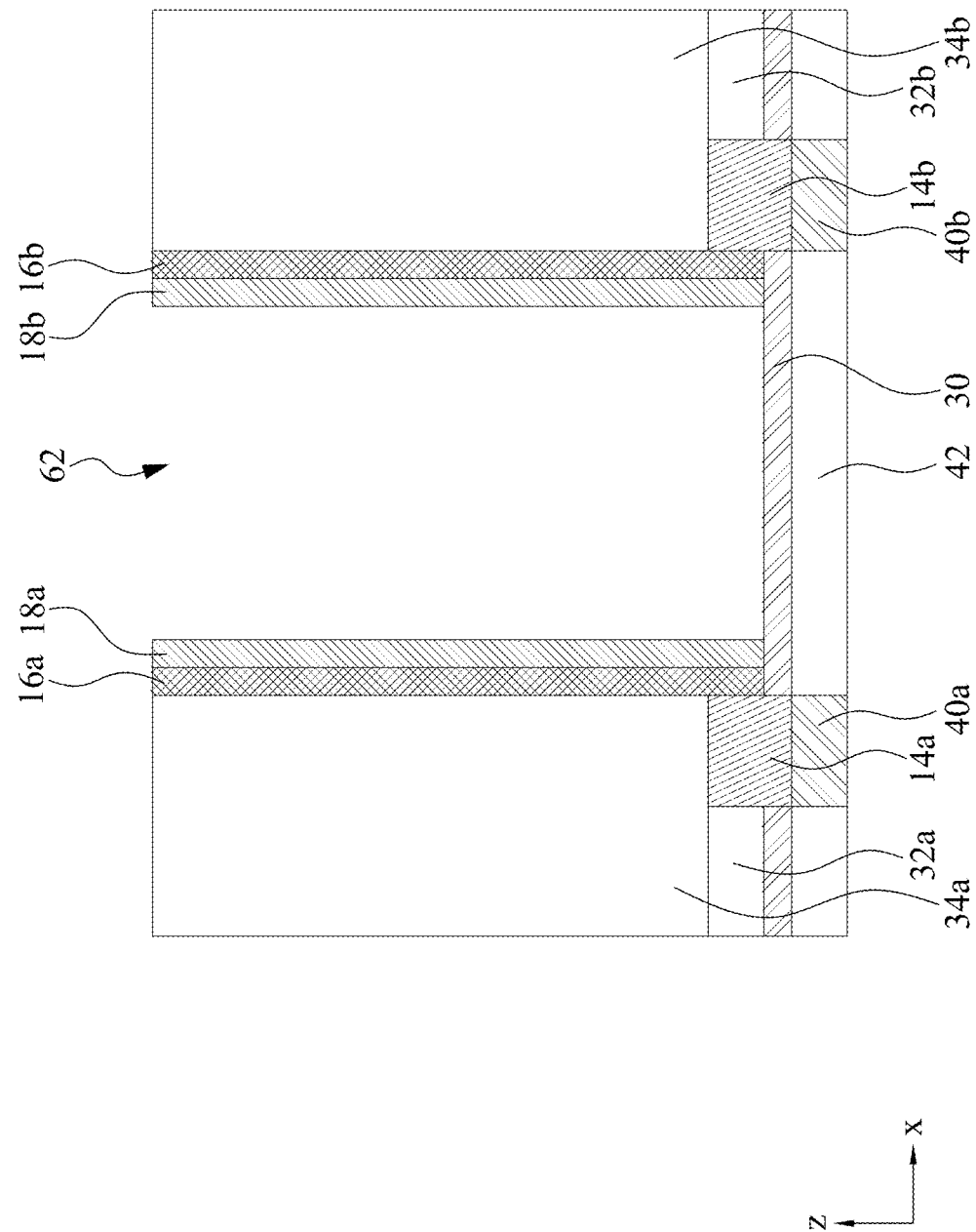

Refer to FIGS. 15A and 15B. One or more portions of the gate dielectric material 18X may be removed (by, e.g., etching) to become the gate dielectric regions 18a and 18b and to expose the dielectric regions 34a and 34b and/or the etch stop layer 30. The removal may be performed by anisotropic etching. In an embodiment, the portion(s) of the gate dielectric material 18X not within the trench 62 may be removed.

Figure 16A:
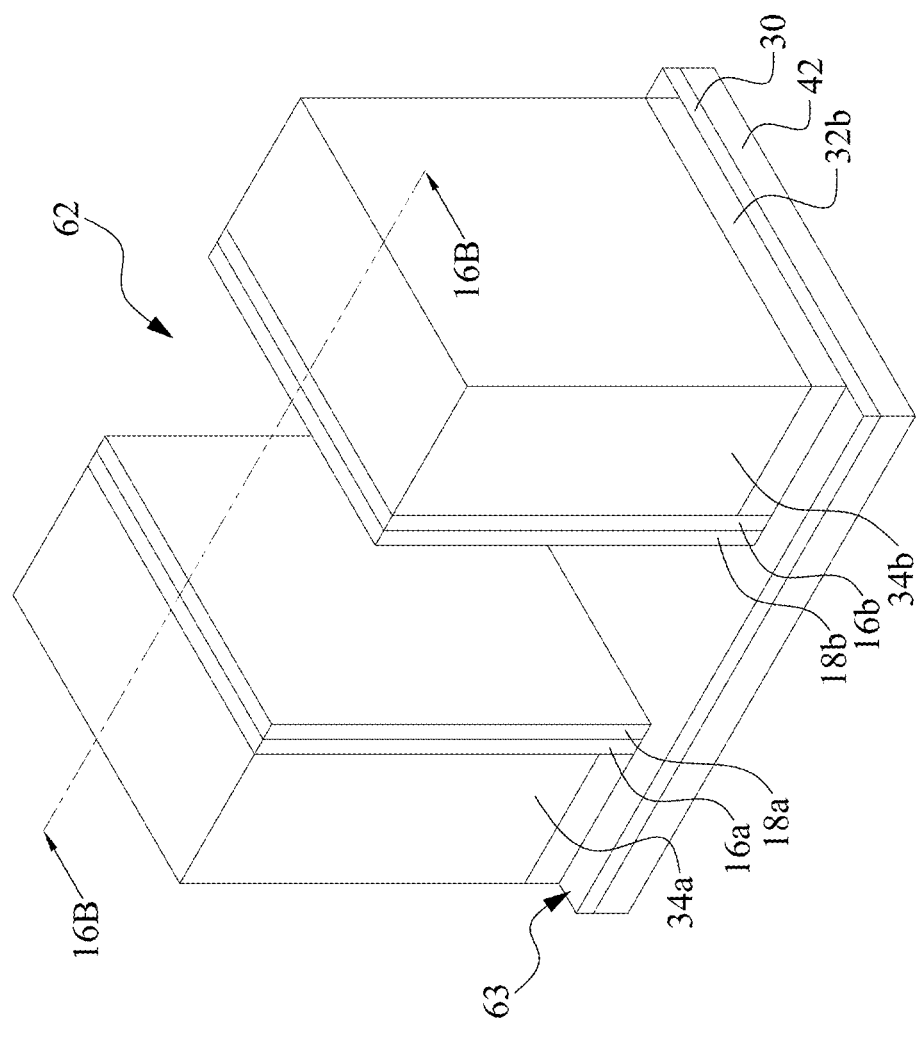

Refer to FIGS. 16A, 16B, and 16C. One or more portions of the dielectric regions 34a and 34b, the dielectric regions 32a and 32b, the channel regions 16a and 16b, and the gate dielectric regions 18a and 18b may be removed (by, e.g., etching). Recesses 63 may be formed as a result. As exemplarily shown in the side view illustrated in FIG. 16C, the recesses 63 may be viewed as a result of making two "slicing" cuts.

If an array of the intermediary structures shown in FIGS. 2A-15B is formed, the recesses 63 may also be viewed as trenches between these structures. In such an embodiment, the recesses 63 may reserve the space for future introduction of dielectric materials. Such dielectric materials may improve the isolation between the channel regions 16a and 16b and the channel regions in neighboring transistor structure in the array.

Figure 17A:
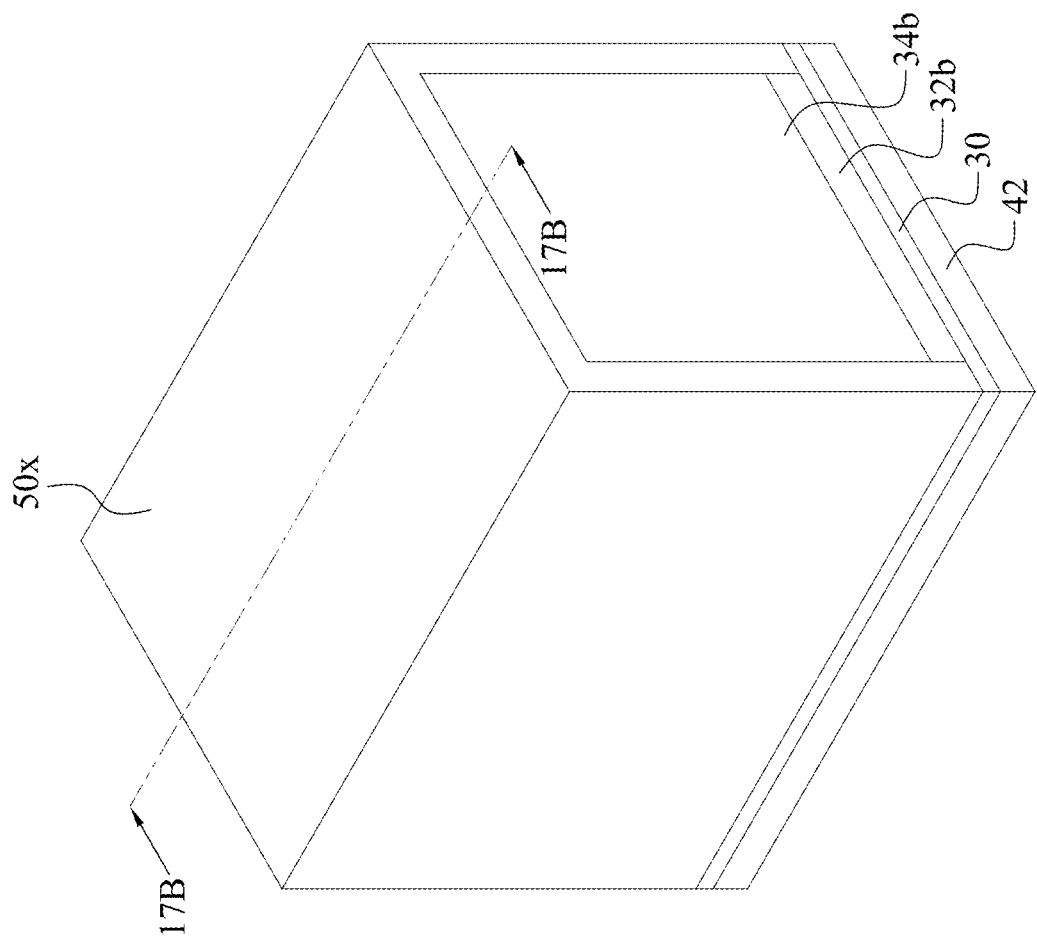
Figure 17B:
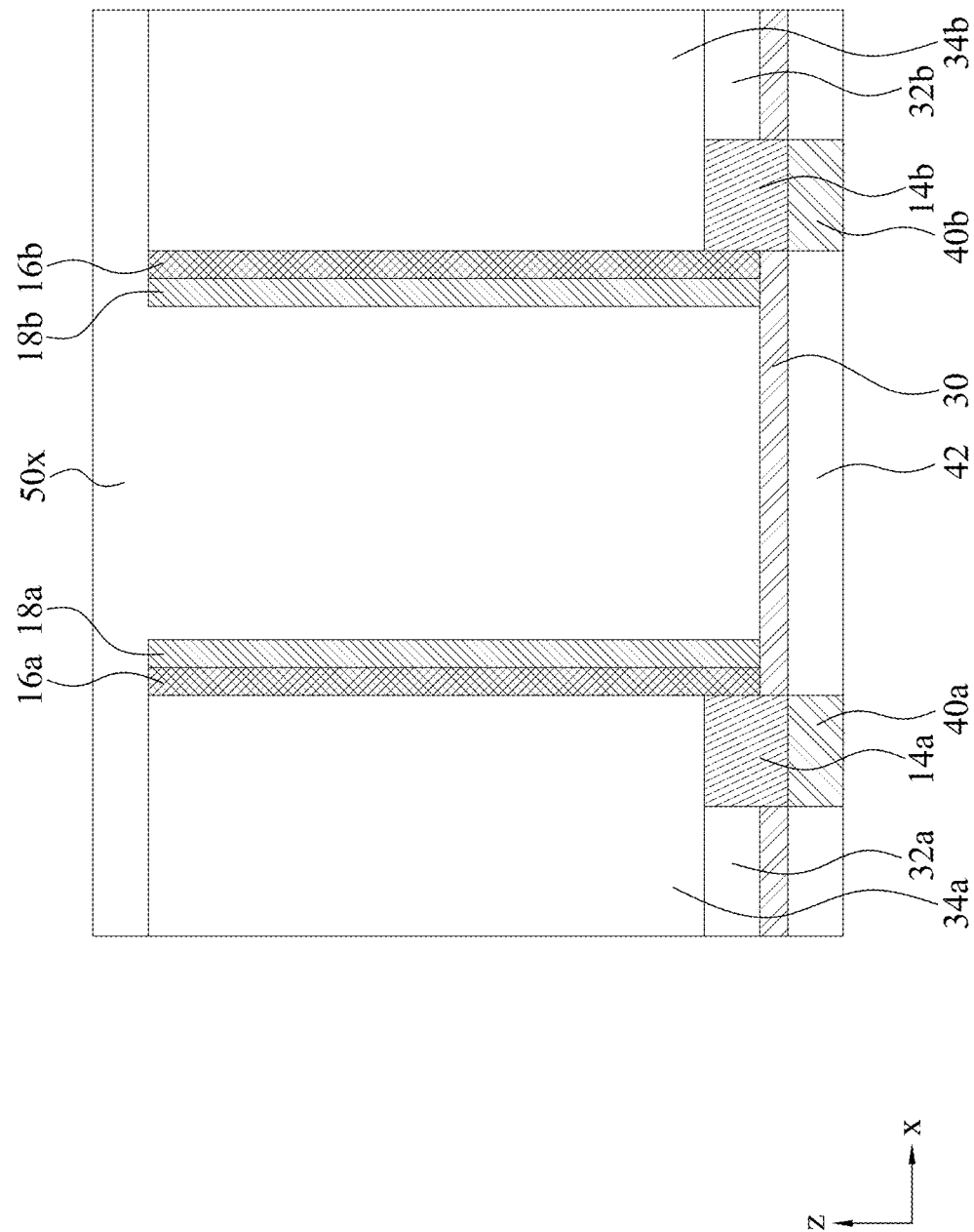
Figure 17C:
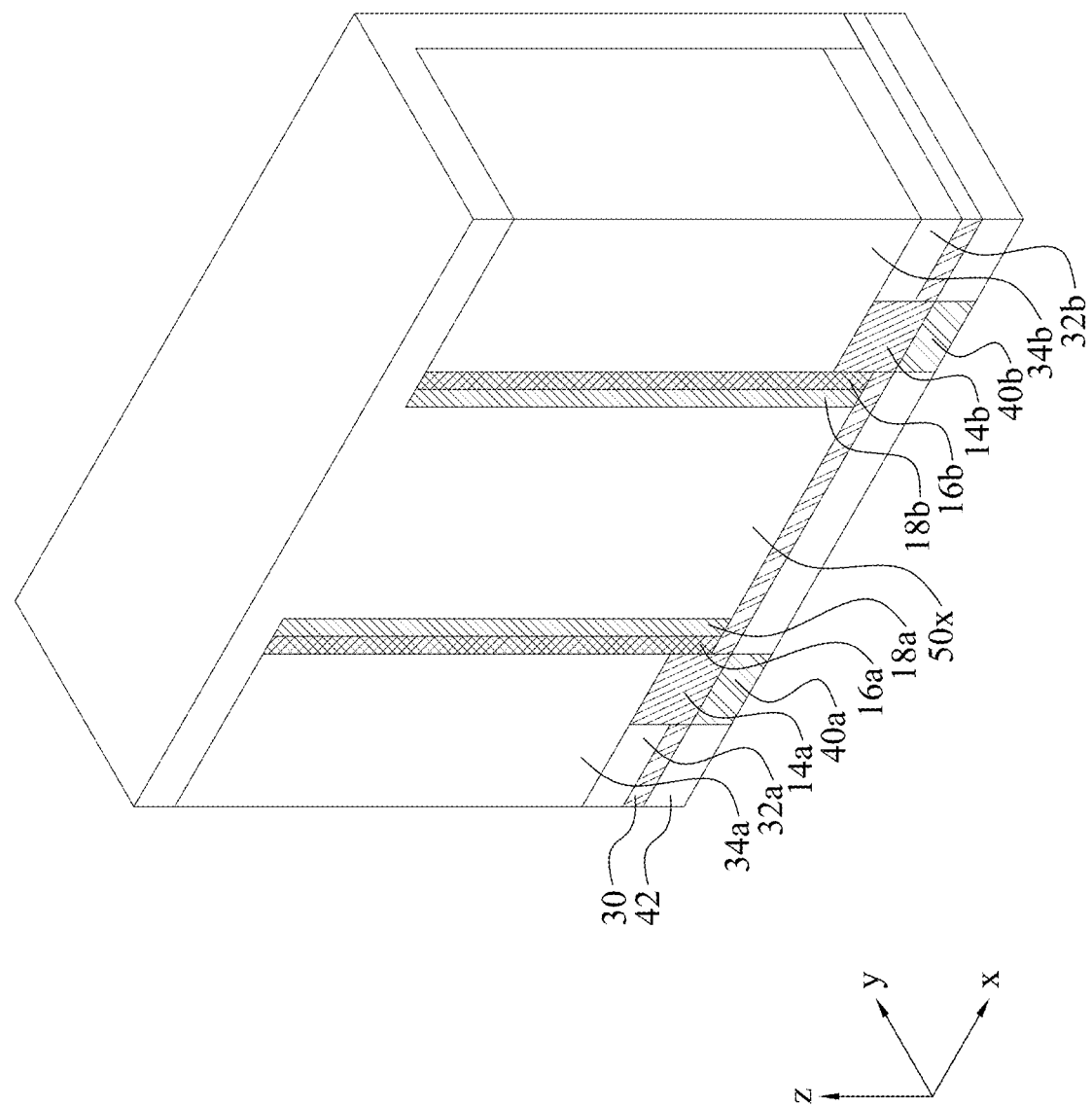

Refer to FIGS. 17A, 17B and 17C. A layer of dielectric material 50x may be formed (e.g., deposited). The dielectric material 50x may cover the etch stop layer 30, the dielectric regions 32a and 32b, the dielectric regions 34a and 34b, the channel regions 16a and 16b, and/or the gate dielectric regions 18a and 18b. The dielectric material 50x may fill the trench 62. FIG. 17C is an exemplary perspective view of along the cutline 17B-17B to better illustrate the possible location of the dielectric material 50x and its spatial relationship with the other structural features.

Figure 18A:
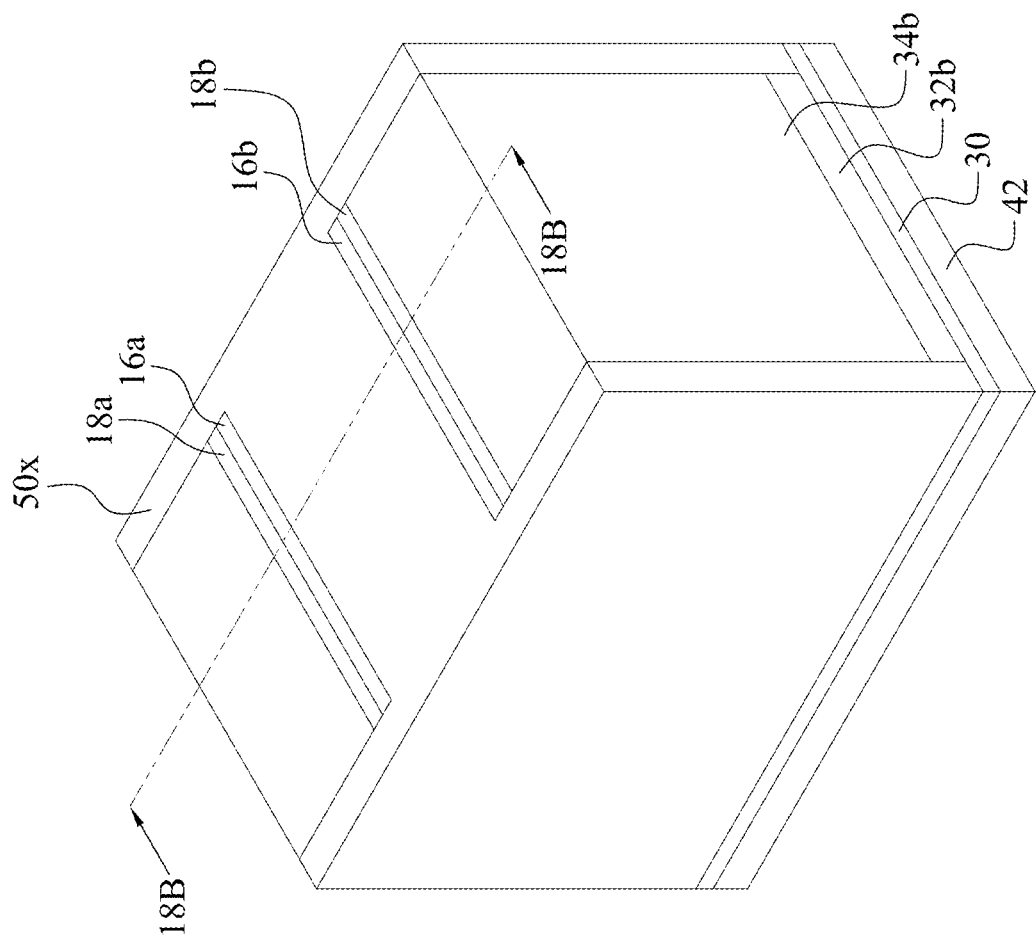
Figure 18B:
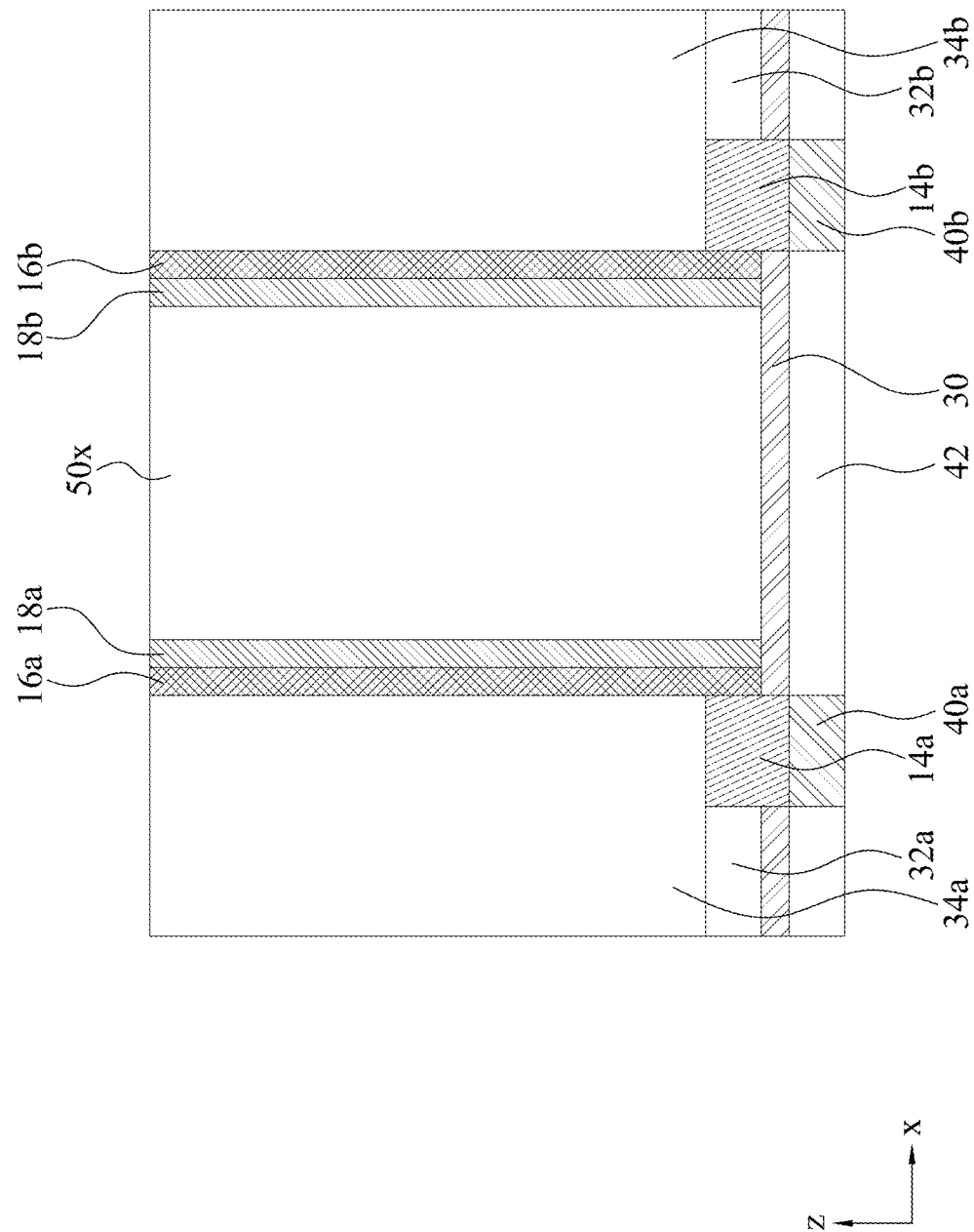
Figure 18C:
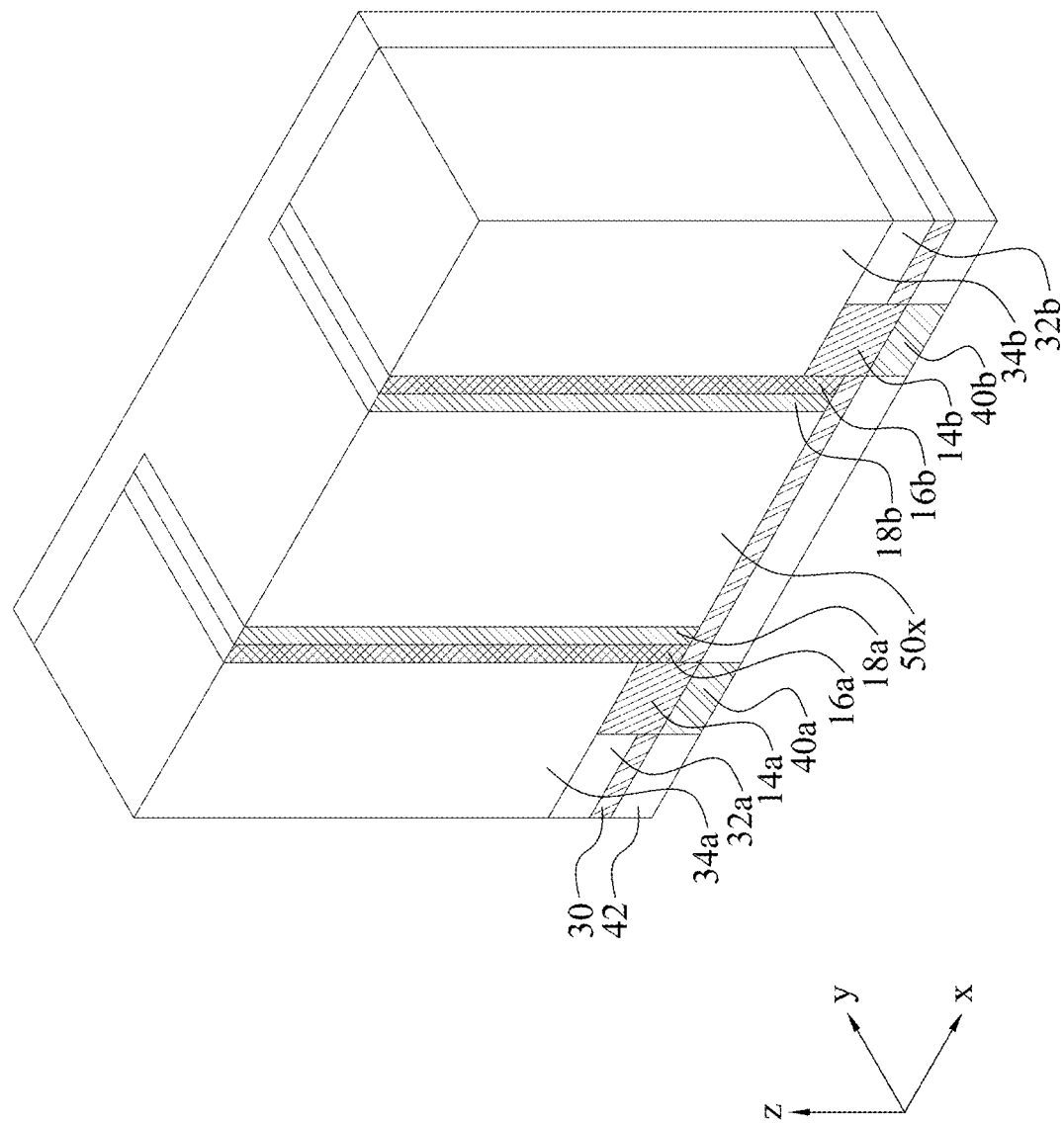

Refer to FIGS. 18A, 18B and 18C. A portion of the dielectric material 50x may be removed (e.g., by CMP) to expose the dielectric regions 32a and 32b, the channel regions 16a and 16b, and the gate dielectric regions 18a and 18b. A portion of the exposed structures may also have been removed by the CMP process. FIG. 18C is an exemplary perspective view of along the cutline 18B-18B to better illustrate the consequence of this removal step.

Figure 19A:
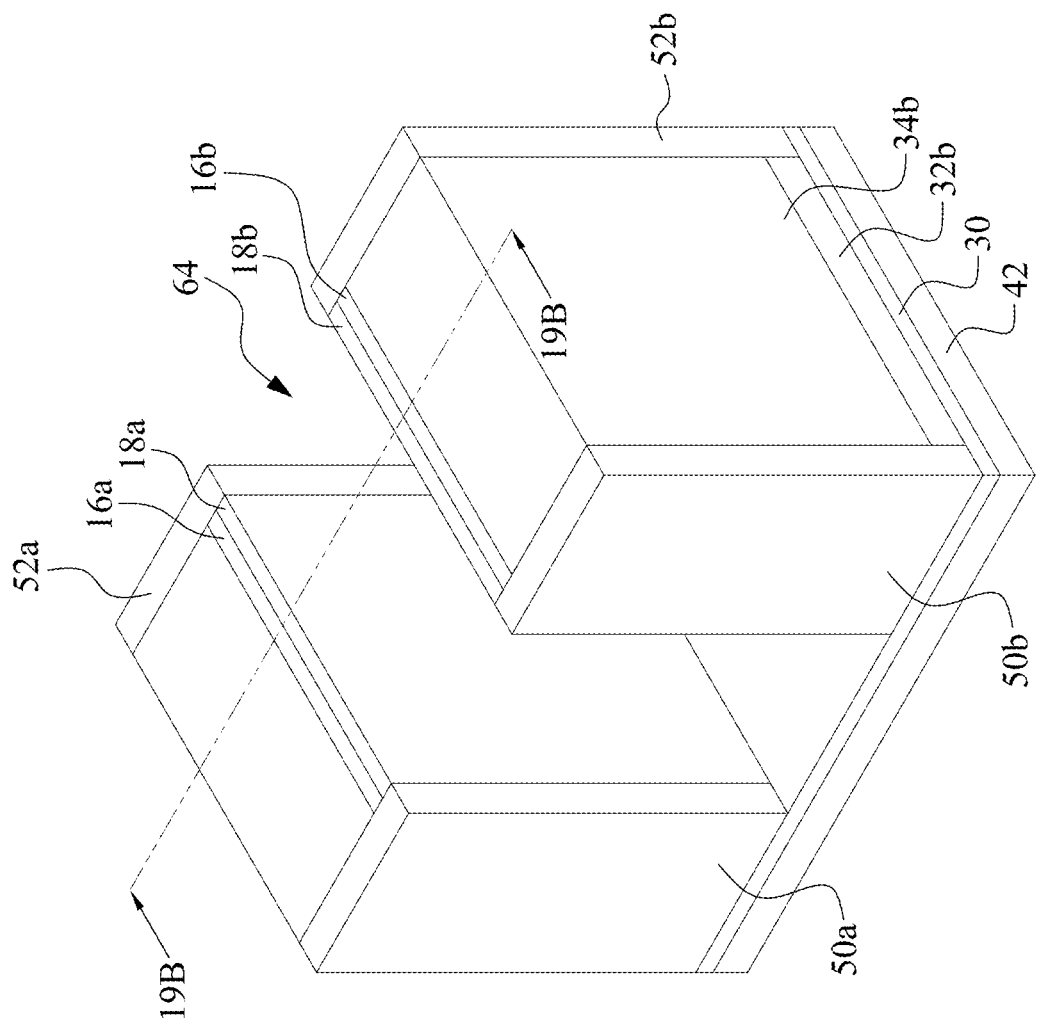
Figure 19B:
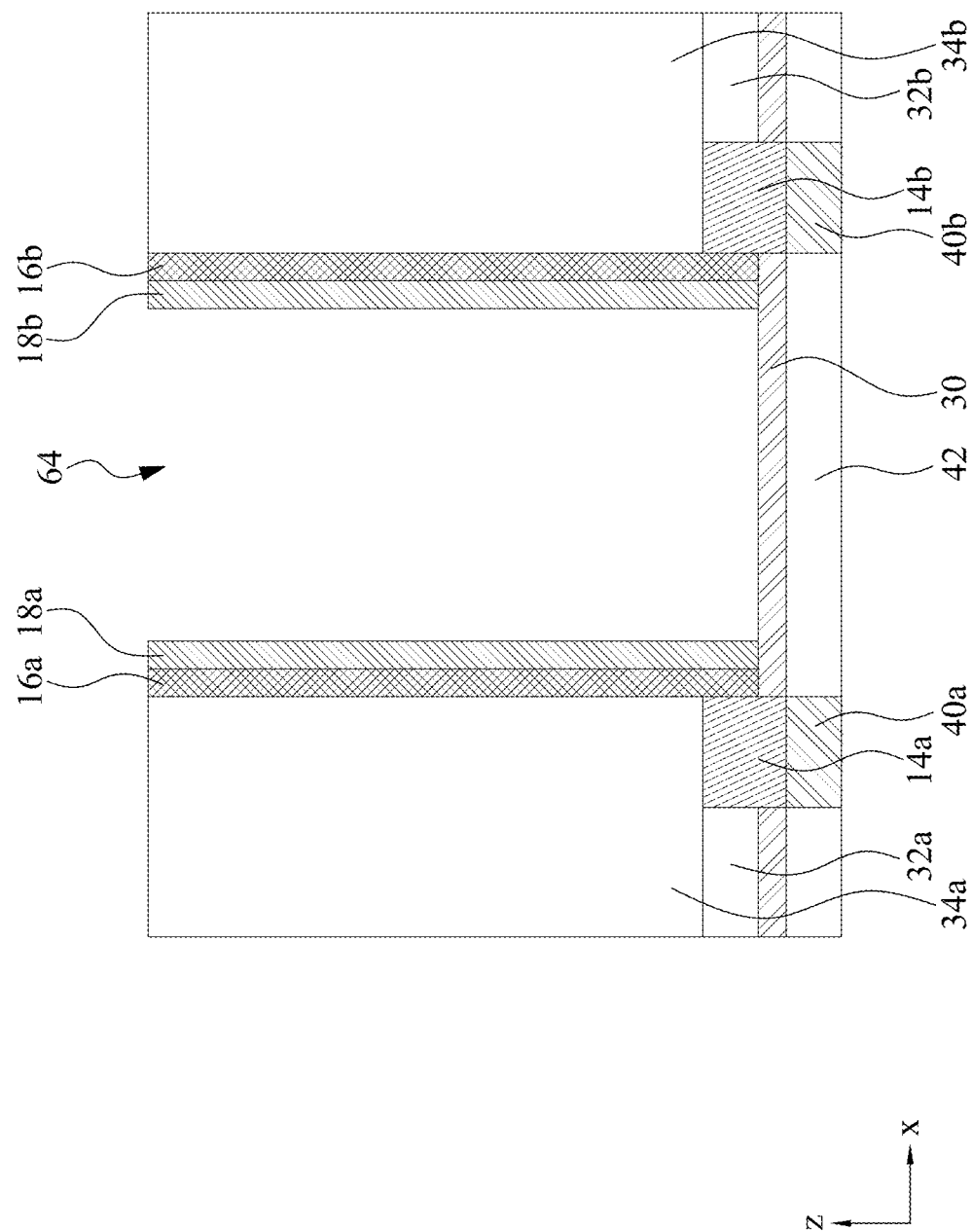

Refer to FIGS. 19A and 19B. One or more portions of the dielectric material 50x may be removed (by, e.g., etching) to form a trench 64. The trench 64 may expose the etch stop layer 30 and the gate dielectric regions 18a and 18b.

Figure 20A:
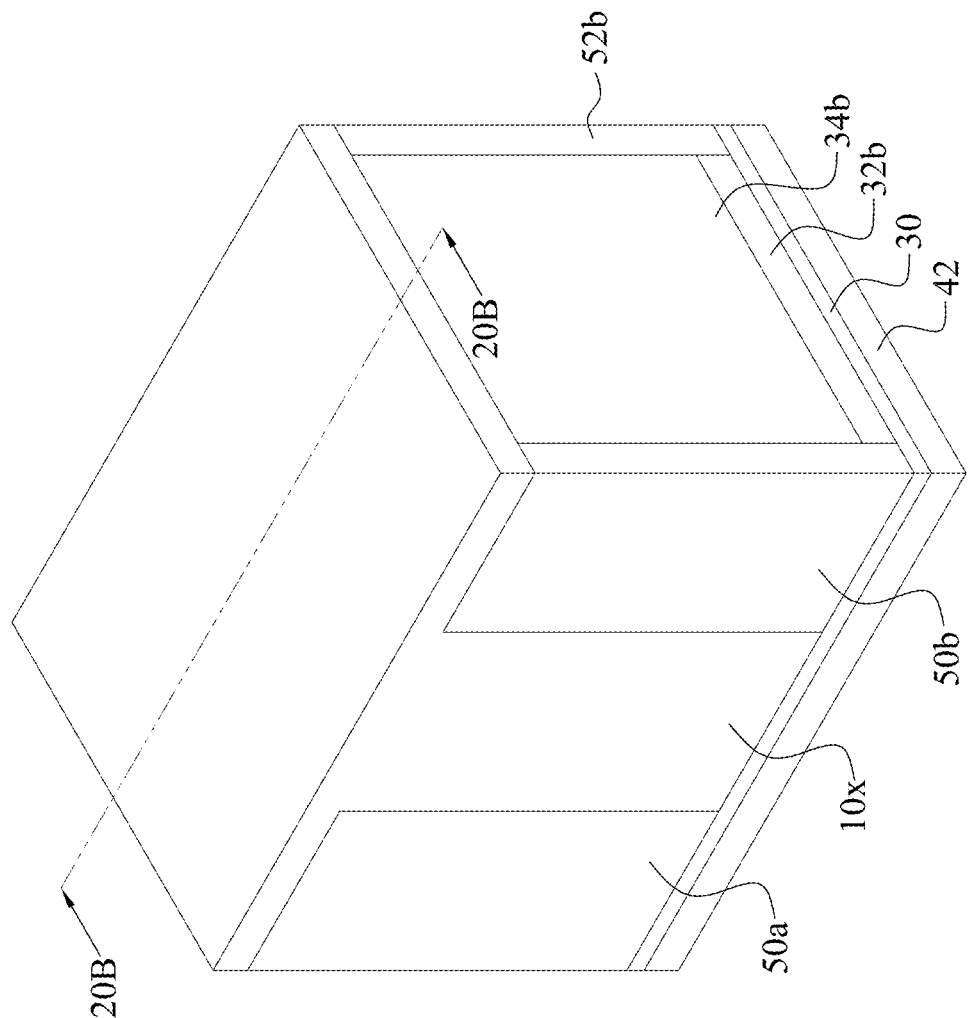

Refer to FIGS. 20A and 20B. A layer of gate material 10x may be formed (e.g., deposited) to fill the trench 64 shown in FIGS. 19A and 19B. The gate material 10x may include TiN, W, Mo, other suitable materials, their compounds and/or alloys, and any appropriate combinations of them.

Figure 21A:
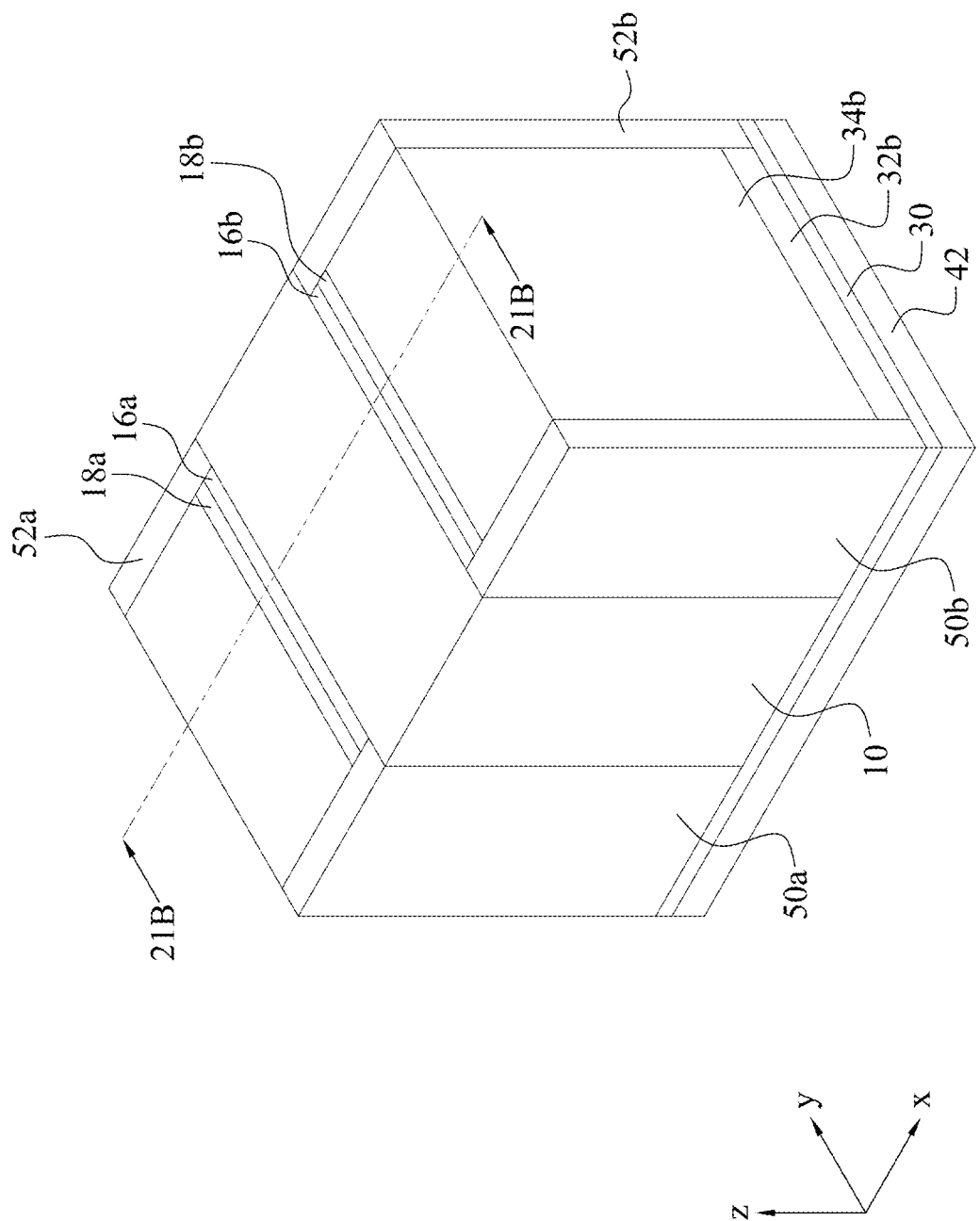
Figure 21B:
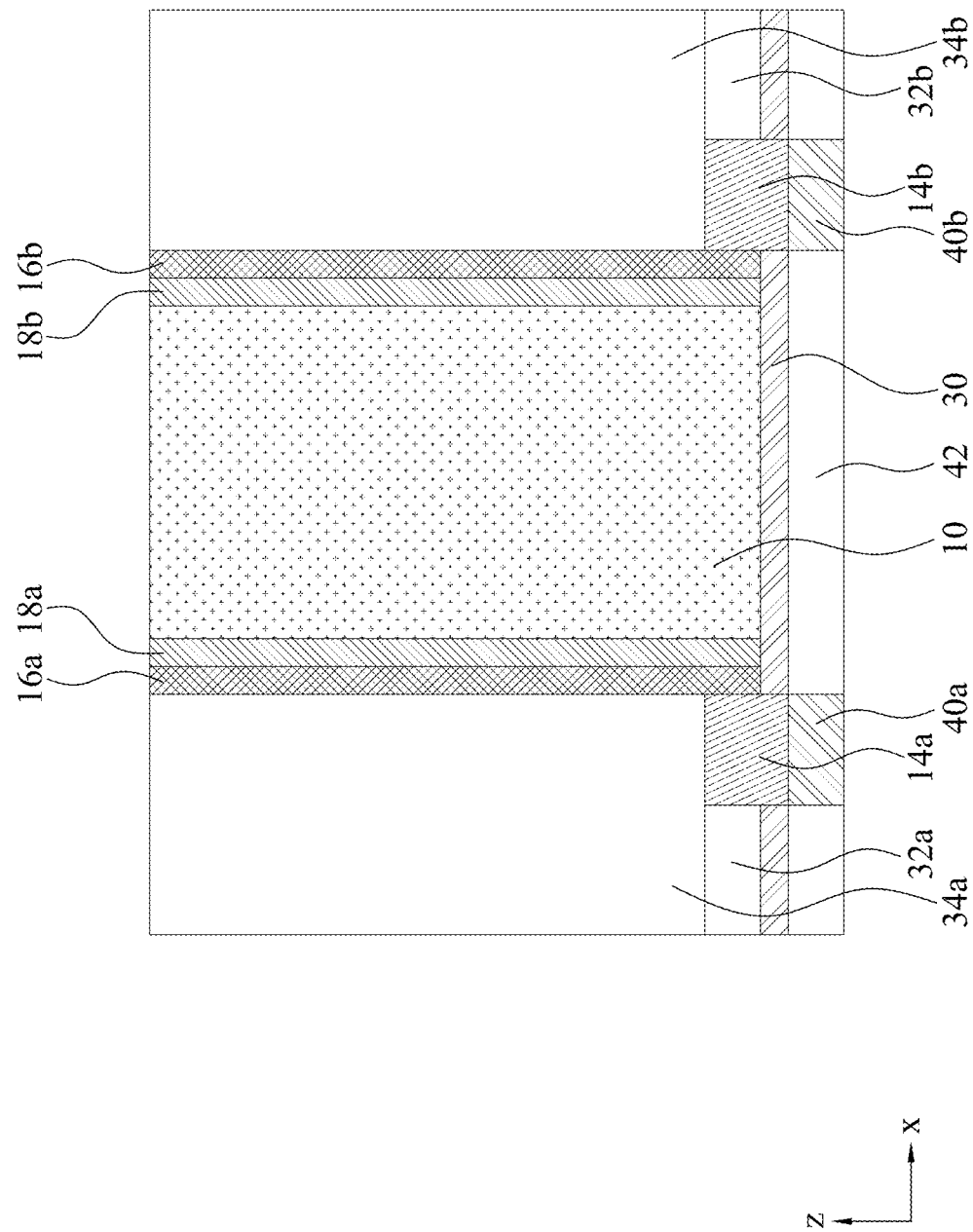

Refer to FIGS. 21A and 21B. A portion of the gate material 10x may be removed (e.g., by CMP) to expose the dielectric regions 34a, 34b, 50a, 50b, 52a and 52b, the channel regions 16a and 16b, and the gate dielectric regions 18a and 18b. The removal of the gate material 10x may create a gate region 10.

Figure 22A:
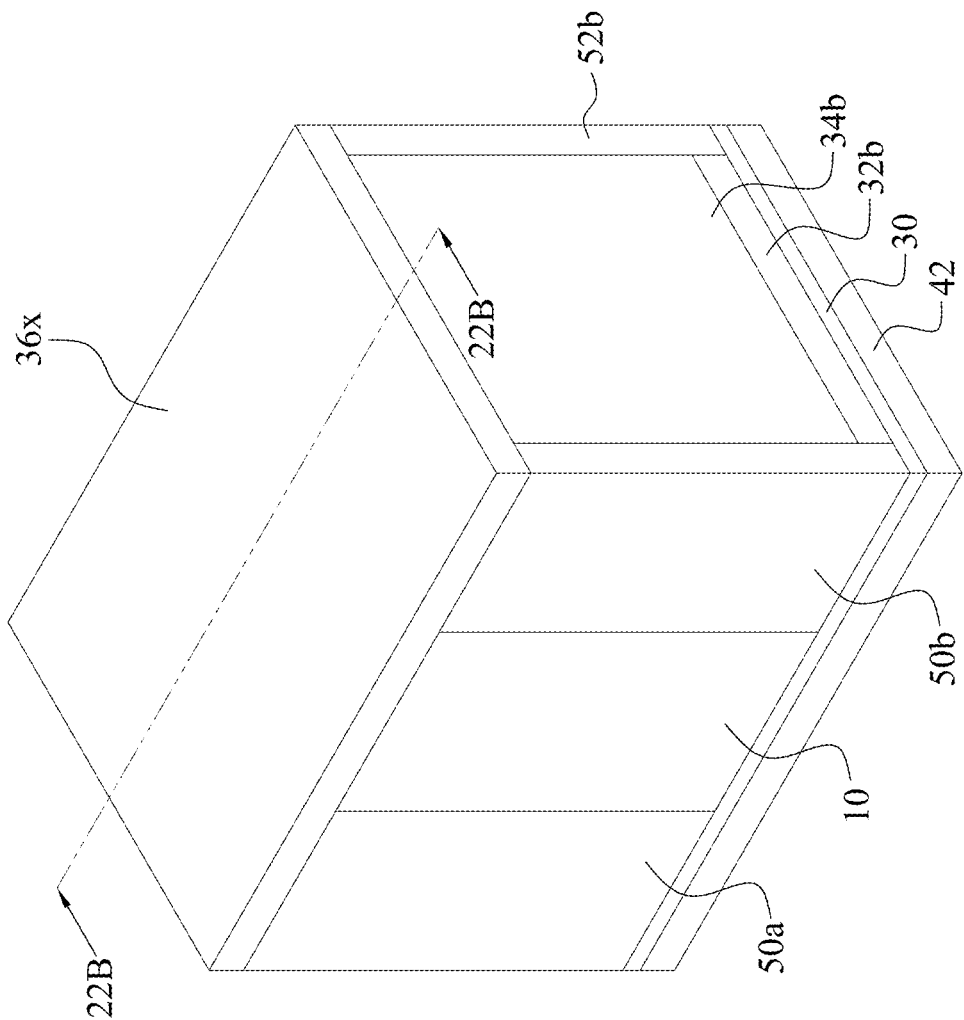
Figure 22B:
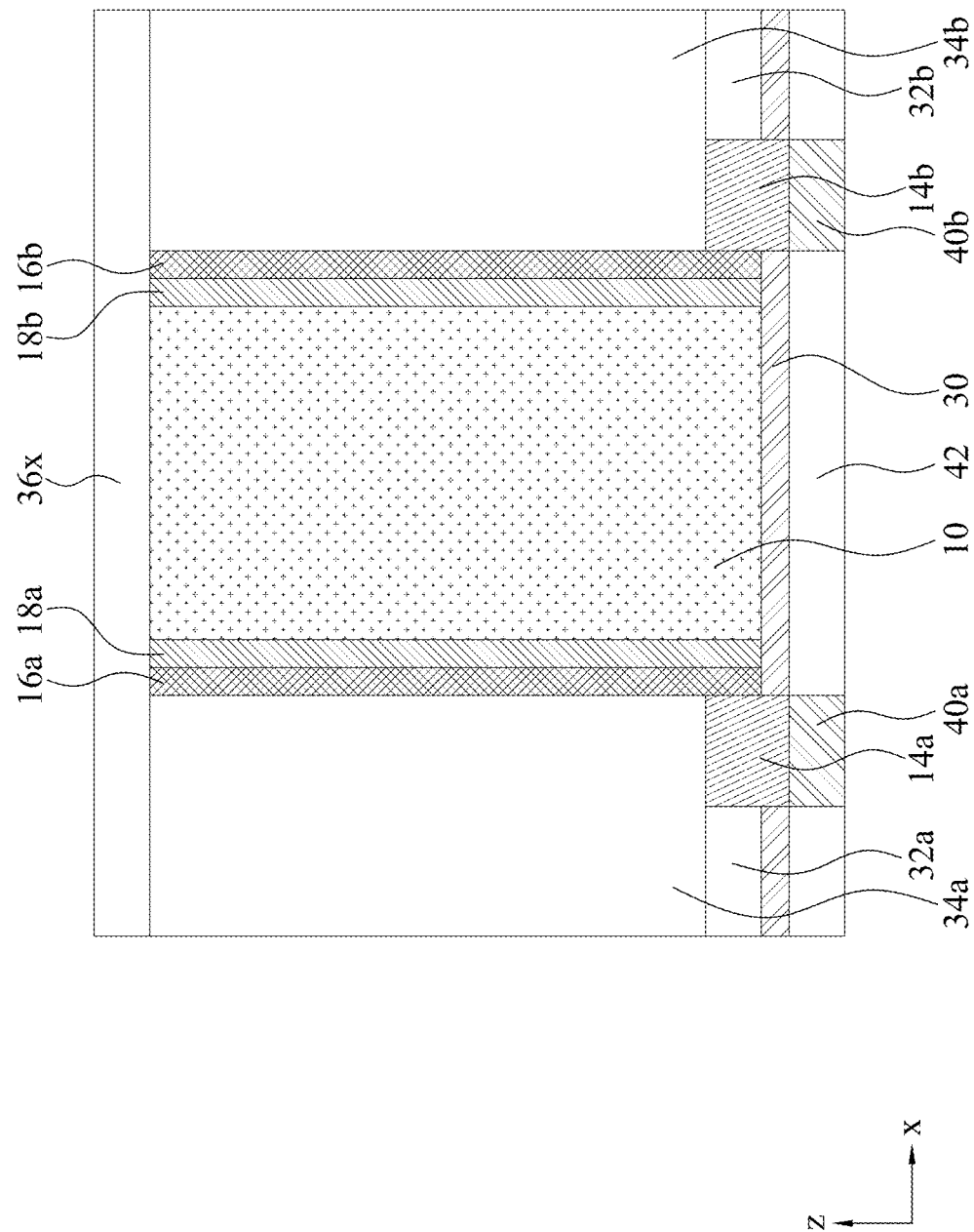

Refer to FIGS. 22A and 22B. A layer of dielectric material 36x may be formed (e.g., deposited) on or above the gate region 10, the channel regions 16a and 16b, the gate dielectric regions 18a and 18b, and/or the dielectric regions 34a and 34b. The dielectric material 36x may provide electrical isolation and, e.g., moisture isolation.

Figure 23A:
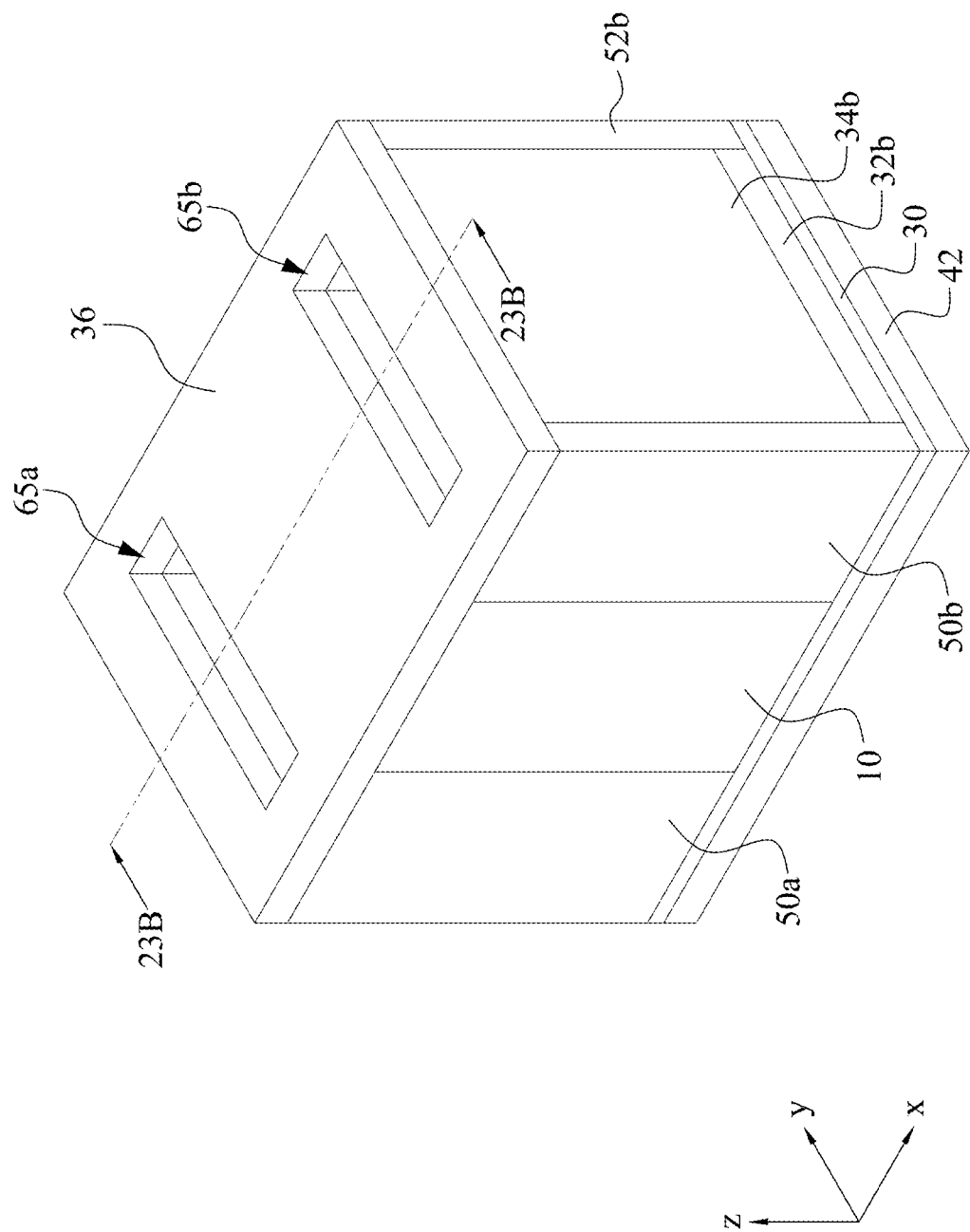
Figure 23B:
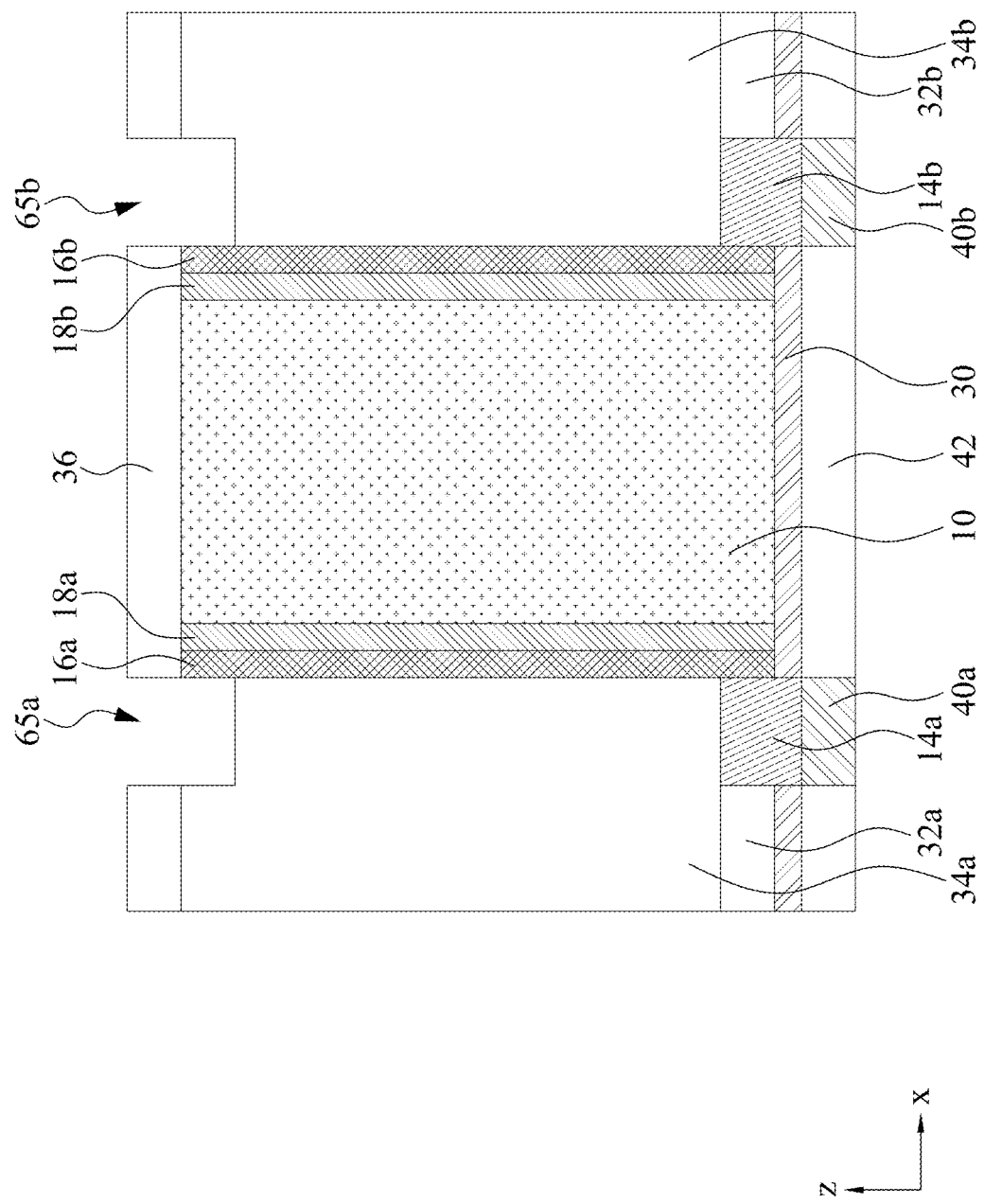

Refer to FIGS. 23A and 23B. One or more portions of the dielectric material 36x may be removed (by, e.g., etching) to become the dielectric layer 36. One or more portions of the dielectric regions 34a and 34b may also be removed. Recesses 65a and 65b may be formed as a result. The recesses 65a and 65b may expose the channel regions 16a and 16b.

Figure 24A:
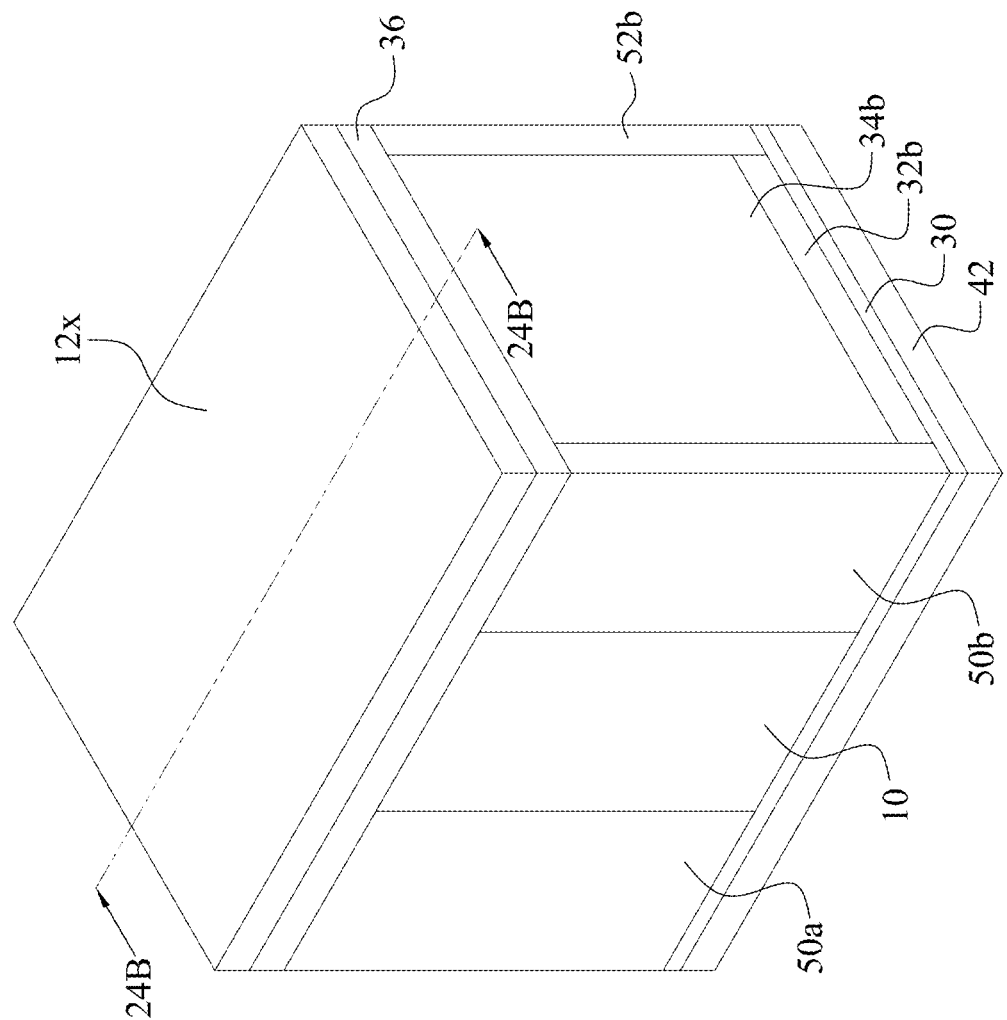
Figure 24B:
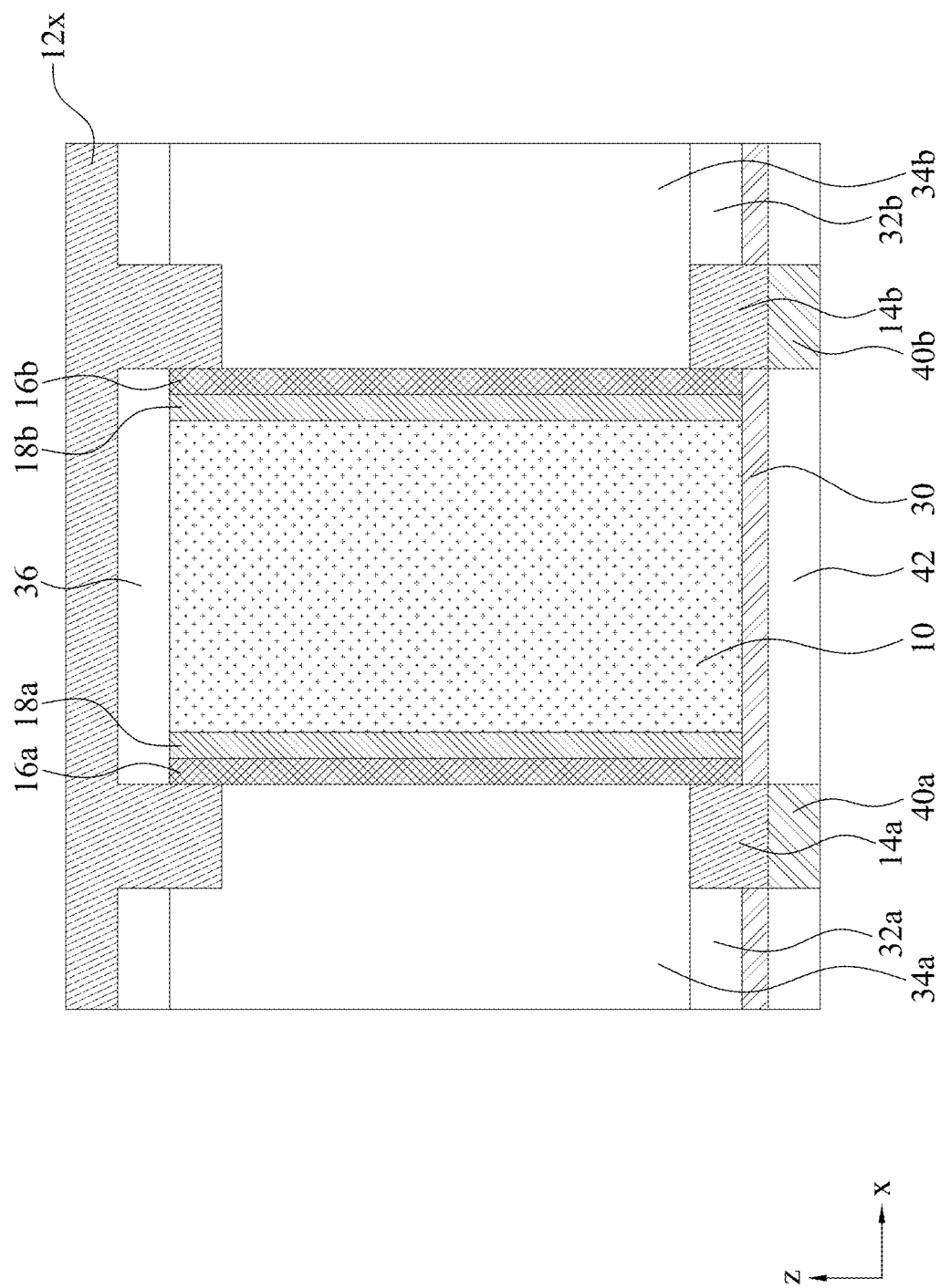

Refer to FIGS. 24A and 24B. A layer of source/drain material 12x may be formed (e.g., deposited) on or above the dielectric layer 36. The source/drain material 12x may fill the recesses 65a and 65b shown in FIGS. 23A and 23B. The source/drain material 12x may include W, Cu, TiN, Mo, Ru, other suitable materials, their compounds and/or alloys, and any appropriate combinations of them. The source/drain material 12x may come into contact with the channel regions 16a and 16b.

Figure 25A:
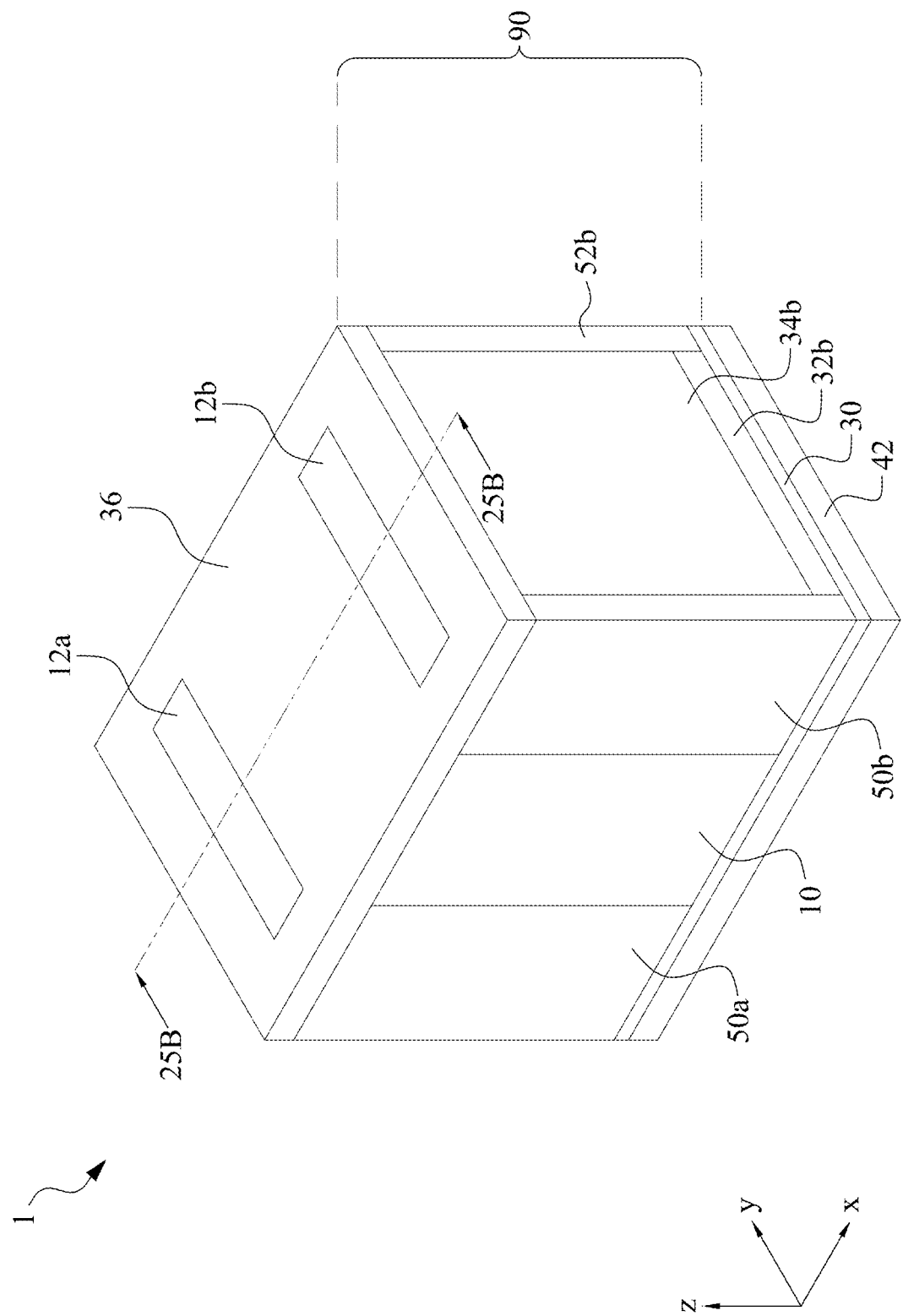
Figure 25B:
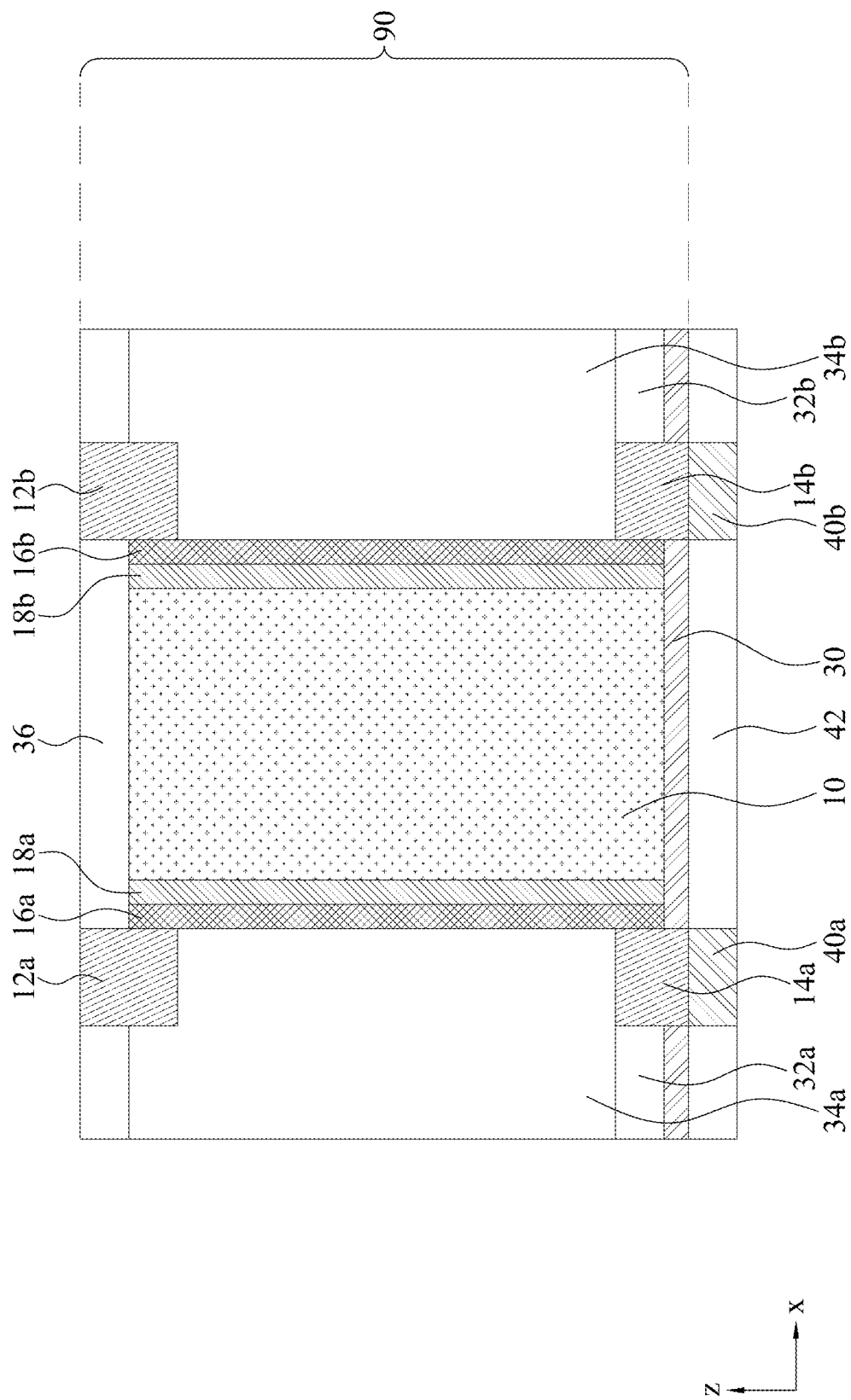

Refer to FIGS. 25A and 25B. A portion of the source/drain material 12x may be removed (e.g., by CMP) to expose the dielectric layer 36. The deposition and subsequent partial removal of the source/drain material 12x may create separate source/drain regions 12a and 12b. FIG. 25A shows a transistor structure 1 that is identical to the one shown in FIG. 1A, and is provided for the convenience of the reader.

Figure 26A:
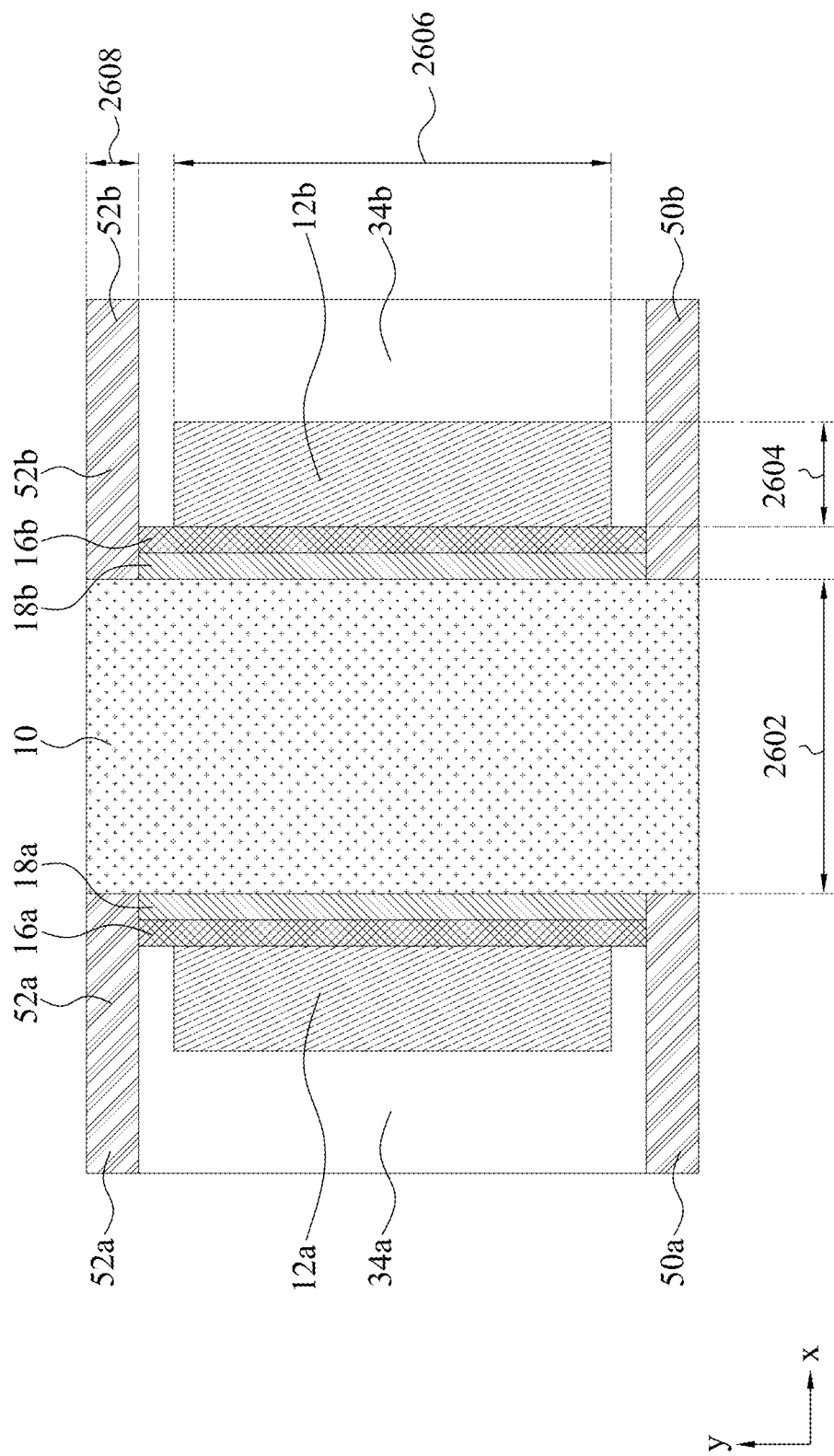
FIGS. 26A and 26B show exemplary sizes of various structural features of the transistor structure according to some embodiments of the present disclosure.
Figure 26B:
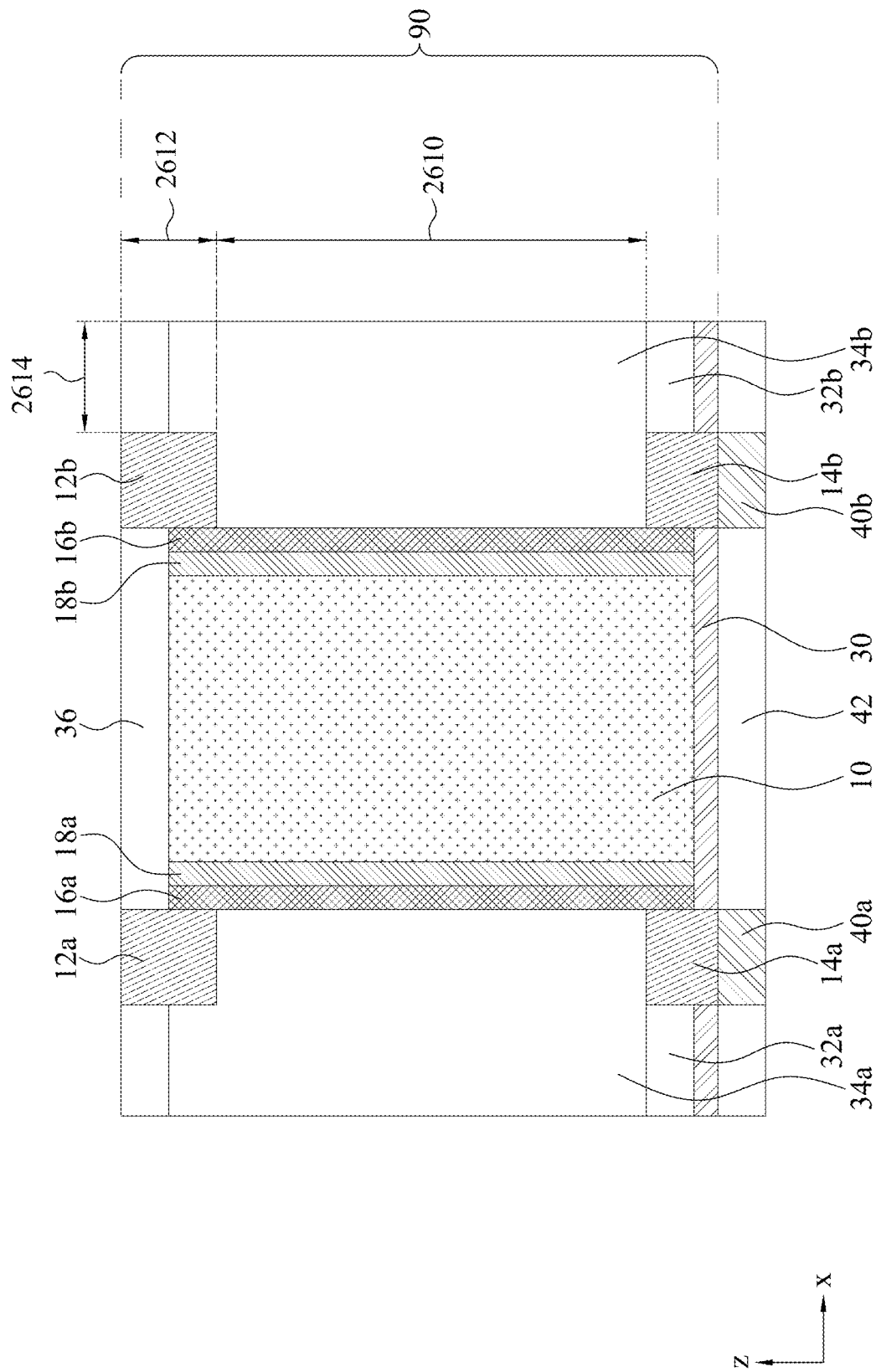

FIGS. 26A and 26B show exemplary sizes of various structural features of the transistor structure according to some embodiments of the present disclosure. The sizes shown here may be exemplary minimum sizes.

In some embodiments, the gate region 10 may have a first dimension 2602 (e.g., a first width). In some embodiments, the first dimension 2602 may have an exemplary minimum size of about 30 nm in the X-direction and/or about 30 nm in the Z-direction. In other embodiments, the first dimension 2602 in the X-direction and/or in the Z-direction may be smaller than 30 nm. In some embodiments, the source/drain regions 12a, 12b, 14a and 14b may have a second dimension 2604 (e.g., a second width) in the X-direction, a third dimension 2606 in the Y-direction, and a fourth dimension 2612 in the Z-direction. In some embodiments, the second dimension 2604 may have an exemplary minimum size of about 15 nm in the X-direction, and the third dimension 2606 may have an exemplary minimum size of about 20 nm in the Y-direction, and/or the fourth dimension 2612 may have an exemplary minimum size of about 10 nm in the Z-direction. In other embodiments, the second dimension 2604, the third dimension 2606, and the fourth dimension 2612 may be smaller than these sizes. In some embodiments, the channel regions 16a and 16b may have an exemplary minimum size of about 5 nm in the X-direction, about 20 nm in the Y-direction and/or about 30 nm in the Z-direction. In other embodiments, the exemplary minimum sizes of the channel regions 16a and 16b may be smaller than these sizes. In some embodiments, the gate dielectric regions 18a and 18b may have an exemplary minimum size of about 5 nm in the X-direction, about 20 nm in the Y-direction and/or about 30 nm in the Z-direction. In other embodiments, the exemplary minimum sizes of the gate dielectric regions 18a and 18b may be smaller than these sizes. In some embodiments, the channel length 2610 of the transistor structure may be about 10 nm. In some embodiments, the channel width of the transistor structure may have an exemplary minimum size of about 20 nm. In other embodiments, the exemplary minimum sizes of the channel length and the channel width may be smaller than these sizes. In some embodiments, the dielectric regions 50a, 50b, 52a and 52b may have an exemplary minimum size 2608 of about 5 nm in the Y-direction. In some embodiments, each of the dielectric regions 32a, 32b, 34a, 34b and the dielectric layer 36 may have a minimum dimension of about 5 nm in at least one of the X-, Y- and Z-directions. For example, in some embodiments, the dielectric region 32b may have a minimum dimension in the X-direction of about 5 nm. In other embodiments, the exemplary minimum dimensions of the dielectric regions 32a, 32b, 34a, 34b and the dielectric layer 36 may be smaller than these sizes.

The exemplary processes shown in FIGS. 2A-26B may involve etching less frequently than comparative embodiments. For example, during the formation of the source/drain regions, recesses and/or trenches are etched out first and then the source/drain regions are formed by deposition. The exemplary process flow of the present disclosure may reduce the chances that source/drain regions are damaged when other structures are being etched.

Less etching steps may also be advantageous in BEOL processes, because the etching of metal, which is common in BEOL, is usually more difficult to control.

The exemplary process flow of the present disclosure may enable the formation of transistor structures without using doping or implantation steps. This may help reduce the maximum temperature in the process flow, because the annealing after doping and implantation may require higher temperatures. In some embodiments, the maximum temperature in the process flow is about 400 degrees C. This temperature range may enable the use of oxide semiconductor materials such as IGZO.

Figure 27A:
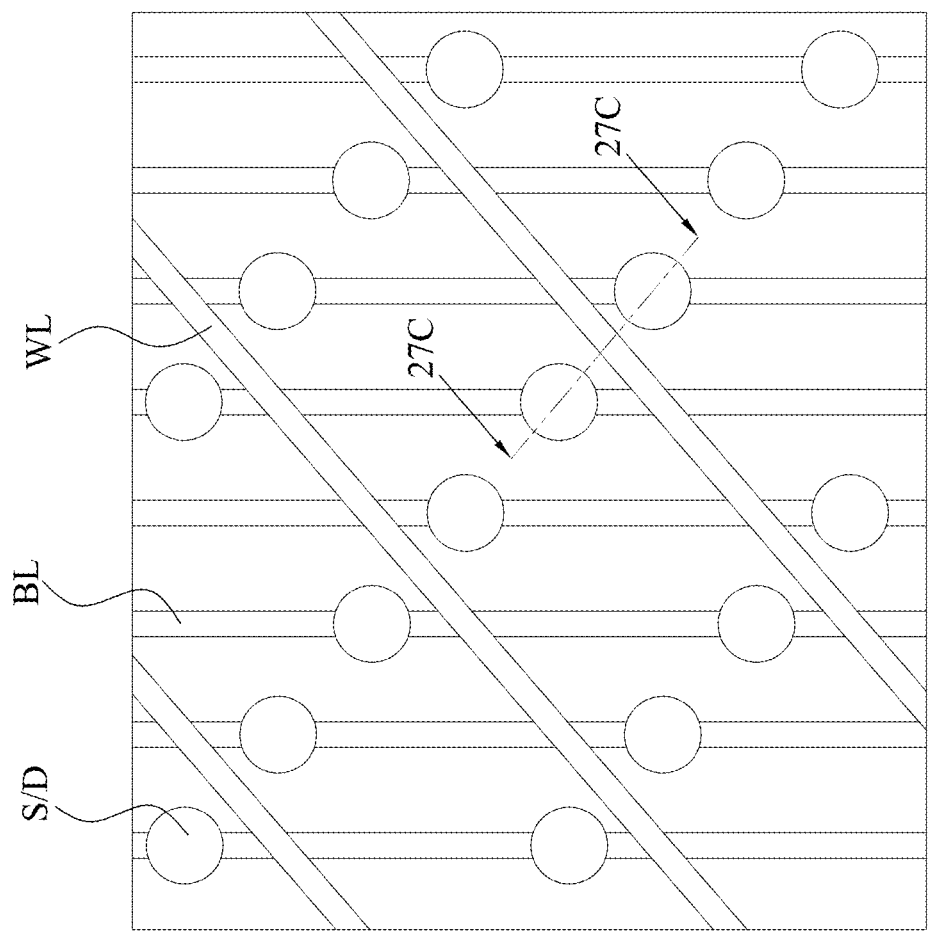
FIG. 27A illustrates a schematic view of an exemplary array of transistor structures according to some embodiments of the present disclosure.

FIG. 27A illustrates the top view of an exemplary array of transistor structures according to some embodiments of the present disclosure. The array may be a memory array of paired transistors. A transistor pair may share a word line WL. Each transistor has two source/drain regions S/D, with one shown in the top view and the other one below. Bit lines BL may be provided in the array. Each of the bit lines may be connected to more than one transistor.

The source/drain regions S/D are illustrated in FIG. 27A as having a circular shape, but this is not a limitation to the present disclosure. Other shapes, such as a rectangular shape, are also possible.

Various parts of the transistor structures, the word lines WL and the bit lines BL of the array may be arranged in different layers. In the top view, the word lines WL and the bit lines BL may be shown as forming intersections in a non-perpendicular manner.

Figure 27B:
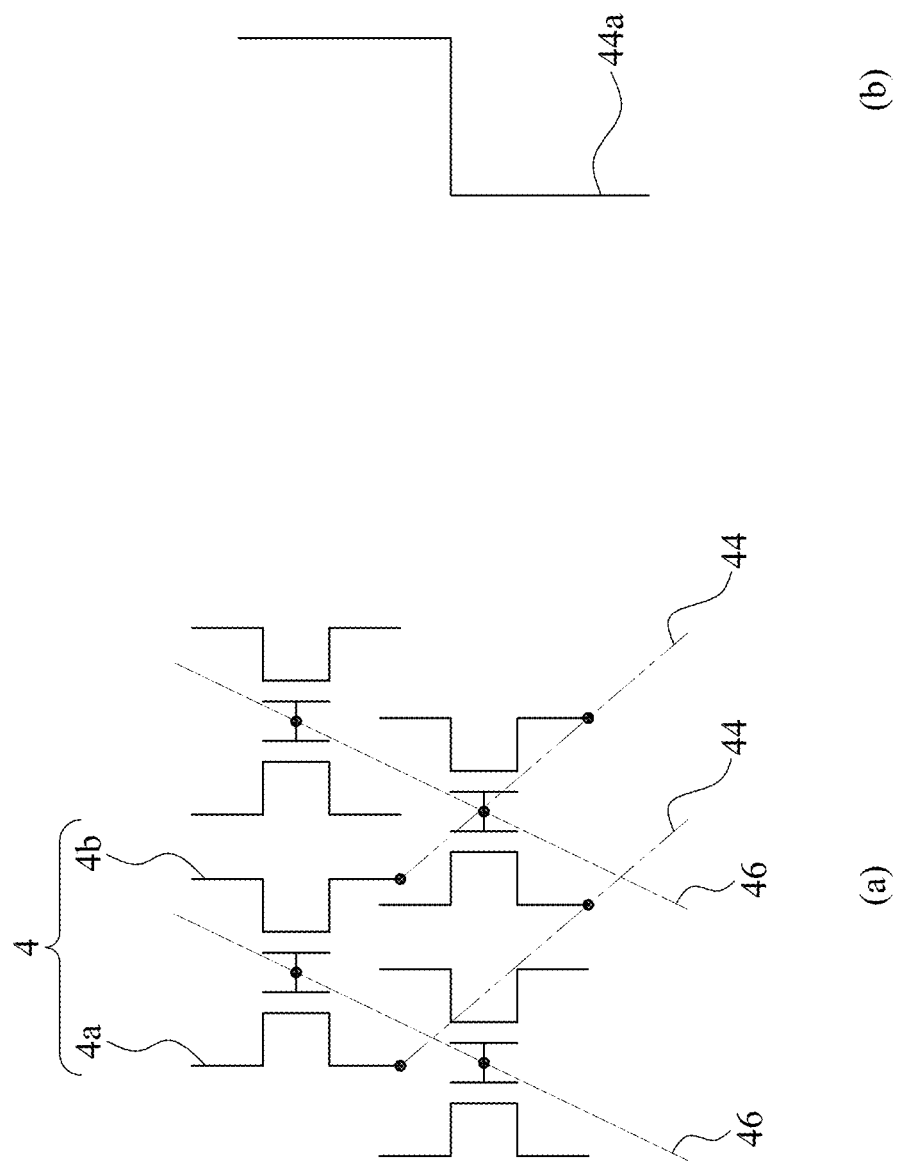
FIG. 27B, include parts (a) and (b), illustrates schematic representations of a memory array according to some embodiments of the present disclosure.

FIG. 27B illustrates schematic representations of a memory array according to some embodiments of the present disclosure.

FIG. 27B, in part (a), shows four transistor pairs 4, each including transistors 4a and 4b. Word lines 46 may be connected to the gate terminals of the transistors 4a and 4b. Bit lines 44 may be connected to the source/drain terminals of the transistors 4a and 4b. The word lines 46 and bit lines 44 may be arranged in different layers. The word lines 46 and bit lines 44 may, in plan view, intersect each other at an angle that is not 90 degrees. In some embodiments, the layout of the transistor pairs 4 and the word lines 46 conform to the principal axes of one layer; while the layout of the bit lines 44, being in another layer, do not conform to the principal axes of the one layer.

FIG. 27B, in part (b), shows an embodiment of the bit lines 44a. The layout of the bit lines 44a can also be made of several straight segments with 90-degree turns. This may help reduce lithographic challenges in making slanted layout structures.

Figure 27C:
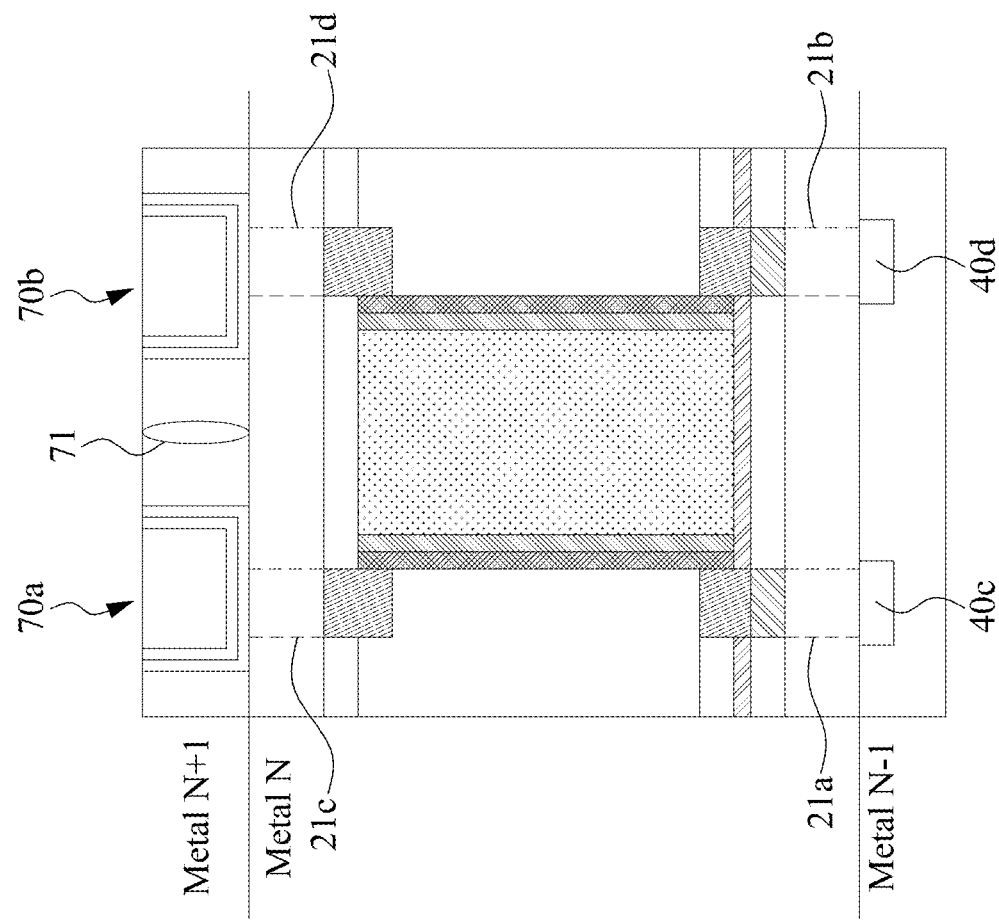
FIGS. 27C-27D illustrate schematic views of exemplary semiconductor structures according to some embodiments of the present disclosure.

FIG. 27C illustrates a cross-sectional view of an exemplary memory cell structure along the cut line 27C-27C shown in FIG. 27A, according to some embodiments of the present disclosure. A transistor structure that can be similar to the transistor structure 1 described above can be arranged in the layer Metal N. The transistor structure may be connected by vias 21c and 21d to the layer Metal N+1, in which capacitor structures 70a and 70b may exist. An air gap 71 may exist between the capacitor structures 70a and 70b. The transistor structure may be connected by vias 21a and 21b to the layer Metal N−1, in which conductive contacts 40c and 40d may exist.

In some embodiments, the memory cell structure shown in FIG. 27C is a DRAM cell structure. The transistor structure in the layer Metal N may be an access transistor. The conductive contacts 40c and 40d may form the bit line(s). The gate region of the transistor structure may form the word line(s). The capacitor structures 70a and 70b may form information storage devices.

Figure 27D:
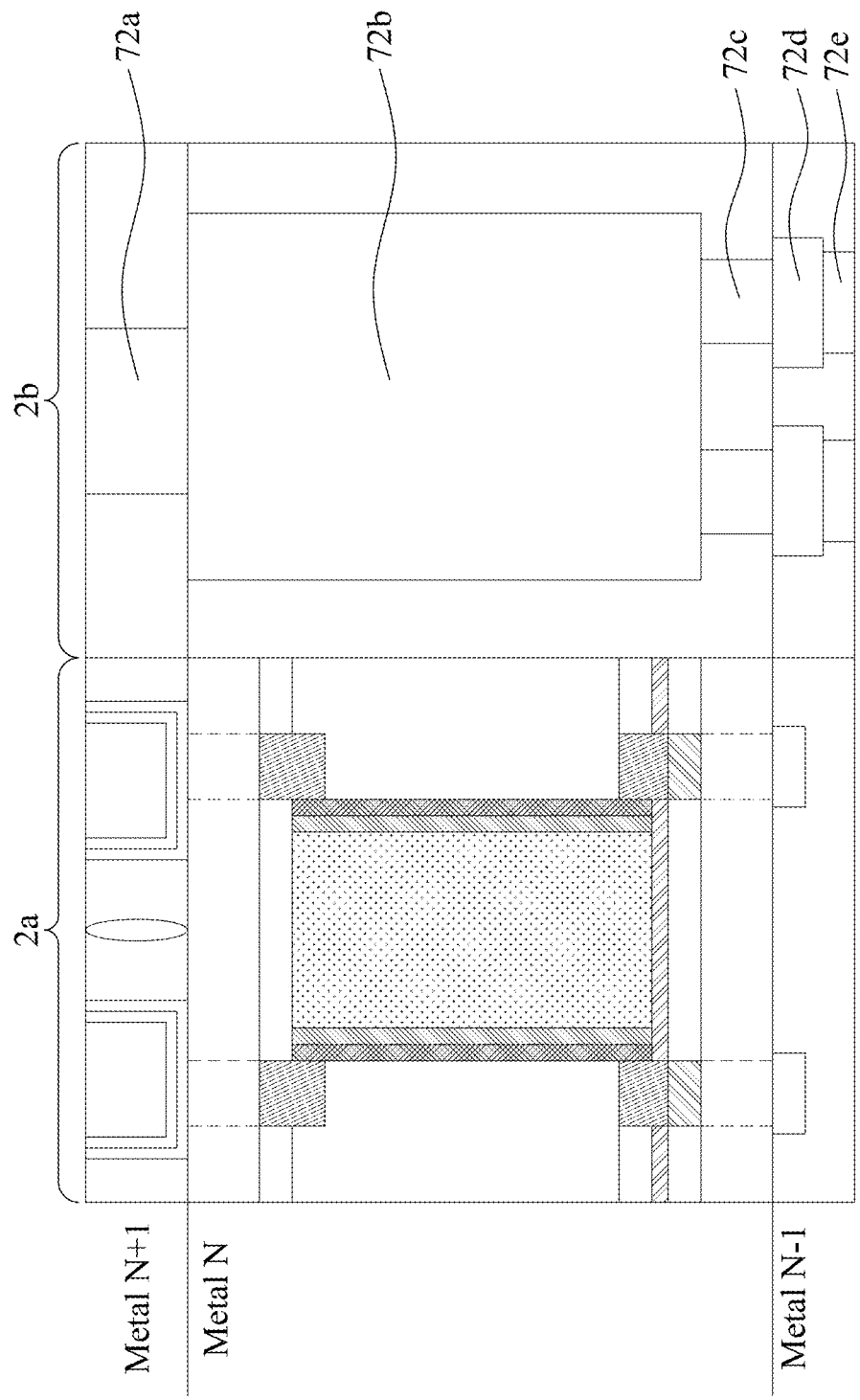

FIG. 27D illustrates a cross-sectional view of an exemplary semiconductor structure, in accordance with some embodiments of the present disclosure.

The semiconductor structure is illustrated as including a memory array region 2a and a logic region 2b. The memory array region 2a may be include memory cells similar to those illustrated in, e.g., FIG. 27C. The logic region 2b may include conductive interconnects and vias 72a, 72b, 72c, 72d and 72e. The illustrated semiconductor structure may be situated in a BEOL section of a die. The illustrated semiconductor structure demonstrates that the transistor structures provided in the present disclosure may be embedded in BEOL layers, and adjacent and/or surrounded by the conductive interconnection in the logic region 2b of the BEOL layers.

Figure 28B:
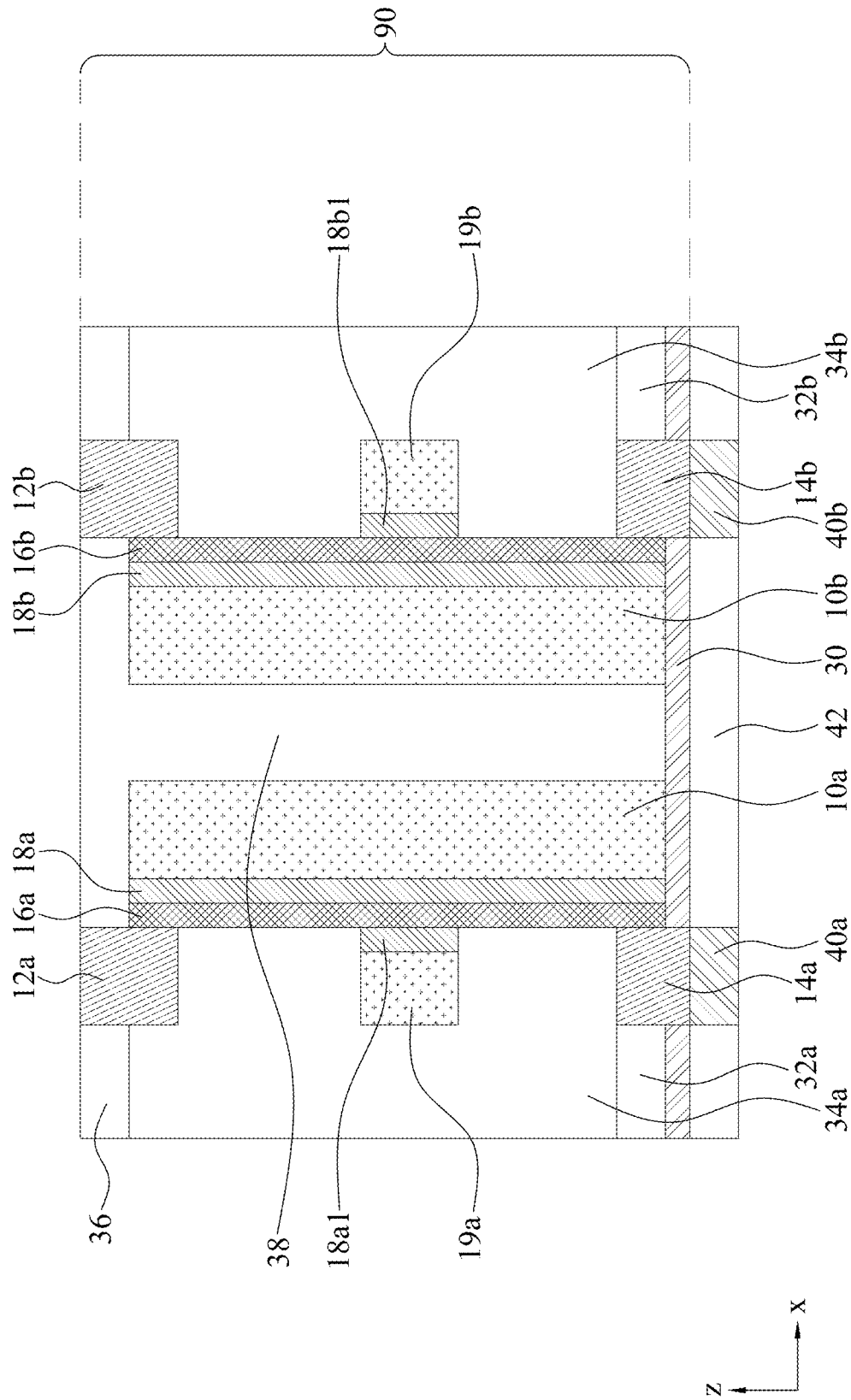

FIGS. 28A and 28B illustrate exemplary transistor structures in accordance with some embodiments of the present disclosure.

The transistor structure shown in FIG. 28A is similar to that shown in FIG. 1A. The differences include the existence of a dielectric region 38 and two separate gate regions 10a and 10b for the two transistors. The dielectric region 38 may be in contact with the dielectric layer 36 and may have similar or different materials. The dielectric region 38 may help provide additional isolation for the channel regions 16a and 16b.

The transistor structure shown in FIG. 28B is similar to that shown in FIG. 28A. The differences include the existence of additional control regions 19a and 19b and additional gate dielectric regions 18a1 and 18b1. The materials of the additional control regions 19a and 19b may be similar to the gate region 10 and/or the source/drain regions 12a, 12b, 14a and 14b. The materials of the additional gate dielectric regions 18a1 and 18b1 may be similar to the gate dielectric regions 18a and 18b. The additional control regions 19a and 19b may help reduce the amount of swing in the drain current-gate voltage curve (i.e., $I_d$-$V_g$ curve) of the transistor structure, which may help increase the on-off ratio. By adding the additional control regions 19a and 19b, the electric field generated by, e.g., the gate regions 10a and 10b may help increase the transistor performance.

Figure 29:
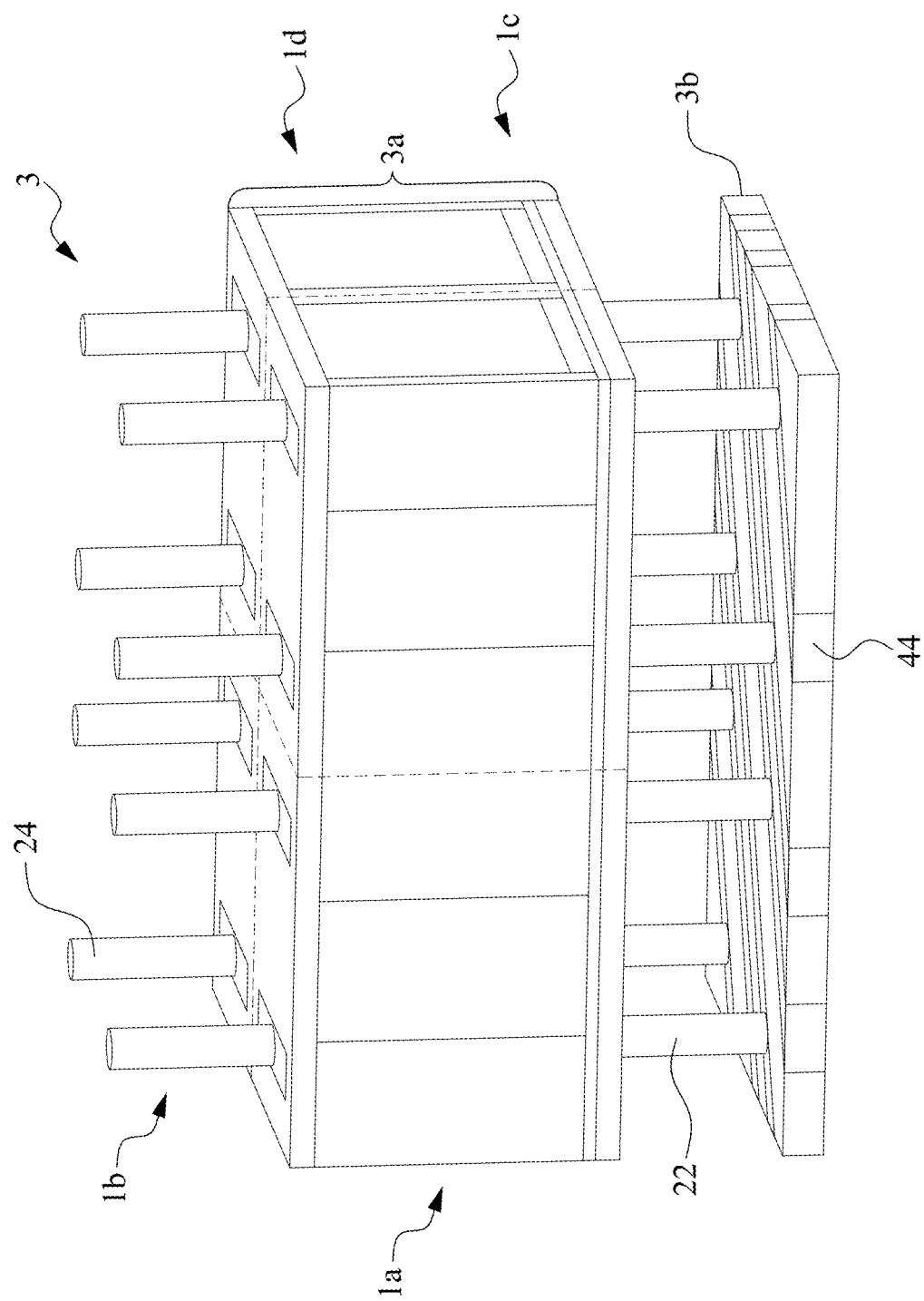
FIG. 29 illustrates a schematic of an exemplary semiconductor structure in accordance with some embodiments of the present disclosure.

FIG. 29 illustrates a perspective view of an exemplary semiconductor structure 3 in accordance with some embodiments of the present disclosure.

The semiconductor structure 3 is shown to include an array 3a, which may include several transistor structures (four in this example). The boundaries between the transistor structures 1a, 1b, 1c and 1d are shown in dashed line, although the transistor structures may actually be contiguous. The array 3a may be connected to other circuit components in, e.g., other layers of an integrated circuit, by conductive paths 22 and 24. The conductive paths 22 and 24 may be vias. The vias 24 may connected the array 3a to a layer 3b having bit lines 44.

Figure 30A:
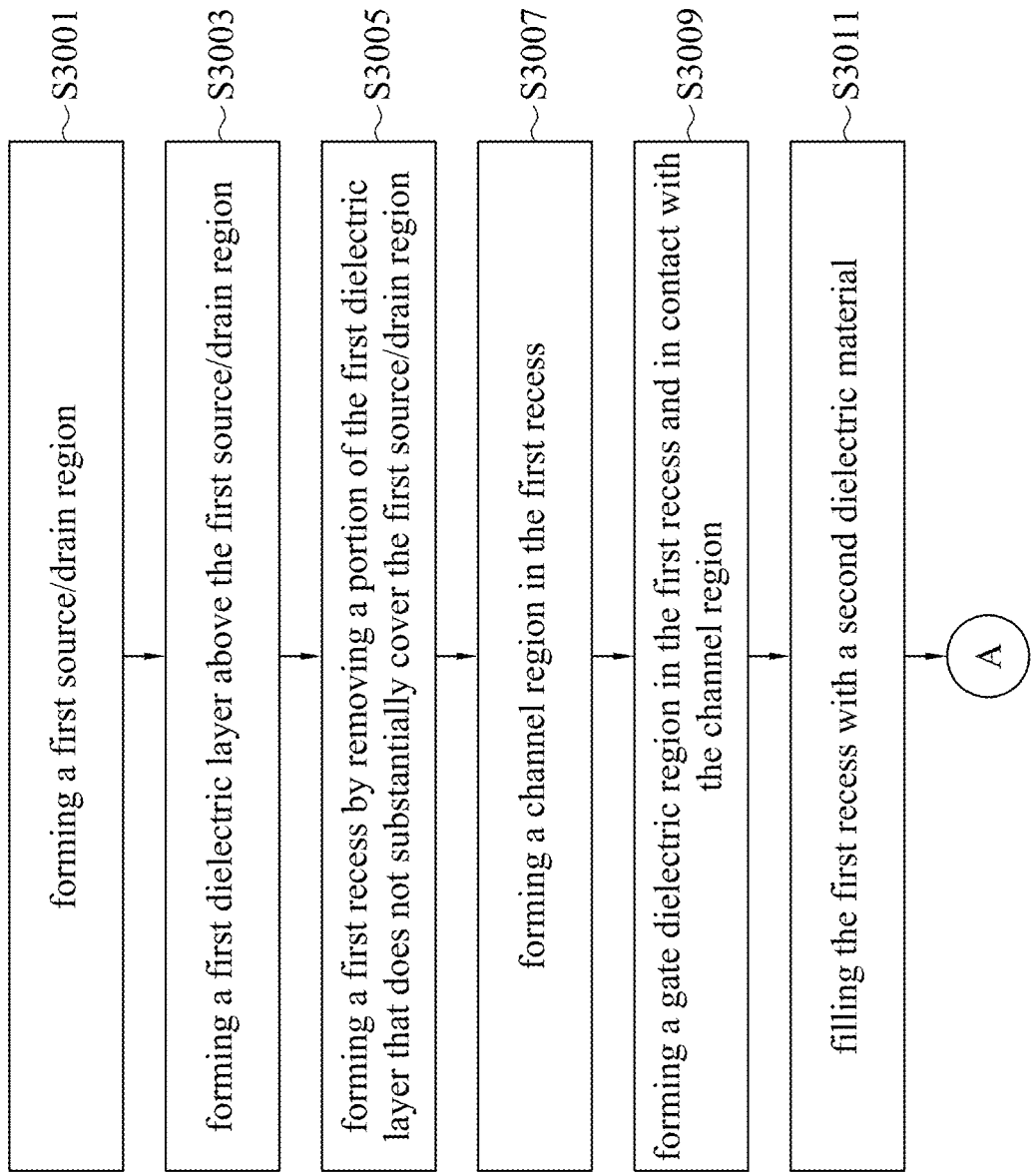
FIGS. 30A and 30B show an exemplary flow diagram of a method of manufacturing a semiconductor structure in accordance with some embodiments of the present disclosure.
Figure 30B:
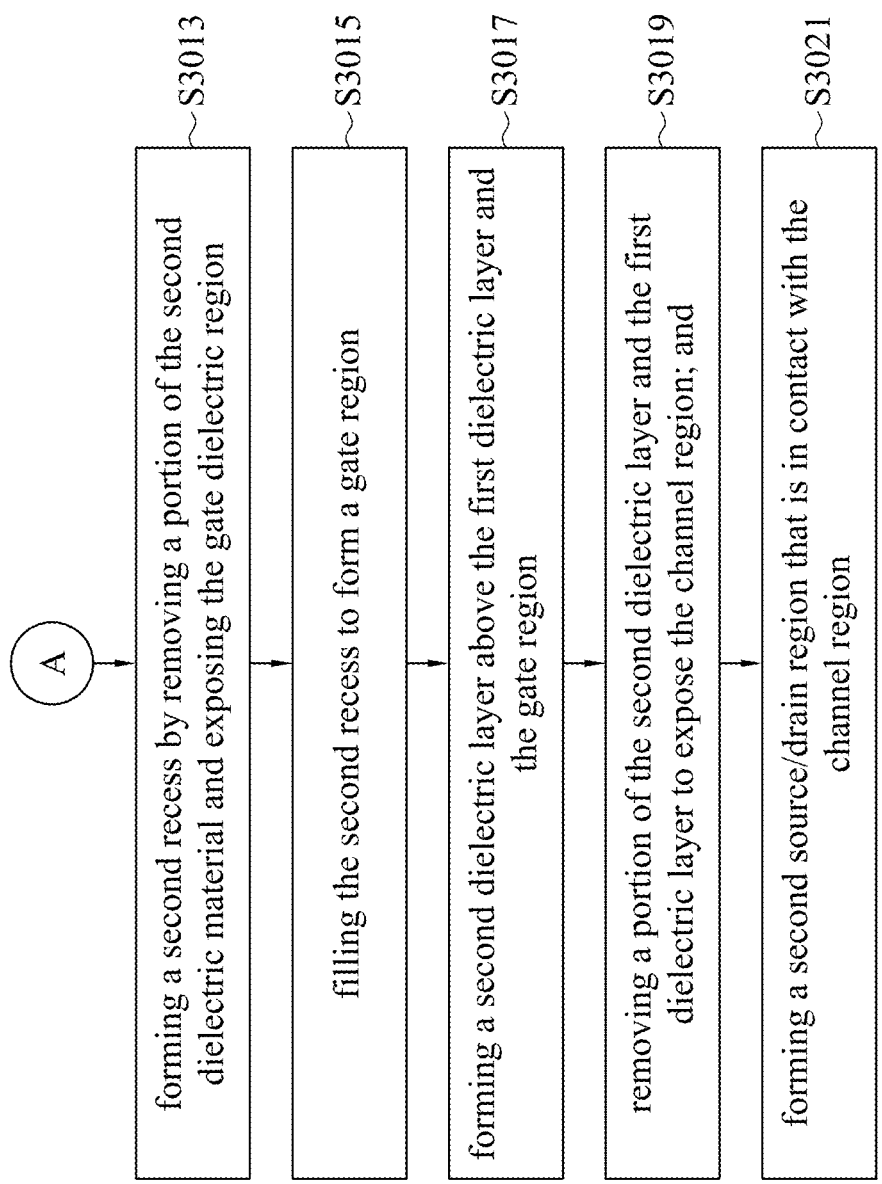

FIGS. 30A and 30B show a flow diagram of a method of manufacturing a semiconductor structure in accordance with some embodiments of the present disclosure.

In step S3001, a first source/drain region may be formed. In step S3003, a first dielectric layer may be formed above the first source/drain region. In step S3005, a first recess may be formed by removing a portion of the first dielectric layer that does not substantially cover the first source/drain region. In step S3007, a channel region may be formed in the first recess. In step S3009, a gate dielectric region may be formed in the first recess, and the gate dielectric region may be in contact with the channel region. In step S3011, the first recess may be filled with a second dielectric material.

In step S3013, a second recess may be formed by removing a portion of the second dielectric material and exposing the gate dielectric region. In step S3015, the second recess may be filled to form a gate region. In step S3017, a second dielectric layer may be formed above the first dielectric layer and the gate region. In step S3019, a portion of the second dielectric layer and the first dielectric layer may be removed to expose the channel region. In step S3021, a second source/drain region that is in contact with the channel region may be formed.

In the present disclosure, a transistor structure with improvement is disclosed. The transistor structure may be fully compatible with BEOL processes by virtue of its materials and novel process flow. The transistor structure may enable DRAM cells fully embedded in BEOL layers. The vertical shape may reduce footprint. The improved isolation of the channels may reduce leakage and contribute to security. The improved process flow involves less etching and may contribute to a higher yield.

Any of the embodiments described herein may be used alone or together in any combination. The one or more implementations encompassed within this specification may also include embodiments that are only partially mentioned or alluded to or not mentioned or alluded to at all in this brief summary or in the abstract. Although various embodiments may have been motivated by various deficiencies in the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

It will be understood that not all advantages have been necessarily discussed herein, no particular advantage is required for all embodiments or examples, and other embodiments or examples may offer different advantages.

According to an aspect of the present disclosure, a semiconductor structure is provided. The semiconductor structure may include a transistor structure, the transistor structure may include a gate region arranged over an upper surface of a substrate, wherein the gate region extend substantially in a first direction that is perpendicular to the upper surface of the substrate; a first source/drain region over the upper surface of the substrate; a second source/drain region over the upper surface of the substrate; and a channel region vertically extending in the first direction between the first source/drain region and the second source/drain region, wherein the channel region comprises an oxide semiconductor material. Along the first direction, the gate region covers a sidewall of the channel region.

In an embodiment, the first source/drain region may include at least one of tungsten (W), copper (Cu), titanium nitride (TiN), molybdenum (Mo) or Ruthenium (Ru). In an embodiment, the second source/drain region may include at least one of W, Cu, TiN, Mo or Ru. In an embodiment, the semiconductor structure includes a capacitor electrically connected to the first source/drain region or the second source/drain region; in such embodiment, the transistor structure may be in a Mx layer, where x is an integer larger than or equal to 1, and the capacitor may be in a My layer, where y is an integer larger than or equal to 1, where y may be different from x. In an embodiment, the transistor structure is a first transistor structure, and the semiconductor structure may include a second transistor structure. The second transistor structure may include: a gate region extending substantially in the first direction; a channel region extending substantially in the first direction, wherein the channel region comprises an oxide semiconductor material; a first source/drain region; and a second source/drain region. Along the first direction, the gate region may cover substantially an entirety of the channel region. The gate region of the first transistor structure may be electrically connected to the gate region of the second transistor structure. In an embodiment, the transistor structure may include a word line, and the gate region of the first transistor structure and the gate region of the second transistor structure may be part of the word line. In an embodiment, the semiconductor structure may include a bit line, and the word line may be elongated in a second direction, and the bit line may be elongated in a third direction, and the second direction may be not substantially perpendicular to the third direction. In an embodiment, at least one of the gate region, the first source/drain region and the second source/drain region may be formed by deposition.

According to an aspect of the present disclosure, a semiconductor structure is provided. The semiconductor structure may include a first transistor structure and a second transistor structure. Each of the transistors may include: a gate region disposed over an upper surface of a substrate and extending substantially in a first direction perpendicular to the upper surface of the substrate; a first source/drain region; a second source/drain region; and a channel region extending substantially in the first direction between the first source/drain region and the second source/drain region, wherein the channel region comprises an oxide semiconductor material. Along the first direction, the gate region of the first transistor structure may cover substantially a first sidewall of the channel region of the first transistor structure. Along the first direction, the gate region of the second transistor structure may cover substantially a second sidewall of the channel region of the second transistor structure. The gate region of the first transistor structure may be electrically isolated from the gate region of the second transistor structure. The gate region of the first transistor structure and the gate region of the second transistor structure may be between the first source/drain region of the first transistor structure and the first source/drain region of the second transistor structure.

In an embodiment, the gate region of the first transistor structure and the gate region of the second transistor structure may each include a first end and a second end, and the first end of the gate region of the first transistor structure and the first end of the gate region of the second transistor structure may be substantially coplanar in a plane substantially perpendicular to the first direction. In an embodiment, the second end of the gate region of the first transistor structure and the second end of the gate region of the second transistor structure may be substantially coplanar in a plane substantially perpendicular to the first direction.

According to an aspect of the present disclosure, a method of manufacturing a semiconductor structure is provided. The method may include: forming a first source/drain region; forming a first dielectric layer above the first source/drain region; forming a first recess by removing a portion of the first dielectric layer that does not substantially cover the first source/drain region; forming a channel region in the first recess; forming a gate dielectric region in the first recess and in contact with the channel region; filling the first recess with a second dielectric material; forming a second recess by removing a portion of the second dielectric material and exposing the gate dielectric region; filling the second recess to form a gate region; forming a second dielectric layer above the first dielectric layer and the gate region; removing a portion of the second dielectric layer and the first dielectric layer to expose the channel region; and forming a second source/drain region that is in contact with the channel region.

In an embodiment, forming a first source/drain region may include depositing a metal or metal compound. In an embodiment, forming a second source/drain region may include depositing a metal or metal compound. In an embodiment, the method may include forming an etch stop layer. In an embodiment, forming a first source/drain region may include: forming a recess in the etch stop layer; and depositing a source/drain material in the recess of the etch stop layer. In an embodiment, the method may include removing a portion of the gate dielectric region, the channel region, the first dielectric layer to expose the etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing a semiconductor structure, comprising:
   forming a first source/drain region;
   forming a first dielectric layer above the first source/drain region;
   removing a portion of the first dielectric layer;
   forming a channel region along a sidewall of the first dielectric layer;
   forming a gate region along a sidewall of the channel region;
   forming a second dielectric layer above the first dielectric layer and the gate region;
   removing a portion of the second dielectric layer to form an opening that exposes the channel region; and
   forming a second source/drain region within the opening.

2. The method of claim 1, wherein an upper surface of the first source/drain region is covered by the first dielectric layer after removing the portion of the first dielectric layer.

3. The method of claim 1, wherein the channel region is also formed along a sidewall of the first source/drain region.

4. The method of claim 3, wherein the channel region has a bottommost surface that is over a bottommost surface of the first source/drain region.

5. The method of claim 1, wherein the channel region is laterally and directly between the gate region and the first source/drain region.

6. The method of claim 1, wherein the opening within the second dielectric layer exposes an additional sidewall of the channel region.

7. The method of claim 1, wherein the second source/drain region extends from below a topmost surface of the channel region to above the topmost surface of the channel region.

8. A method of manufacturing a semiconductor structure, comprising:
   forming a first source/drain region over a substrate;
   forming a first dielectric layer above the first source/drain region;
   forming a channel layer along a sidewall of the first dielectric layer, wherein a first sidewall of the channel layer faces the first source/drain region;
   forming a gate region along a second sidewall of the channel layer opposing the first sidewall; and
   forming a second source/drain region along the first sidewall of the channel layer and vertically above the first source/drain region.

9. The method of claim 8, wherein a bottom of the channel layer is vertically between a top and a bottom of the first source/drain region and wherein a top of the channel layer is vertically between a top and a bottom of the second source/drain region.

10. The method of claim 8, further comprising:
    forming a gate dielectric onto the second sidewall of the channel layer; and
    forming the gate region onto the gate dielectric, so that the channel layer is laterally separated from the gate region by the gate dielectric.

11. The method of claim 8, further comprising:
    forming a third source/drain region over the substrate;
    forming the first dielectric layer above the third source/drain region;
    forming a second channel layer along a second sidewall of the first dielectric layer;
    forming the gate region between the channel layer and the second channel layer; and forming a four th source/drain region along a sidewall of the second channel layer that faces away from the gate region.

12. The method of claim 11, wherein the first source/drain region and the third source/drain region are substantially symmetric about a vertical line bisecting the gate region.

13. The method of claim 8, wherein an outermost sidewall of the channel layer faces an outermost sidewall of the first source/drain region.

14. A semiconductor structure, comprising:
   a conductive gate arranged over a lower dielectric layer;
   a first source/drain disposed vertically above the lower dielectric layer;
   a second source/drain disposed vertically above the first source/drain; and
   a channel structure arranged laterally between the conductive gate and both the first source/drain and the second source/drain, wherein the channel structure vertically extends from along a side of the first source/drain to along a side of the second source/drain.

15. The semiconductor structure of claim 14, further comprising:
   a first dielectric layer vertically between the first source/drain and the second source/drain, wherein the channel structure extends along a side of the first dielectric layer.

16. The semiconductor structure of claim 14, wherein an entirety of the channel structure is laterally outside of the first source/drain.

17. The semiconductor structure of claim 14, wherein the channel structure has a bottommost surface that is vertically between a bottommost surface of the first source/drain and a topmost surface of the first source/drain.

18. The semiconductor structure of claim 14, wherein the channel structure vertically overlaps a part, but not all, of the first source/drain.

19. The semiconductor structure of claim 14, wherein the channel structure has a larger height than either the first source/drain or the second source/drain.

20. The semiconductor structure of claim 14, further comprising:
   a gate dielectric layer laterally between the conductive gate and the channel structure, wherein both the gate dielectric layer and the channel structure vertically extend between a topmost surface of the conductive gate and a bottommost surface of the conductive gate.

* * * * *